United States Patent
Shin et al.

(10) Patent No.: US 12,356,782 B2
(45) Date of Patent: Jul. 8, 2025

(54) DISPLAY DEVICE AND METHOD FOR MANUFACTURING SAME

(71) Applicant: SAMSUNG DISPLAY CO., LTD., Yongin-si (KR)

(72) Inventors: Jae Min Shin, Yongin-si (KR); Sang Woo Kim, Yongin-si (KR); Jang Yeol Yoon, Yongin-si (KR); Gyung Soon Park, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 437 days.

(21) Appl. No.: 17/794,723

(22) PCT Filed: Sep. 8, 2020

(86) PCT No.: PCT/KR2020/012125
§ 371 (c)(1),
(2) Date: Jul. 22, 2022

(87) PCT Pub. No.: WO2021/149889
PCT Pub. Date: Jul. 29, 2021

(65) Prior Publication Data
US 2023/0070511 A1    Mar. 9, 2023

(30) Foreign Application Priority Data
Jan. 23, 2020    (KR) .................. 10-2020-0009085

(51) Int. Cl.
*H01L 27/15*    (2006.01)
*H01L 33/00*    (2010.01)
(Continued)

(52) U.S. Cl.
CPC .... *H10H 29/142* (2025.01); *H10H 20/01335* (2025.01); *H10H 20/821* (2025.01);
(Continued)

(58) Field of Classification Search
None
See application file for complete search history.

(56) References Cited

U.S. PATENT DOCUMENTS

| 9,171,956 B2 | 10/2015 | Shin et al. |
| 10,476,032 B2 | 11/2019 | Park et al. |

(Continued)

FOREIGN PATENT DOCUMENTS

| CN | 110137200 | 8/2019 |
| CN | 110165031 | 8/2019 |

(Continued)

OTHER PUBLICATIONS

International Search Report, with English translation, corresponding to International Application No. PCT/KR2020/012125 dated Dec. 9, 2020.

(Continued)

*Primary Examiner* — Asok K Sarkar
(74) *Attorney, Agent, or Firm* — KILE PARK REED & HOUTTEMAN PLLC

(57) ABSTRACT

A display device includes pixel areas each having an emission area, and a pixel in each of the pixel areas and including a display element part. The display element part includes a first insulating layer on a substrate, a light emitting element on the first insulating layer and each having first and second ends, a first layer on the first insulating layer and the light emitting element and contacting a first area of each of the first and second ends of the light emitting element, a second layer on the light emitting element and contacting a second area of each of the first and second ends of the light emitting element, and an interlayer insulating layer between the first layer and the second layer. The first layer and the second layer include a semiconductor material.

24 Claims, 45 Drawing Sheets

(51) Int. Cl.
- *H10H 20/01* (2025.01)
- *H10H 20/821* (2025.01)
- *H10H 20/825* (2025.01)
- *H10H 20/84* (2025.01)
- *H10H 20/855* (2025.01)
- *H10H 29/14* (2025.01)

(52) U.S. Cl.
CPC .......... *H10H 20/825* (2025.01); *H10H 20/84* (2025.01); *H10H 20/855* (2025.01)

(56) References Cited

U.S. PATENT DOCUMENTS

| | | | |
|---|---|---|---|
| 10,529,794 | B2 | 1/2020 | Park et al. |
| 10,608,071 | B2 | 3/2020 | Hong et al. |
| 10,826,002 | B2 | 11/2020 | Park et al. |
| 10,902,773 | B2 | 1/2021 | Shin et al. |
| 11,074,858 | B2 | 7/2021 | Cho et al. |
| 2014/0261613 | A1 | 9/2014 | Nielson et al. |
| 2019/0251898 | A1 | 8/2019 | Cho et al. |
| 2020/0005703 | A1 | 1/2020 | Kim et al. |
| 2021/0280753 | A1 | 9/2021 | Kim et al. |
| 2021/0296538 | A1 | 9/2021 | Li et al. |
| 2021/0327954 | A1 | 10/2021 | Cho et al. |
| 2022/0367757 | A1 | 11/2022 | Moon et al. |

FOREIGN PATENT DOCUMENTS

| | | |
|---|---|---|
| KR | 10-2017-0088013 | 8/2017 |
| KR | 10-1827848 | 3/2018 |
| KR | 10-2019-0084194 | 7/2019 |
| KR | 10-2019-0118992 | 10/2019 |
| KR | 10-2020-0001657 | 1/2020 |
| KR | 10-2020-0004936 | 1/2020 |
| KR | 10-2020-0005711 | 1/2020 |
| KR | 10-2020-0006650 | 1/2020 |
| KR | 10-2446139 | 9/2022 |
| KR | 10-2582613 | 9/2023 |

OTHER PUBLICATIONS

Written Opinion, with English translation, corresponding to International Application No. PCT/KR2020/012125 dated Dec. 9, 2020.
Korean Notice of Allowance for Korean Application No. 10-2020-0009085, dated Dec. 31, 2024.

FIG. 3
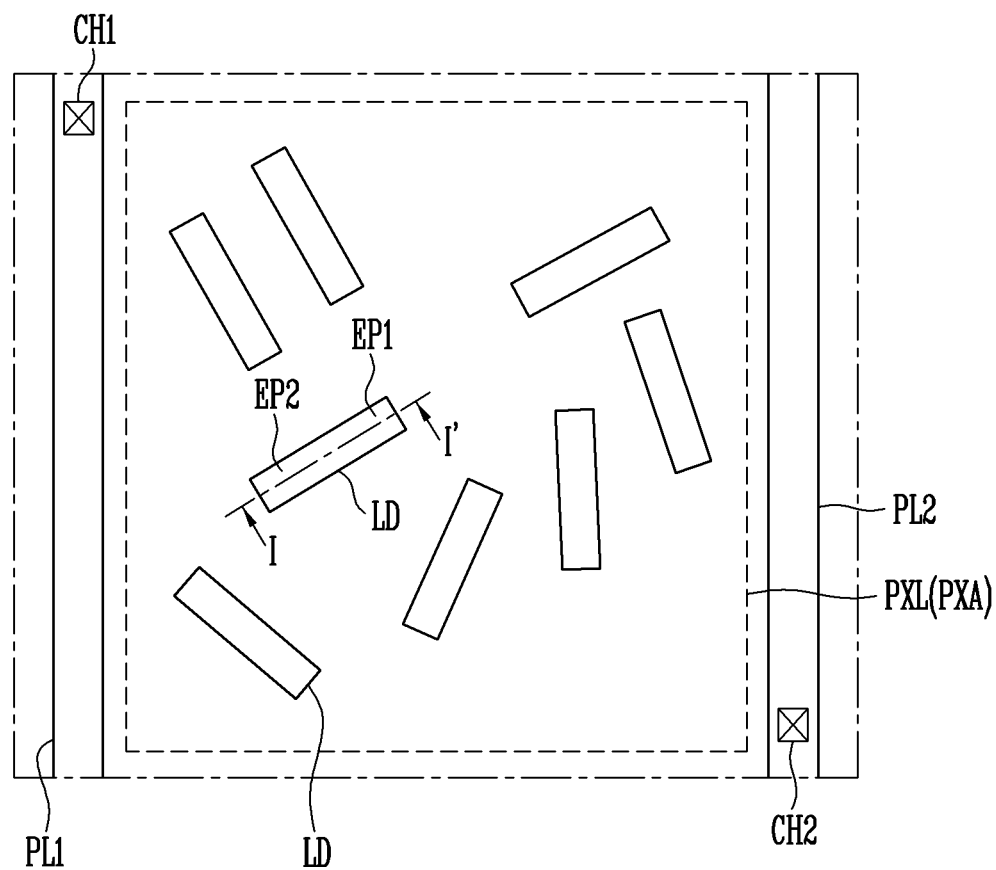
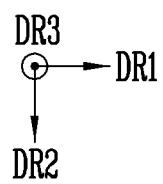

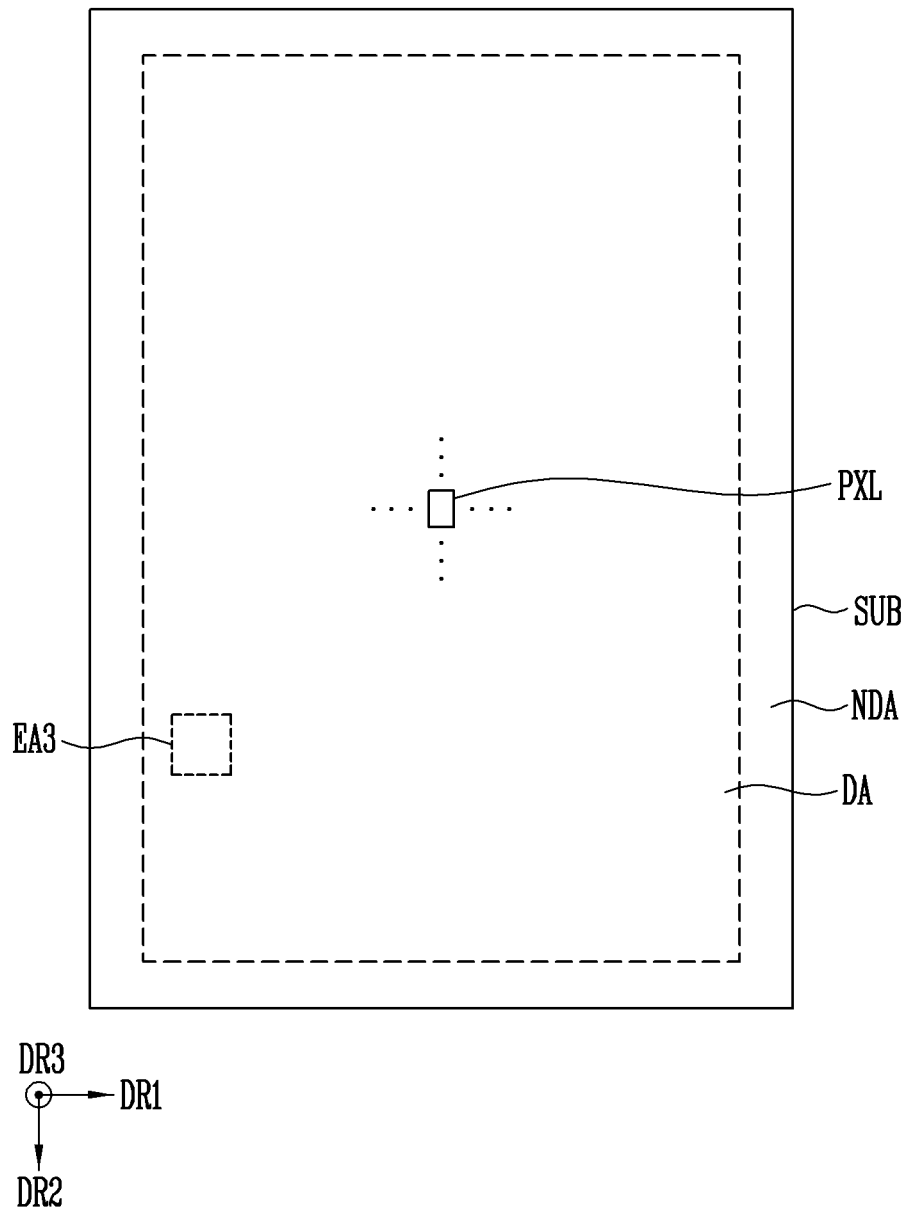

DISPLAY DEVICE AND METHOD FOR MANUFACTURING SAME

CROSS-REFERENCE TO RELATED APPLICATION(S)

This application is a national entry of International Application No. PCT/KR2020/012125, filed on Sep. 8, 2020, which claims under 35 U.S.C. § 119 (a) and 365(b) priority to and benefits of Korean Patent Application No. 10-2020-0009085, filed on Jan. 23, 2020 in the Korean Intellectual Property Office, the entire contents of which are incorporated herein by reference.

BACKGROUND

1. Technical Field

The disclosure relates to a display device and a method of manufacturing the same.

2. Description of the Related Art

As interest in information display increases and the demand to use portable information media increases, the demand and commercialization for a display device are focused.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

An object of the disclosure is to provide a display device having improved light output efficiency.

An object of the disclosure is to provide a method of manufacturing the above-described display device.

According to an embodiment, a display device may include a display area and a non-display area adjacent to at least a side of the display area, the display area including pixel areas, each of the pixel areas having an, and a pixel disposed in each of the pixel areas and including a display element part.

In an embodiment, the display element part may include a first insulating layer disposed on a substrate; at least one light emitting element disposed on the first insulating layer and each having a first end and a second end in a longitudinal direction; a first layer disposed on the first insulating layer and the at least one light emitting element and contacting a first area of each of the first end and the second end of the at least one light emitting element; a second layer disposed on the at least one light emitting element and contacting a second area of each of the first end and the second end of the at least one light emitting element; and an interlayer insulating layer disposed between the first layer and the second layer. The first layer and the second layer may include a semiconductor material.

In an embodiment, the at least one light emitting element may include a first semiconductor layer of a first conductive dopant; a second semiconductor layer of a second conductive dopant; and an active layer disposed between the first semiconductor layer and the second semiconductor layer.

The first semiconductor layer and the second semiconductor layer may each include a gallium nitride (GaN) semiconductor material.

In an embodiment, the first conductive dopant may include an n-type dopant, and the second conductive dopant may include a p-type dopant.

In an embodiment, the first end of the at least one light emitting element may include the first semiconductor layer, and the second end of the at least one light emitting element may include the second semiconductor layer.

In an embodiment, the first layer of the display element part may include a p-type hydrogenated amorphous silicon (a-Si:H) semiconductor material, and the second layer of the display element part may include a transparent oxide semiconductor material.

In an embodiment, the display device may further include a first power line disposed between the substrate and the first insulating layer and electrically connected to the first layer of the display element part; and a second power line disposed between the substrate and the first insulating layer, spaced apart from the first power line, and electrically connected to the second layer of the display element part.

In an embodiment, the first layer of the display element part may be a hole injection layer receiving a first power from the first power line and injecting a hole into the first area of the second end of the at least one light emitting element, and the second layer may be an electron injection layer receiving a second power from the second power line and injecting an electron into the second area of the first end of the at least one light emitting element.

In an embodiment, the interlayer insulating layer may be disposed between the first area and the second area of each of the first end and the second end of the at least one light emitting element.

In an embodiment, the first area of the first end of the at least one light emitting element contacting the first layer and the second area of the first end of the at least one light emitting element contacting the second layer may have a same width.

In an embodiment, the second area of the first end of the at least one light emitting element contacting the second layer and the second area of the second end of the at least one light emitting element contacting the second layer may have a same width.

In an embodiment, the display element part may further include a first conductive line disposed between the substrate and the first insulating layer; a second insulating layer disposed on the second layer; and a second conductive line disposed on the second insulating layer.

In an embodiment, different voltages may be applied to the first conductive line and the second conductive line, respectively, and an electric field may be formed in a direction intersecting the longitudinal direction of the at least one light emitting element.

In an embodiment, the second conductive line may include a transparent conductive material.

In an embodiment, the display element part may further include a cover layer disposed on the second conductive line corresponding to the at least one light emitting element. The cover layer may include an opaque conductive material.

In an embodiment, the cover layer may guide light emitted from the at least one light emitting element in a direction to determine a position of the emission area of each of the pixel areas.

In an embodiment, the pixel may further include a pixel circuit part disposed between the substrate and the display element part.

According to an embodiment, a display device may include a stretchable substrate including islands and bridges connecting the islands; and pixels disposed in each of the islands and each including a display element part. The display element part may include a first insulating layer disposed in each of the islands; light emitting elements disposed on the first insulating layer and each having a first end and a second end in a longitudinal direction; a first layer disposed on the first insulating layer and the light emitting elements and contacting a first area of each of the first end and the second end of each of the light emitting elements; a second layer disposed on the light emitting elements and contacting a second area of each of the first end and the second end of each of the light emitting elements; and an interlayer insulating layer disposed between the first layer and the second layer. The first layer and the second layer may include a semiconductor material.

According to an embodiment, the first layer may include a p-type hydrogenated amorphous silicon (a-Si:H) semiconductor material, and the second layer may include a transparent oxide semiconductor material.

According to an embodiment, the first end of each of the light emitting elements may include a first semiconductor layer of an n-type dopant, and the second end of each of the light emitting elements may include a second semiconductor layer of a p-type dopant.

According to an embodiment, the stretchable substrate may further include a cutout disposed between the islands and the bridges.

The above-described display device may be manufactured by including providing a pixel in a pixel area of the display device. The providing of the pixel may include forming a pixel circuit part on a substrate; and forming a display element part on the pixel circuit part.

In an embodiment, the forming of the display element part may include forming a first insulating layer on the pixel circuit part; supplying light emitting elements each having a first end and a second end in a longitudinal direction on the first insulating layer; forming a first layer including a p-type hydrogenated amorphous silicon (a-Si:H) semiconductor material on the light emitting elements; forming an interlayer insulating layer on the first layer; forming a second layer including a transparent oxide semiconductor material on the interlayer insulating layer; and forming a second insulating layer on the second layer.

According to an embodiment, the first layer may contact each of a first area of the first end and a second area of the second end of the light emitting elements, the second layer may contact each of a second area of the first end and a second area of the second end of the light emitting elements, and the interlayer insulating layer may be in contact and may disposed between the first area and the second area of each of the first end and the second end of the light emitting elements.

According to an embodiment, the forming of the display element part may include forming a first conductive line between the pixel circuit part and the first insulating layer; forming a second conductive line on the second insulating layer; and forming a cover layer on the second conductive line.

According to an embodiment, a display device and a method of manufacturing the same capable of omitting configurations (alignment electrode or an alignment line) for alignment of light emitting elements by disposing a first layer including a hydrogenated amorphous silicon (a-Si:H) semiconductor material contacting a first area of both ends of each light emitting element and a second layer including a transparent oxide semiconductor material contacting a second area of the both ends of each of the light emitting elements after inputting the light emitting elements on a substrate may be provided.

A display device and a method of manufacturing the same that improves light output efficiency by disposing a cover layer on the light emitting element to reflect or scatter light emitted from the light emitting element in a desired direction may be provided.

An effect according to embodiments is not limited by the contents above, and more various effects are included in the specification.

BRIEF DESCRIPTION OF THE DRAWINGS

The above and other aspects and features of the disclosure will become more apparent by describing in detail embodiments thereof with reference to the attached drawings, in which:

FIG. 3 is a schematic plan view illustrating an area of a light emitting device including a unit emission area according to an embodiment.

FIG. 10 is a schematic plan view illustrating a display device according to an embodiment and schematically illustrating an example of a display device using the light emitting element shown in FIGS. 1A and 1B as a light emitting source.

DETAILED DESCRIPTION OF THE EMBODIMENTS

Figure 1A:
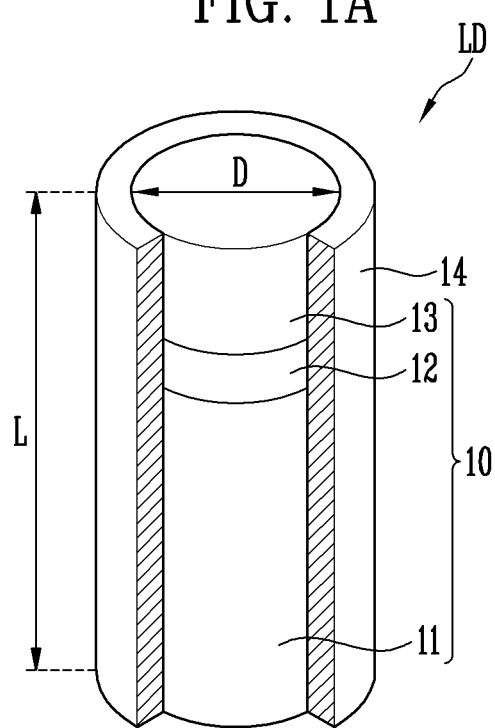
FIG. 1A is a perspective view schematically illustrating a light emitting element according to an embodiment.

Since the disclosure may be modified in various manners and have various forms, embodiments will be illustrated in the drawings and will be described in detail in the specification. However, it should be understood that the disclosure is not intended to be limited to the disclosed forms, and the disclosure includes all modifications, equivalents, and substitutions within the technical scope of the disclosure.

Similar reference numerals are used for similar components in describing each drawing. In the accompanying drawings, the dimensions of the structures may be shown enlarged from the actual dimensions for the sake of clarity.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

Terms of "first", "second", and the like may be used to describe various components, but the components should not be limited by the terms. The terms are used only for the purpose of distinguishing one component from another component. For example, without departing from the scope of the disclosure, a first component may be referred to as a second component, and similarly, a second component may also be referred to as a first component. The singular expressions include plural expressions unless the context clearly indicates otherwise.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

A case where a portion of a layer, a film, an area, a plate, or the like is referred to as being "on" another portion, it includes not only a case where the portion is "directly on" another portion, but also a case where there is further another portion between the portion and another portion. In the specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within +30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments and other matters necessary for those skilled in the art to understand the contents of the disclosure will be described in detail with reference to the accompanying drawings.

In the description below, the singular expressions include plural expressions unless the context clearly indicates otherwise. For example, as used herein, the singular forms, "a," "an," and "the" are intended to include the plural forms as well, unless the context clearly indicates otherwise.

Figure 1B:
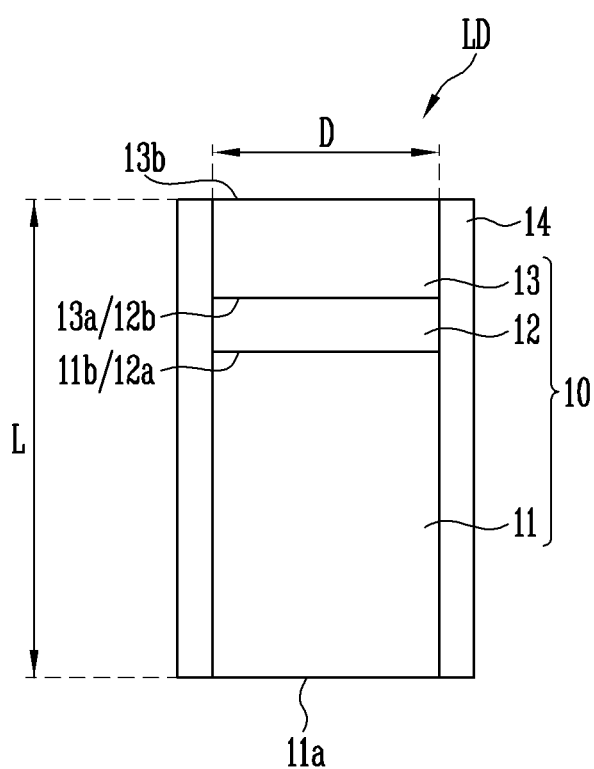
FIG. 1B is a schematic cross-sectional view of the light emitting element of FIG. 1A.

FIG. 1A is a schematic perspective view schematically illustrating a light emitting element according to an embodiment, and FIG. 1B is a schematic cross-sectional view of the light emitting element of FIG. 1A.

In FIGS. 1A and 1B, a light emitting element LD of a cylinder shape is shown, but the type and/or shape of the light emitting element LD according to the disclosure are/is not limited thereto. It is to be understood that the shapes disclosed herein also include shapes substantial to those shapes disclosed herein.

Referring to FIGS. 1A and 1B, the light emitting element LD may include a first semiconductor layer 11, a second semiconductor layer 13, and an active layer 12 interposed between the first semiconductor layer 11 and the second semiconductor layer 13. For example, the light emitting element LD may be implemented as an emission stack pattern 10 in which the first semiconductor layer 11, the active layer 12, and the second semiconductor layer 13 may be sequentially stacked each other.

The light emitting element LD may be provided (or disposed) in a shape extending in a direction. In case that an extension direction of the light emitting element LD is referred to as a longitudinal direction, the light emitting element LD may include one side end or a side end and another side end along the extension direction. Any one of the first and second semiconductor layers 11 and 13 may be disposed at the one side end or a side end of the light emitting element LD, and the other of the first and second semiconductor layers 11 and 13 may be disposed at the other side end or another side end of the light emitting element LD.

The light emitting element LD may be provided in various shapes. For example, the light emitting element LD may have a rod-like shape or a bar-like shape that is long in the longitudinal direction (for example, an aspect ratio is greater than 1). In an embodiment, a length L of the light emitting element LD in the longitudinal direction may be greater than a diameter D (or a width of a cross section) of the light emitting element LD. The light emitting element LD may include, for example, a light emitting diode manufactured to be extremely small to have the diameter D and/or the length L of about a micro scale or a nano scale. In an embodiment, a size of the light emitting element LD may be changed to accord with a requirement condition (or a design condition) of a lighting device or a self-luminous display device.

The first semiconductor layer 11 may include, for example, at least one n-type semiconductor layer. For example, the first semiconductor layer 11 may include any one semiconductor material among InAlGaN, GaN, AlGaN, InGaN, AlN, and InN, and may be an n-type semiconductor layer doped with a first conductive dopant (or an n-type dopant) such as Si, Ge, or Sn. However, the material forming the first semiconductor layer 11 is not limited thereto, and various other materials may form the first semiconductor layer 11. In an embodiment, the first semiconductor layer 11 may include a gallium nitride (GaN) semiconductor material doped with the first conductive dopant (or the n-type dopant). For example, the first semiconductor layer 11 may be an n-type GaN semiconductor. The first semiconductor layer 11 may include an upper surface 11b that is in contact with the active layer 12 and a lower surface 11a exposed to the outside.

The active layer 12 may be disposed on the first semiconductor layer 11 and may be formed in a single or multiple quantum well structure. A position of the active layer 12 may be variously changed according to the type of the light emitting element LD. The active layer 12 may emit light of a wavelength of 400 nm to 900 nm, and may use a double hetero structure. In an embodiment, a clad layer (not shown) doped with a conductive dopant may be formed on and/or under or below the active layer 12. For example, the clad layer may be formed of an AlGaN layer or an InAlGaN layer. According to an embodiment, a material such as AlGaN or InAlGaN may be used to form the active layer 12, and various other materials may form the active layer 12. The active layer 12 may include a first surface 12a that is in contact with the first semiconductor layer 11 and a second surface 12b that is in contact with the second semiconductor layer 13.

In case that an electric field of a voltage or more is applied to both ends of the light emitting element LD, the light emitting element LD emits light while an electron-hole pair is recombined in the active layer 12. By controlling light emission of the light emitting element LD by using such a principle, the light emitting element LD may be used as a light source (or a light emitting source) of various light emitting devices including a pixel of the display device.

The second semiconductor layer 13 may be disposed on the active layer 12 and may include a semiconductor layer of a type different from that of the first semiconductor layer 11. For example, the second semiconductor layer 13 may include at least one p-type semiconductor layer. For example, the second semiconductor layer 13 may include at least one semiconductor material among InAlGaN, GaN, AlGaN, InGaN, AlN, and InN, and may include a p-type semiconductor layer doped with a second conductive dopant (or a p-type dopant) such as Mg. However, the material forming the second semiconductor layer 13 is not limited thereto, and various other materials may form the second semiconductor layer 13. In an embodiment, the second semiconductor layer 13 may include a gallium nitride (GaN) semiconductor material doped with the second conductive dopant (or the p-type dopant). For example, the second semiconductor layer 13 may be a p-type GaN semiconductor. The second semiconductor layer 13 may include a lower surface 13a that is in contact with the active layer 12 and an upper surface 13b exposed to the outside.

In an embodiment, the first semiconductor layer 11 and the second semiconductor layer 13 may have widths (or thicknesses) different from each other in a length L direction of the light emitting element LD. For example, the first semiconductor layer 11 may have a width relatively wider (or a thickness thicker) than that of the second semiconductor layer 13 along the length L direction of the light emitting element LD. Therefore, the active layer 12 of the light emitting element LD may be positioned to be closer to the upper surface 13b of the second semiconductor layer 13 than to the lower surface 11a of the first semiconductor layer 11 as shown in FIGS. 1A and 1B.

In an embodiment, the light emitting element LD may include the lower surface 11a of the first semiconductor layer 11 and the upper surface 13b of the second semiconductor layer 13 exposed to the outside. The lower surface 11a of the first semiconductor layer 11 and the upper surface 13b of the second semiconductor layer 13 may be surfaces that are in contact with an external material, for example, a conductive material or a semiconductor material to be electrically connected thereto.

In an embodiment, the light emitting element LD may further include an insulating film 14. However, according to an embodiment, the insulating film 14 may be omitted and may be provided so as to cover or overlap only a portion of the first semiconductor layer 11, the active layer 12, and the second semiconductor layer 13.

The insulating film 14 may prevent an electrical short that may occur in case that the active layer 12 is in contact with a conductive material other than the first semiconductor layer 11 and the second semiconductor layer 13. By forming the insulating film 14, lifespan and efficiency of the light emitting element LD may be improved by minimizing a surface defect of the light emitting element LD. In case that light emitting elements LD are closely disposed, the insulating film 14 may prevent an unwanted short that may occur between the light emitting elements LD. In case that the active layer 12 may be prevented from an occurrence of a short with an external conductive material, presence or absence of the insulating film 14 is not limited.

As shown in FIGS. 1A and 1B, the insulating film 14 may be provided in a form entirely surrounding an outer circumferential surface of the emission stack pattern 10 including the first semiconductor layer 11, the active layer 12, and the second semiconductor layer 13. For convenience of description, a portion of the insulating film 14 is removed in FIG. 1A, but the first semiconductor layer 11, the active layer 12, and the second semiconductor layer 13 included in the actual emission stack pattern 10 may be surrounded by the insulating film 14.

In the above-described embodiment, the insulating film 14 entirely surrounds the outer circumferential surface of each of the first semiconductor layer 11, the active layer 12, and the second semiconductor layer 13, but the disclosure is not limited thereto. According to an embodiment, the insulating film 14 may cover or overlap the entire outer circumferential surface of the active layer 12, and may cover or overlap only a portion of the outer circumferential surface of each of the first and second semiconductor layers 11 and 13.

According to an embodiment, the insulating film 14 may include a transparent insulating material. For example, the insulating film 14 may include one or more insulating materials selected from a group consisting of $SiO_2$, $Si_3N_4$, $Al_2O_3$, and $TiO_2$, but is not limited thereto, and various materials having insulating properties may be used.

In case that the insulating film 14 is provided to the light emitting element LD, a short between the active layer 12 and an external conductive material may be prevented. By forming the insulating film 14, the lifespan and efficiency of the light emitting element LD may be improved by minimizing the surface defect of the light emitting element LD. In case that the light emitting elements LD are closely disposed, the insulating film 14 may prevent the unwanted short that may occur between the light emitting elements LD.

The above-described light emitting element LD may be used as a light emitting source of various display devices. The light emitting element LD may be manufactured by a surface treatment process. For example, in case that the light emitting elements LD are mixed in a fluid solution (or a solvent) and supplied to each emission area (for example, an emission area of each pixel or an emission area of each sub-pixel), the surface treatment may be performed on each of the light emitting elements LD so that the light emitting elements LD may be uniformly sprayed without being not uniformly aggregated in the solution.

The light emitting device including the light emitting element LD described above may be used in various types of devices that require a light source, including a display device. For example, in case that light emitting elements LD are disposed in an emission area of each pixel of a display panel, the light emitting elements LD may be used as a light source of each of the pixels. However, an application field of the light emitting element LD is not limited to the above-described example. For example, the light emitting element LD may be used in other types of devices that require a light source, such as a lighting device.

Figure 2A:
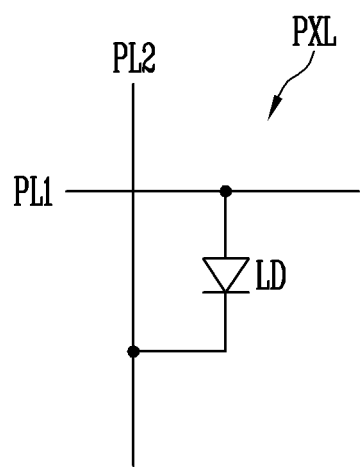
FIGS. 2A to 2C are schematic circuit diagrams illustrating a unit emission area of a light emitting device according to an embodiment, and, are schematic circuit diagrams illustrating an example of a pixel forming a light emitting display panel.
Figure 2B:
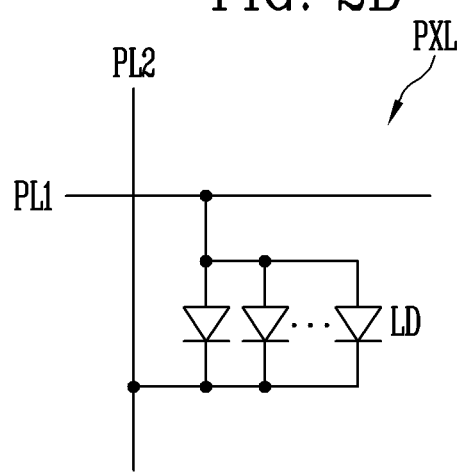
Figure 2C:
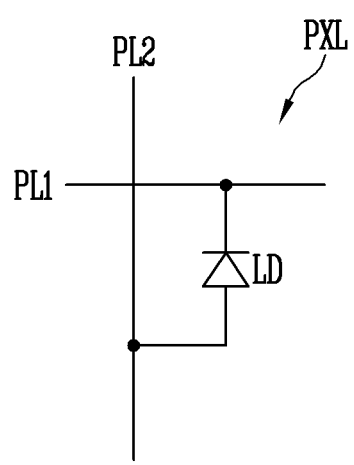

FIGS. 2A to 2C are schematic circuit diagrams illustrating a unit emission area of a light emitting device according to an embodiment, and, are schematic circuit diagrams illustrating an example of a pixel forming a light emitting display panel.

In FIGS. 2A to 2C, the unit emission area may be a pixel area in which one pixel PXL among pixels included in the light emitting display panel is disposed, and may be an area in which the light emitting element LD of FIGS. 1A and 1B and signal lines electrically connected to the light emitting element LD are provided.

Referring to FIGS. 1A to 2A, one pixel PXL may include the light emitting element LD and first and second power lines PL1 and PL2 connected to the light emitting element LD.

One side end or a side end (for example, the second semiconductor layer 13) of the light emitting element LD may be connected to the first power line PL1, and the other side end (for example, the first semiconductor layer 11) of the light emitting element LD may be connected to the second power line PL2. A signal (or voltage) may be transferred from the first power line PL1 to the one side end or a side end of the light emitting element LD, and a signal (or voltage) may be transferred from the second power line PL2 to the other side end of the light emitting element LD.

In an embodiment, the signal applied to the first power line PL1 and the signal applied to the second power line PL2 may have different levels. For example, in case that one side end or a side end of the light emitting element LD is the second semiconductor layer 13 and the other side end or another side end thereof is the first semiconductor layer 11, the signal applied to the first power line PL1 may be set as high potential power and the signal applied to the second power line PL2 may be set as low potential power.

In case that a voltage equal to or greater than a threshold voltage is applied between one end side or a side end and the other side end or another side end of the above-described light emitting element LD, the light emitting element LD may emit light with a luminance corresponding to a magnitude of the applied voltage. For example, light emission of the pixel PXL may be controlled by adjusting the signal applied from the first power line PL1 and/or the signal applied from the second power line PL2.

Referring to FIGS. 1A, 1B, and 2B, the pixel PXL may include light emitting elements LD connected in parallel. A luminance of the pixel PXL may correspond to a sum of brightness of the light emitting elements LD. In case that the pixel PXL may include the light emitting elements LD, even though a defect occurs in some or a number of the light emitting elements LD, the defect may be prevented from occurring because of a defect of the pixel PXL itself.

Referring to FIGS. 1A, 1B, and 2C, a connection direction of the light emitting element LD included in the pixel PXL may be changed. For example, one side end or a side end of the light emitting element LD may be connected to the second power line PL2, and the other side end thereof may be connected to the first power line PL1. In the embodiment of FIG. 2A and the embodiment of FIG. 2B, directions of the voltages applied between the first power line PL1 and the second power line PL2 may be opposite to each other.

Figure 4:
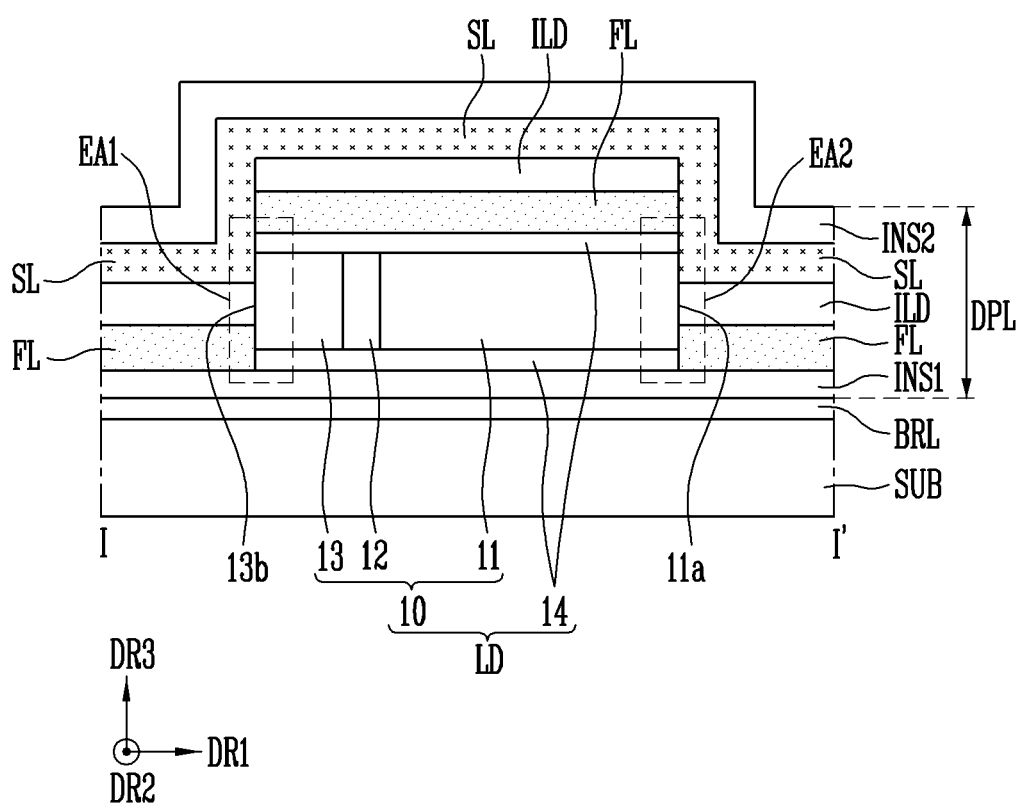
FIG. 4 is a schematic cross-sectional view taken along line I~I' of FIG. 3.
Figure 5A:
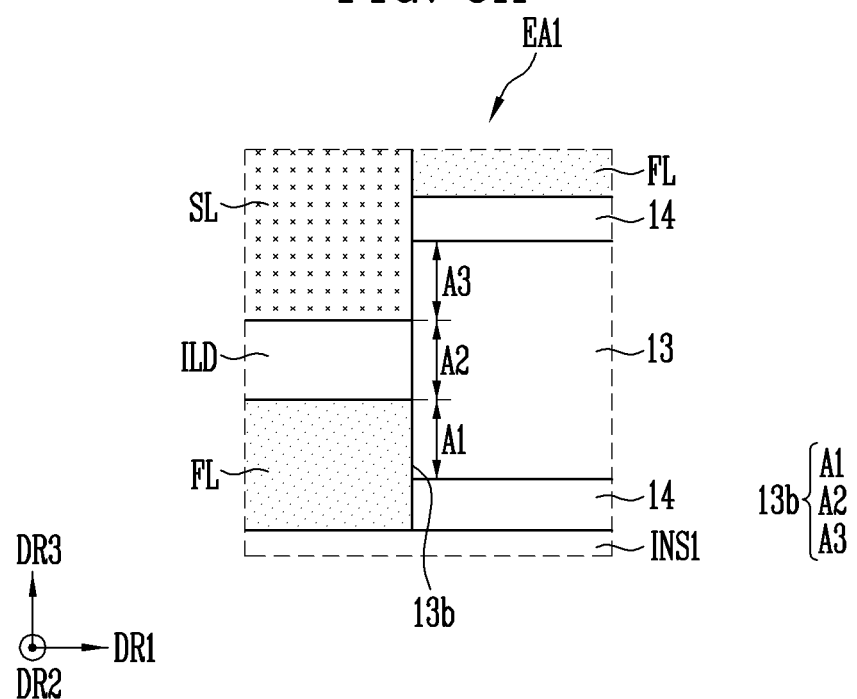
FIG. 5A is an enlarged schematic cross-sectional view of a portion EA1.
Figure 5B:
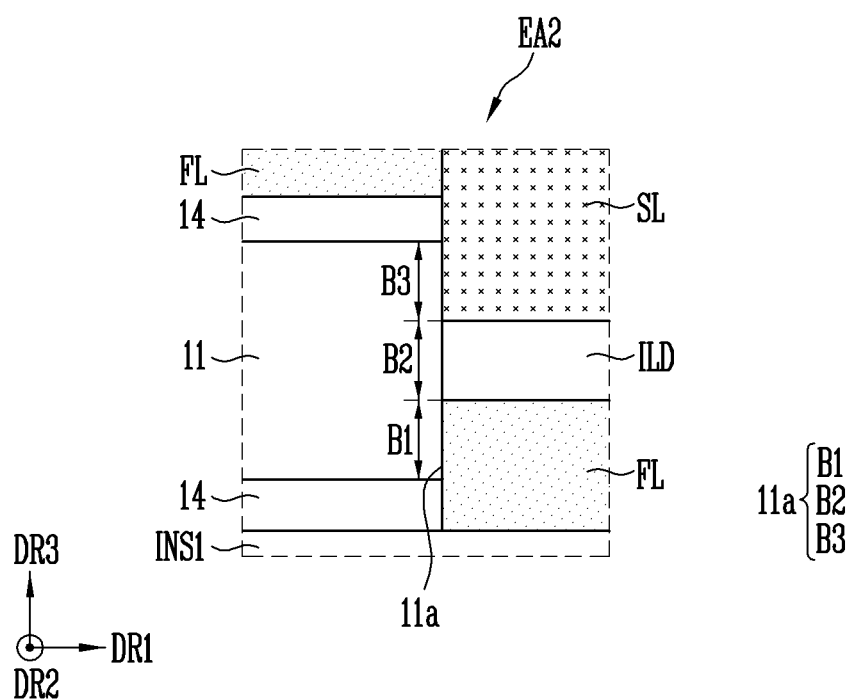
FIG. 5B is an enlarged schematic cross-sectional view of a portion EA2 of FIG. 4.
Figure 6A:
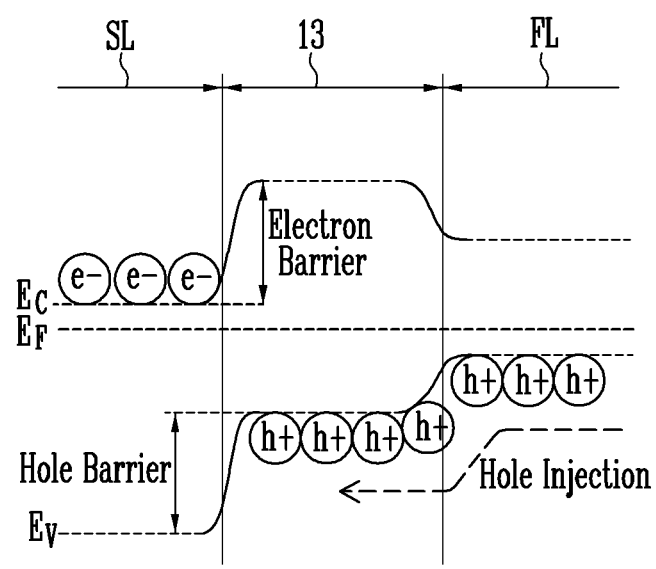
FIGS. 6A and 6B are diagrams schematically illustrating an energy band diagram of a first layer, a first semiconductor layer, a second semiconductor layer, and a second layer.
Figure 6B:
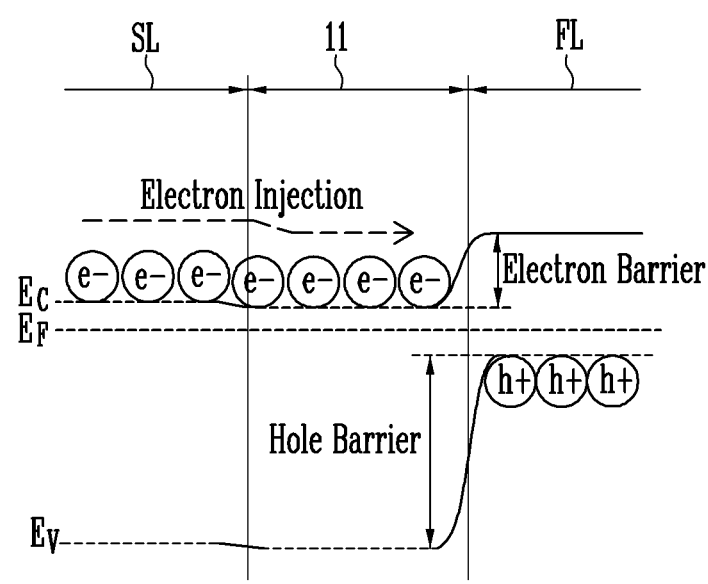

FIG. 3 is a schematic plan view illustrating an area of a light emitting device including a unit emission area according to an embodiment, FIG. 4 is a schematic cross-sectional view taken along line I~I' of FIG. 3, FIG. 5A is an enlarged schematic cross-sectional view of a portion EA1 of FIG. 4, FIG. 5B is an enlarged schematic cross-sectional view of a portion EA2 of FIG. 4, and FIGS. 6A and 6B are diagrams schematically illustrating an energy band diagram of a first layer, the first semiconductor layer, the second semiconductor layer, and a second layer.

Referring to FIGS. 1A, 1B, and 3 to 6B, the unit emission area of the light emitting device is a pixel area PXA in which one pixel PXL including at least one light emitting element LD is disposed, and may include an emission area where light is emitted. Hereinafter, for convenience of description, the unit emission area is referred to as the pixel area PXA.

A display element part DPL including the light emitting element LD may be provided in the pixel area PXA. The display element part DPL may be connected to the first and second power lines PL1 and PL2.

The first power line PL1 and the second power line PL2 may be provided and/or formed on the substrate SUB to be spaced apart from each other. Each of the first and second power lines PL1 and PL2 may extend in one direction or a direction, for example, in a second direction DR2. However, the disclosure is not limited thereto, and the first and second power lines PL1 and PL2 may extend in various directions. The first and second power lines PL1 and PL2 may be formed of a conductive material (or substance). A signal (or voltage) of a constant level may be applied to each of the first and second power lines PL1 and PL2. For example, an external signal (or voltage) may be applied to each of the first and second power lines PL1 and PL2. As another example, each of the first and second power lines PL1 and PL2 may receive the signal (or voltage) from a configuration through an electrical connection with the configuration to which the signal (or voltage) is applied in the light emitting device.

A barrier layer BRL may be provided and/or formed on the first and second power lines PL1 and PL2.

The barrier layer BRL may prevent an impurity from diffusing into the display element part DPL. The barrier layer BRL may include an inorganic insulating layer including an inorganic material. For example, the barrier layer BRL may include at least one of silicon nitride ($SiN_x$), silicon oxide ($SiO_x$), silicon oxynitride (SiON), and a metal oxide such as aluminum oxide ($AlO_x$). The barrier layer BRL may be provided as a single layer, but may be provided as a multilayer of at least a double layer. In case that the barrier layer BRL is provided as the multilayer, each layer may be formed of a same material or a similar material or may be formed of different materials. The barrier layer BRL may be omitted according to a material, a process condition, and the like of the substrate SUB.

According to an embodiment, the first and second power lines PL1 and PL2 or at least one of the first and second power lines PL1 and PL2 may be provided and/or formed on the barrier layer BRL. Although not shown directly in the drawing, one area or an area of the first power line PL1 may be exposed to the outside through a first contact hole CH1 passing through the barrier layer BRL, and one area or an area of the second power line PL2 may be exposed to the outside through a second contact hole CH2 passing through the barrier layer BRL.

The display element part DPL may be provided and/or formed on the barrier layer BRL. The display element part DPL may be formed on the barrier layer BRL on the substrate SUB. At this time, the display element part DPL may include at least one insulating layer. In FIG. 4, one insulating layer is formed on each of an upper portion and a lower portion of the light emitting element LD, but the disclosure is not limited thereto. Referring to FIG. 4, in the display element part DPL, a first insulating layer INS1, the light emitting element LD disposed on the first insulating layer INS1, first and second layers FL and SL that are in contact with both ends EP1 and EP2 of the light emitting element LD, a second insulating layer INS2 disposed on the second layer SL, and the like may be formed. The display element part DPL may further include a bank pattern (not shown) provided and/or formed in a peripheral area of the pixel area PXA of each pixel PXL to define the pixel area PXA of each pixel PXL. Each of the first and second power lines PL1 and PL2 may overlap the bank pattern on the substrate SUB or may be disposed outside the bank pattern.

The first insulating layer INS1 may be disposed on the barrier layer BRL. The first insulating layer INS1 may include at least one of silicon nitride ($SiN_x$), silicon oxide ($SiO_x$), silicon oxynitride (SiON), and a metal oxide such as aluminum oxide ($AlO_x$). The first insulating layer INS1 may be provided as a single layer, but may be provided as a multilayer of a double layer or more. In an embodiment, the first insulating layer INS1 may be formed of silicon oxide ($SiO_x$) and may be provided as a single layer.

At least one light emitting element LD may be disposed on the first insulating layer INS1. For example, light emitting elements LD may be disposed on the first insulating layer INS1.

Each of the light emitting elements LD may be a light emitting element having an ultra-small size, for example, as small as a nano scale to a micro scale, using a material of an inorganic crystal structure. For example, each of the light emitting elements LD may be a light emitting element of an ultra-small size manufactured by an etching method. In an embodiment, each of the light emitting elements LD may be the light emitting element including the emission stack pattern 10 in which the first semiconductor layer 11, the active layer 12, and the second semiconductor layer 13 may be sequentially stacked each other along the length L direction, and the insulating film 14 surrounding the outer circumferential surface (or surface) of the emission stack pattern 10, and manufactured by an etching method, as shown in FIGS. 1A to 4.

Two to tens of light emitting elements LD may be provided in the pixel area PXA, but the number of light emitting elements LD is not limited thereto.

In an embodiment, each of the light emitting elements LD may emit any one of color light and/or white light. Each of the light emitting elements LD may be disposed on the first insulating layer INS1 so that the length L direction corresponds to a first direction DR1 intersecting a thickness direction DR3 of the display element part DPL. For example, each light emitting element LD may be disposed on the first insulating layer INS1 so that the length L direction is parallel to the first direction DR1.

The light emitting elements LD may be input to the pixel area PXA through an inkjet printing method, a slit coating method, or other various methods. For example, the light emitting elements LD may be mixed with a volatile solvent and supplied to the pixel area PXA through an inkjet printing method or a slit coating method. The light emitting elements LD may be disposed on the first insulating layer INS1 disposed in the pixel area PXA. After the light emitting elements LD are supplied, the solvent may be evaporated or removed by other methods to finally provide the light emitting elements LD to the pixel area PXA.

Each of the light emitting elements LD may have the first end EP1 and the second end EP2 in the length L direction. The first end EP1 of each of the light emitting elements LD may be one of the first and second semiconductor layers 11 and 13, and the second end EP2 of each of the light emitting elements LD may be the other one of the first and second semiconductor layers 11 and 13. For example, the first end EP1 of each of the light emitting elements LD may be the first semiconductor layer 11 including the n-type semiconductor layer, and the second end EP2 thereof may be the second semiconductor layer 13 including the p-type semiconductor layer.

The first layer FL may be provided and/or formed on the light emitting elements LD. In an embodiment, the first layer FL may include a hydrogenated amorphous silicon (a-Si:H) semiconductor material. For example, the first layer FL may include a p-type hydrogenated amorphous silicon (a-Si:H) semiconductor material doped with a p-type dopant such as Mg.

The first layer FL may be in contact with the both ends EP1 and EP2 of each of the light emitting elements LD. For example, the first layer FL may be in contact with each of one area or an area of the first end EP1 of each of the light emitting elements LD and one area or an area of the second end EP2 of each of the light emitting elements LD.

In an embodiment, as shown in FIG. 5A, the first layer FL may be in direct contact with a first area A1 of the upper surface 13b of the second semiconductor layer 13 of each light emitting element LD. As shown in FIG. 5B, the first layer FL may be in direct contact with a first area B1 of the lower surface 11a of the first semiconductor layer 11 of each light emitting element LD. Here, the upper surface 13b of the second semiconductor layer 13 and the lower surface 11a of the first semiconductor layer 11 may be surfaces which are not surrounded by the insulating film 14 and which are at least partially exposed to the outside.

The first area A1 of the upper surface 13b of the second semiconductor layer 13, which is in contact with the first layer FL, and the first area B1 of the lower surface 11a of the first semiconductor layer 11, which is in contact with the first layer FL, may be less than the diameter D of the emission stack pattern 10. The first area A1 of the upper surface 13b of the second semiconductor layer 13, which is in contact with the first layer FL, and the first area B1 of the lower surface 11a of the first semiconductor layer 11, which is in contact with the first layer FL, may have a same thickness (or width). However, the disclosure is not limited thereto, and according to an embodiment, first area A1 of the upper surface 13b of the second semiconductor layer 13, which is in contact with the first layer FL, and the first area B1 of the lower surface 11a of the first semiconductor layer 11, which is in contact with the first layer FL, may have different thicknesses (or widths).

The first layer FL may be provided and/or formed on an upper surface of each of the light emitting elements LD. For example, the first layer FL may be provided and/or formed on the first insulating layer INS1 provided with the light emitting elements LD, and may be provided and/or formed on each of the upper surface of the light emitting elements LD and the first insulating layer INS1.

The above-described first layer FL may be electrically and/or physically connected to the first power line PL1 through the first contact hole CH1. For example, the first layer FL may be electrically and/or physically connected to the first power line PL1 through a separate connection means (not shown) and the first contact hole CH1. Here, the separate connection means may be a configuration for connecting the first power line PL1 and the first layer FL, and may correspond to a second bridge pattern BRP2 of FIG. 9 to be described later. Accordingly, the signal (or voltage) applied to the first power line PL1 may be transferred to the first layer FL.

An interlayer insulating layer ILD may be provided and/or formed on the first layer FL. The interlayer insulating layer ILD may be provided and/or formed on each of the light emitting elements LD and the first layer FL. The interlayer insulating layer ILD may be an inorganic insulating layer including an inorganic material. For example, the interlayer insulating layer ILD may include at least one of silicon nitride ($SiN_x$), silicon oxide ($SiO_x$), silicon oxynitride (SiON), and a metal oxide such as aluminum oxide ($AlO_x$). The interlayer insulating layer ILD may be provided as a single layer, but may be provided as a multilayer of at least a double layer. In an embodiment, the interlayer insulating layer ILD may be formed of silicon oxide ($SiO_x$) and may be a single layer. However, the disclosure is not limited thereto.

In an embodiment, the interlayer insulating layer ILD may be provided and/or formed on the first layer FL that is in contact with the first area A1 of the upper surface 13b of the second semiconductor layer 13 of each light emitting element LD. The interlayer insulating layer ILD may be provided and/or formed on the first layer FL that is in contact with the first area B1 of the lower surface 11a of the first semiconductor layer 11 of each light emitting element LD. Accordingly, the interlayer insulating layer ILD may be in contact with another area of the upper surface 13b of the second semiconductor layer 13 of each light emitting element LD and another area of the lower surface 11a of the first semiconductor layer 11. For example, as shown in FIG. 5A, the interlayer insulating layer ILD may be in contact with or directly contact with the second area A2 of the upper surface 13b of the second semiconductor layer 13 of each light emitting element LD. As shown in FIG. 5B, the interlayer insulating layer ILD may be in contact with the second area B2 of the lower surface 11a of the first semiconductor layer 11 of each light emitting element LD.

The second area A2 of the upper surface 13b of the second semiconductor layer 13, which is in contact with the interlayer insulating layer ILD, and the second area B2 of the lower surface 11a of the first semiconductor layer 11, which is in contact with the interlayer insulating layer ILD, may be less than the diameter D of the emission stack pattern 10. In an embodiment, the second area A2 of the upper surface 13b of the second semiconductor layer 13, which is in contact with the interlayer insulating layer ILD, and the second area B2 of the lower surface 11a of the first semiconductor layer 11, which is in contact with the interlayer insulating layer ILD, may have a same thickness (or width). However, the disclosure is not limited thereto, and according to an embodiment, the second area A2 of the upper surface 13b of the second semiconductor layer 13, which is in contact with the interlayer insulating layer ILD, and the second area B2 of the lower surface 11a of the first semiconductor layer 11, which is in contact with the interlayer insulating layer ILD, may have different thicknesses (or widths).

The second layer SL may be provided and/or formed on the interlayer insulating layer ILD. The second layer SL may be provided and/or formed on each of the light emitting elements LD and the interlayer insulating layer ILD. The second layer SL may be formed of a transparent oxide semiconductor material having high electron mobility. In an embodiment, the second layer SL may be formed of a transparent oxide semiconductor material such as a-IGZO. The second layer SL may be in contact with the both ends EP1 and EP2 of each of the light emitting elements LD. For example, the second layer SL may be in contact with still another area of the first end EP1 of each light emitting element LD and still another area of the second end EP2 of each light emitting element LD.

In an embodiment, as shown in FIG. 5A, the second layer SL may be in contact with or directly contact with a third area A3 of the upper surface 13b of the second semiconductor layer 13 of each light emitting element LD. As shown in FIG. 5B, the second layer SL may be in direct contact with a third area B3 of the lower surface 11a of each light emitting element LD.

The third area A3 of the upper surface 13b of the second semiconductor layer 13, which is in contact with the second layer SL, and the third area B3 of the lower surface 11a of the first semiconductor layer 11, which is in contact with the second layer SL, may be less than the diameter D of the emission stack pattern 10. The third area A3 of the upper surface 13b of the second semiconductor layer 13, which is in contact with the second layer SL, and the third area B3 of the lower surface 11a of the first semiconductor layer 11, which is in contact with the second layer SL, may have a same thickness (or width). However, the disclosure is not limited thereto, and according to an embodiment, the third area A3 of the upper surface 13b of the second semiconductor layer 13, which is in contact with the second layer SL, and the third area B3 of the lower surface 11a of the first semiconductor layer 11, which is in contact with the second layer SL, may have different thicknesses (or widths).

The second layer SL may be provided and/or formed on the interlayer insulating layer ILD disposed on the upper surfaces of the light emitting elements LD.

The above-described interlayer insulating layer ILD may be positioned between the first layer FL and the second layer SL. The first layer FL and the second layer SL may be spaced apart from each other because of the interlayer insulating layer ILD. For example, the first layer FL and the second layer SL may be electrically and/or physically separated from each other.

The first area A1 of the upper surface 13b of the second semiconductor layer 13, which is in contact with the first layer FL, the second area A2 of the upper surface 13b of the second semiconductor layer 13, which is in contact with the interlayer insulating layer ILD, and the third area A3 of the upper surface 13b of the second semiconductor layer 13, which is in contact with the second layer SL may have a same thickness (or width). However, the disclosure is not limited thereto, and according to an embodiment, the first area A1 of the upper surface 13b of the second semiconductor layer 13, which is in contact with the first layer FL, the second area A2 of the upper surface 13b of the second semiconductor layer 13, which is in contact with the interlayer insulating layer ILD, and the third area A3 of the upper surface 13b of the second semiconductor layer 13, which is in contact with the second layer SL may have different thicknesses (or widths). According to an embodiment, two areas among the first area A1 of the upper surface 13b of the second semiconductor layer 13, which is in contact with the first layer FL, the second area A2 of the upper surface 13b of the second semiconductor layer 13, which is in contact with the interlayer insulating layer ILD, and the third area A3 of the upper surface 13b of the second semiconductor layer 13, which is in contact with the second layer SL may have a same thickness (or width).

The first area B1 of the lower surface 11a of the first semiconductor layer 11, which is in contact with the first layer FL, the second area B2 of the lower surface 11a of the first semiconductor layer 11, which is in contact with the interlayer insulating layer ILD, and the third area B3 of the lower surface 11a of the first semiconductor layer 11, which is in contact with the second layer SL may have a same thickness (or width). However, the disclosure is not limited thereto, and according to an embodiment, first area B1 of the lower surface 11a of the first semiconductor layer 11, which is in contact with the first layer FL, the second area B2 of the lower surface 11a of the first semiconductor layer 11, which is in contact with the interlayer insulating layer ILD, and the third area B3 of the lower surface 11a of the first semiconductor layer 11, which is in contact with the second layer SL may have different thicknesses (or widths). According to an embodiment, two areas among the first area B1 of the lower surface 11a of the first semiconductor layer 11, which is in contact with the first layer FL, the second area B2 of the lower surface 11a of the first semiconductor layer 11, which is in contact with the interlayer insulating layer ILD, and the third area B3 of the lower surface 11a of the first semiconductor layer 11, which is in contact with the second layer SL may have a same thickness (or width).

The second layer SL may be electrically and/or physically connected to the second power line PL2 through the second contact hole CH2. At this time, the second layer SL may extend to the outside of the pixel area PXA where the bank pattern is positioned (for example, one area or an area of the second power line PL2 exposed by the second contact hole CH2), and may be connected to the second power line PL2. Accordingly, the signal (or voltage) applied to the second power line PL2 may be transferred to the second layer SL. Here, the signal applied to the second power line PL2 may be set as low potential power, and the signal (or voltage) applied to the first power line PL1 may be set as high potential power.

The above-described first layer FL may be formed of a p-type hydrogenated amorphous silicon (a-Si:H) semiconductor material, and may have a band gap lower than that of the second layer SL because of a material property. A Fermi level EF of the second semiconductor layer 13 including the p-type GaN semiconductor may exist slightly above a valence band Ev. The Fermi level EF of the first semiconductor layer 11 including the n-type GaN semiconductor material may exit slightly under or below a conduction band Ec.

As shown in FIG. 6A, in the first area A1 of the upper surface 13b of the second semiconductor layer 13 where the first layer FL including the p-type hydrogenated amorphous silicon (a-Si:H) semiconductor material and the second semiconductor layer 13 including the p-type GaN semiconductor are in contact with each other may have a low energy barrier with respect to a hole h+ because of a material property of the second semiconductor layer 13 that is in contact with the first layer FL, for example, the Fermi level Ef.

As shown in FIG. 6B, the first area B1 of the lower surface 11a of the first semiconductor layer 11 where the first layer FL including the p-type hydrogenated amorphous silicon (a-Si:H) semiconductor material and the first semiconductor layer 11 including the n-type GaN semiconductor are in contact with each other may have a high energy barrier with respect to an electron e-because of a material property of the first semiconductor layer 11 that is in contact with the first layer FL, for example, the Fermi level Ef.

Since the above-described second layer SL is formed of a-IGZO, the second layer SL may have a band gap higher than that of the first layer FL formed of the p-type hydrogenated amorphous silicon (a-Si:H) semiconductor material. In general, in case that a band gap of a silicon material is about 1.2 eV, a band gap of the a-IGZO material may be about 3.1 eV. The second layer SL may have high electron mobility because of the material property having a high band gap. As shown in FIG. 6A, the third area A3 of the upper surface 13b of the second semiconductor layer 13 where the second layer SL formed of the a-IGZO and the second semiconductor layer 13 including the p-type GaN semiconductor are in contact with each other may have a high energy barrier with respect to the hole h+ and the electron e-because of the material property of the second semiconductor layer 13 that is in contact with the second layer SL.

The third area B3 of the lower surface 11a of the first semiconductor layer 11 where the second layer SL formed of the a-IGZO and the first semiconductor layer 11 including the n-type GaN semiconductor are in contact with each other may have a low energy barrier with respect to the electron e-because of the material property of the first semiconductor layer 11 that is in contact with the second layer SL.

In an embodiment, because of a difference between the Fermi levels EF of the first semiconductor layer 11 and the second semiconductor layer 13 which are in contact with each of the first and second layers FL and SL, respectively, the electron e-may be selectively injected into the third area B3 of the lower surface 11a of the first semiconductor layer 11, and the hole h+ may be selectively injected into the first area A1 of the upper surface 13b of the second semiconductor layer 13.

In case that a signal (or voltage) is applied to each of the first and second layers FL and SL through the first and second power lines PL1 and PL2, the hole h+ may be injected into the second semiconductor layer 13 through a junction surface of the first layer FL having the low energy barrier for the hole h+ and the first area A1 of the upper surface 13b of the second semiconductor layer 13. The electron e-may be injected into the first semiconductor layer 11 through a junction surface of the second layer SL having the low energy barrier for the electron e—and the third area B3 of the lower surface 11a of the first semiconductor layer 11. The second semiconductor layer 13 may supply the hole h+ to the active layer 12, and the first semiconductor layer 11 may supply the electron e-to the active layer 12. Accordingly, the electron e- and the hole h+ may recombine in the active layer 12 of each light emitting element LD to transit to a low energy level, and light (or rays) having a wavelength corresponding thereto may be emitted.

In an embodiment, the electron e- and the hole h+ do not move to the first semiconductor layer 11 because of the material property of the first semiconductor layer 11 in the first area B1 of the lower surface 11a of the first semiconductor layer 11, which is in contact with the first layer FL. For example, flow of the electron e- and flow of the hole h+ may be blocked in the first area B1 of the lower surface 11a of the first semiconductor layer 11, which is in contact with the first layer FL.

The electron e- and the hole h+ do not move to the second semiconductor layer 13 because of the material property of the second semiconductor layer 13 in the third area A3 of the upper surface 13b of the second semiconductor layer 13, which is in contact with the second layer SL. For example, flow of the electron e- and flow of the hole h+ may be blocked in the third area A3 of the upper surface 13b of the second semiconductor layer 13, which is in contact with the second layer SL.

As described above, the hole h+ may be injected into the second semiconductor layer 13 through the first area A1 of the upper surface 13b of the second semiconductor layer 13, which is in contact with the first layer FL, the electron e-may be injected into the first semiconductor layer 11 through the third area B3 of the lower surface 11a of the first semiconductor layer 11, which is in contact with the second layer SL, and thus each light emitting element LD may emit light. In an embodiment, the first layer FL may function as a hole injection layer for injecting the hole h+ into one area or an area of the second semiconductor layer 13, and the second layer SL may function as an electron injection layer for injecting the electron e-into one area or an area of the first semiconductor layer 11.

A second insulating layer INS2 may be provided and/or formed on the second layer SL. The second insulating layer INS2 may cover or overlap the second layer SL to protect the second layer SL. The second insulating layer INS2 may include at least one of silicon nitride ($SiN_x$), silicon oxide ($SiO_x$), silicon oxynitride (SiON), and a metal oxide such as aluminum oxide ($AlO_x$). The first insulating layer INS1 may be provided as a single layer, but may be also provided as a multilayer of a double layer or more. In an embodiment, the second insulating layer INS2 may include a same material or a similar material as the first insulating layer INS1, but the disclosure is not limited thereto.

According to the above-described embodiment, the first layer FL, the interlayer insulating layer ILD, and the second layer SL may be disposed on the light emitting elements LD supplied to the pixel area PXA, and a signal (or voltage) may be applied to the both ends EP1 and EP2 of each of the light emitting elements LD through the first layer FL that is in contact with the first semiconductor layer 11 of each light emitting element LD and the second layer SL that is in contact with the first semiconductor layer 11 of each light emitting element LD. Accordingly, each of the light emitting elements LD may emit light.

As the light emitting elements LD are driven using the first layer FL and the second layer SL, configurations for aligning the light emitting elements LD in the pixel area PXA, for example, alignment electrodes (or alignment lines) may be omitted.

As described above, since the light emitting elements LD may be aligned in the pixel area PXA without alignment electrodes (or alignment lines), a manufacturing process of the light emitting element may be simplified and manufacturing cost may be reduced.

Since configurations for aligning the light emitting elements LD in the pixel area PXA are omitted, a size of the pixel PXL may be reduced by minimizing a process margin of the pixel area PXA. Accordingly, high resolution implementation of the light emitting device may become readily implemented.

Figure 7:
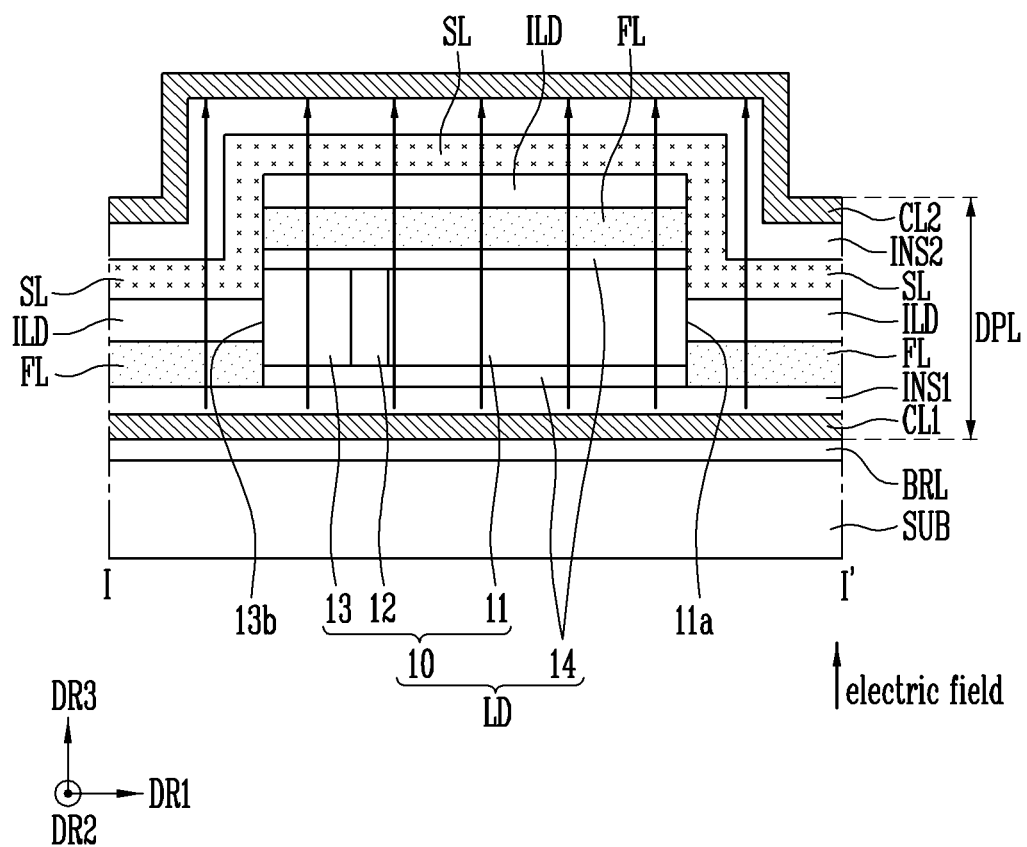
FIG. 7 is a schematic cross-sectional view illustrating a unit emission area of a light emitting device according to an embodiment, and is a schematic cross-sectional view taken along the line I~I' of FIG. 3.

FIG. 7 is a schematic cross-sectional view illustrating a unit emission area of a light emitting device according to an embodiment, and is a schematic cross-sectional view taken along the line I~I' of FIG. 3.

Regarding the embodiment of FIG. 7, a point different from that of the above-described embodiment is described in order to avoid an overlapping description. A portion which is not for example described in the disclosure is in accordance with the above-described embodiment, and the same numbers indicate the same components and similar numbers indicate similar components.

Referring to FIGS. 1A to 7, the display element part DPL including the light emitting element LD may be provided in the pixel area PXA in which one pixel PXL is provided (or prepared). The display element part DPL may further include first and second conductive lines CL1 and CL2.

For example, the display element part DPL may include the first conductive line CL1 disposed on the barrier layer BRL on the substrate SUB, the first insulating layer INS1 disposed on the first conductive line CL1, the light emitting element LD disposed on the first insulating layer INS1, the first layer FL disposed on the light emitting element LD, the interlayer insulating layer ILD disposed on the first layer FL, the second layer SL disposed on the interlayer insulating layer ILD, the second insulating layer INS2 disposed on the second layer SL and the second conductive line CL2 disposed on the second insulating layer INS2.

The first conductive line CL1 may be provided and/or formed between the barrier layer BRL and the first insulating layer INS1. The first conductive line CL1 may include a metal or a metal oxide, and may use, for example, chromium (Cr), titanium (Ti), aluminum (Al), gold (Au), nickel (Ni), an oxide or an alloy thereof, indium tin oxide (ITO), and the like alone or in combination, but is not limited thereto. In an embodiment, the first conductive line CL1 may include indium tin oxide (ITO). A signal (or voltage) may be applied to the first conductive line CL1.

The second conductive line CL2 may be provided and/or formed on the second insulating layer INS2. The second conductive line CL2 may include a same material or a similar material as the first conductive line CL1, but the disclosure is not limited thereto. According to an embodiment, the second conductive line CL2 may include a material different from that of the first conductive line CL1. In an embodiment, the second conductive line CL2 may include indium tin oxide (ITO). A signal (or voltage) may be applied to the second conductive line CL2. The signal (or voltage) applied to the first conductive line CL1 and the signal (or voltage) applied to the second conductive line CL2 may be different from each other, and for example, the signals applied to each of the first and second conductive lines CL1 and CL2 may be driving power for driving the pixel PXL. For example, the signal (or voltage) applied to the first conductive line CL1 may be set as low potential power, and the signal (or voltage) applied to the second conductive line CL2 may be set as high potential power. However, the disclosure is not limited thereto, and according to an embodiment, the signal (or voltage) applied to the first conductive line CL1 may be the same as the signal (or voltage) applied to the second power line PL2.

As the signal (or voltage) is applied to each of the first conductive line CL1 and the second conductive line CL2, an electric field may be formed in an arrow direction shown in FIG. 7 between the first conductive line CL1 and the second conductive line CL2. For example, the electric field may be formed in a direction from the first conductive line CL1 to the second conductive line CL2. An HE11 mode of light emitted from the active layer 12 of the light emitting element LD may be strengthened. The HE11 mode may include an HE11$x$ mode and an HE11$y$ mode in which polarization states of light are perpendicular to each other within an optical fiber of a single mode.

In an embodiment, the HE11$x$ mode may mean a state in which the light emitted from the active layer 12 of each light emitting element LD is polarized along the length L direction of each light emitting element LD. For example, the HE11$x$ mode may mean a state in which the light emitted from the active layer 12 of each light emitting element LD is polarized along the first direction DR1. In an embodiment, the HE11$y$ mode may mean a state in which the light emitted from the active layer 12 of each light emitting element LD is polarized along a direction intersecting the length L direction of each light emitting element LD. For example, the HE11$y$ mode may mean a state in which the light emitted from the active layer 12 of each light emitting element LD is polarized along the third direction DR3.

In case that the signal (or voltage) is applied to each of the first conductive line CL1 and the second conductive line CL2 and the electric field is formed in the direction from the first conductive line CL1 to the second conductive line CL2, the HE11$x$ mode may be strengthened. Accordingly, amount (or intensity) of the light emitted from the active layer 12 of each light emitting element LD and polarized in the first direction DR1 may increase. For example, the amount (or the intensity) of light proceeding from the active layer 12 of each light emitting element LD to each of the first semiconductor layer 11 and the second semiconductor layer 13 in the first direction DR1 may increase. Accordingly, light output efficiency of each light emitting element LD may be further improved.

Figure 8:
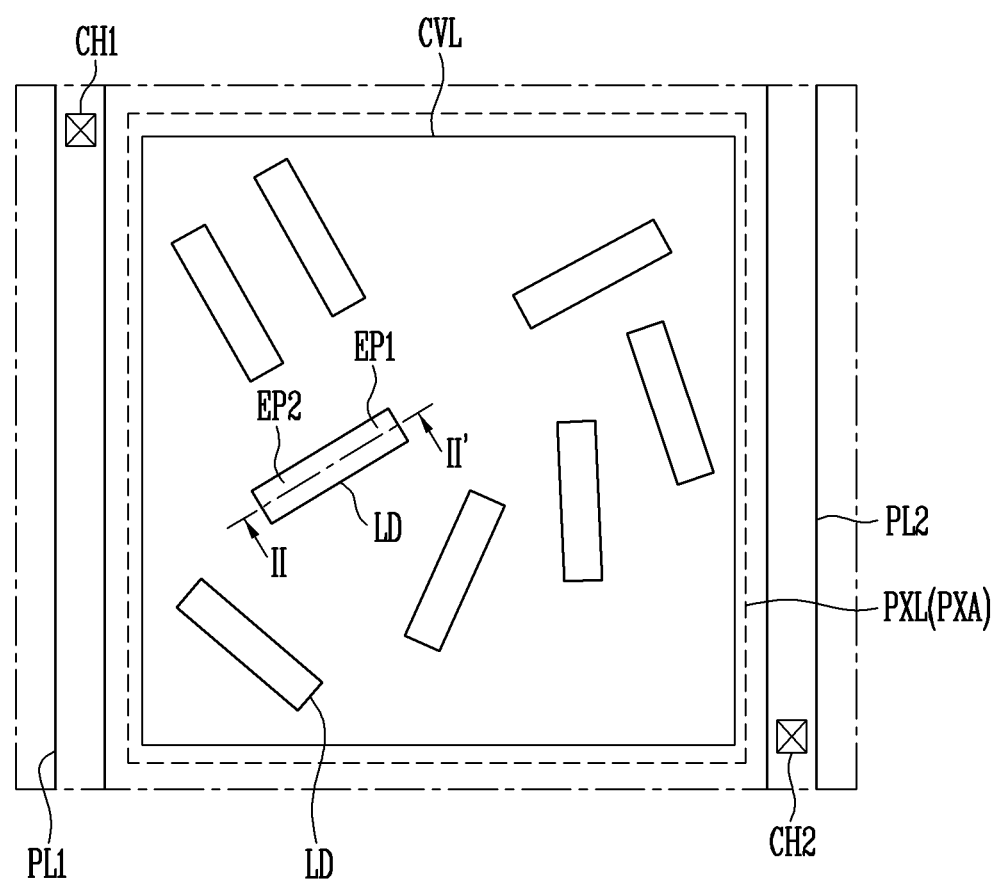
FIG. 8 is a schematic plan view illustrating a unit emission area of a light emitting device according to an embodiment.
Figure 9:
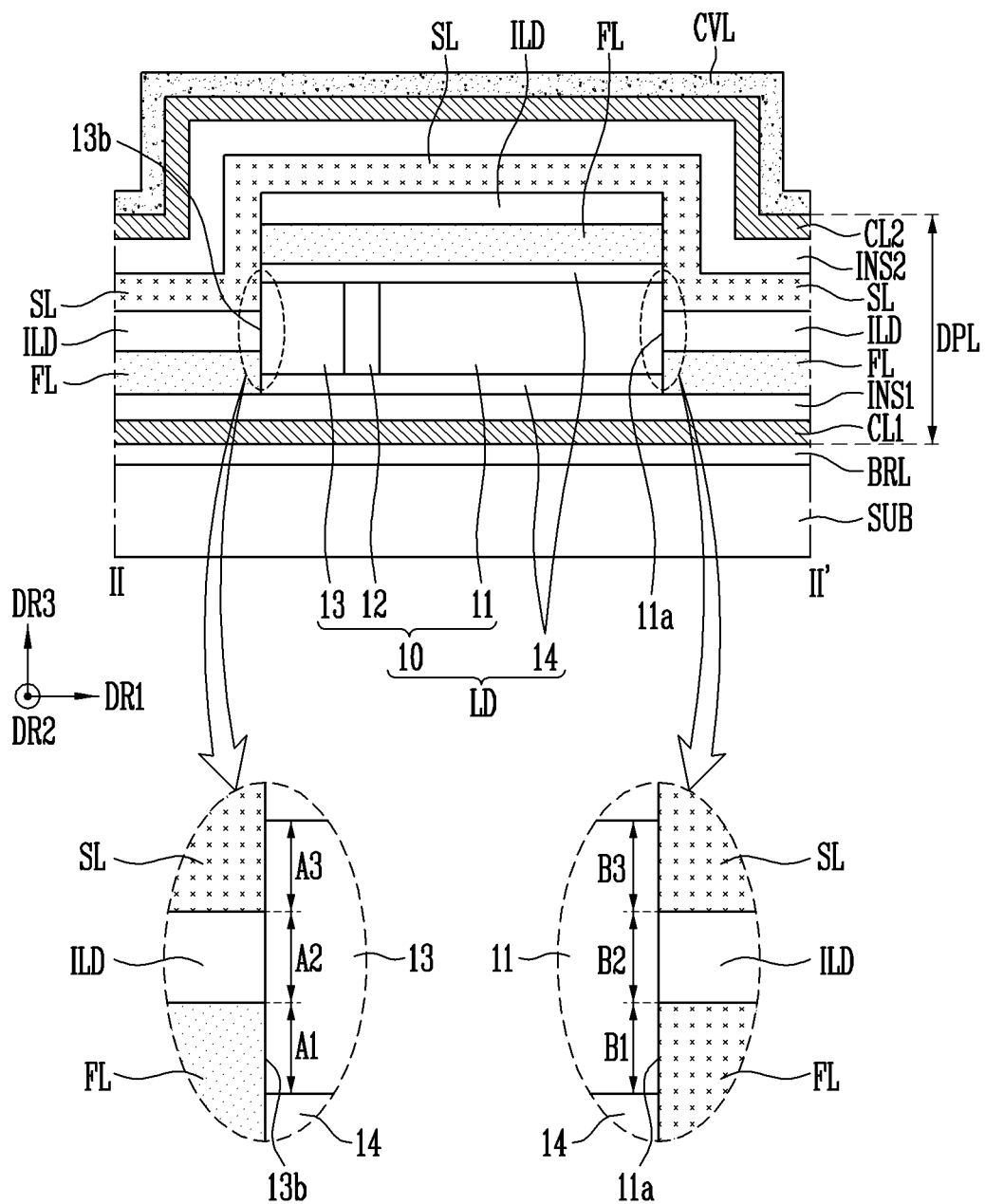
FIG. 9 is a schematic cross-sectional view corresponding to line II~II' of FIG. 8.

FIG. 8 is a schematic plan view illustrating a unit emission area of a light emitting device according to an embodiment, and FIG. 9 is a schematic cross-sectional view corresponding to line II~II' of FIG. 8.

Regarding an embodiment of FIGS. 8 and 9, a point different from that of the above-described embodiment is described in order to avoid an overlapping description.

Referring to FIGS. 1A to 2C, 8, and 9, the display element part DPL including the light emitting element LD may be provided in the pixel area PXA in which one pixel PXL is provided (or prepared).

The display element part DPL may include the first conductive line CL1, the first insulating layer INS1, the light emitting element LD, the first layer FL, the interlayer insulating layer ILD, the second layer SL, the second insulating layer INS2, and the second conductive line CL2. The display element part DPL may further include a cover layer CVL provided and/or formed on the second conductive line CL2.

The cover layer CVL may be provided and/or formed on the second conductive line CL2 to overlap each of the light emitting elements LD. The cover layer CVL may function as a light guide member for guiding light emitted from each of the light emitting elements LD to be concentrated in a specific direction of the pixel area PXA. In an embodiment, the cover layer CVL may be formed of a conductive material (or substance) having a constant reflectance. The conductive material (or substance) may include an opaque metal advantageous for guiding the light emitted from the light emitting elements LD in a specific direction (for example, a desired direction) by reflecting or scattering the light. The opaque metal may include, for example, a metal such as Ag, Mg, Al, Pt, Pd, Au, Ni, Nd, Ir, Cr, Ti, or an alloy thereof. According to an embodiment, the cover layer CVL may include a transparent conductive material. The transparent conductive material may include a conductive oxide such as indium tin oxide (ITO), indium zinc oxide (IZO), zinc oxide (ZnO), indium tin zinc oxide (ITZO), a conductive polymer such as PEDOT, and the like within the spirit and the scope of the disclosure. In case that the cover layer CVL may include the transparent conductive material, a separate conductive layer formed of an opaque metal for guiding the light emitted from the light emitting elements LD in a specific direction (for example, a desired direction) may be additionally included. However, the material of the cover layer CVL is not limited to the above-described materials.

According to an embodiment, a grating may be formed on an inner or outer surface of the cover layer CVL to more efficiently generate a light path.

As described above, in case that the cover layer CVL is disposed in the pixel area PXA in which each pixel PXL is provided (or prepared), the light emitted from the light emitting elements LD may be intensively guided in a specific direction (for example, a desired direction). A direction of the light emitted from each pixel PXL may be substantially the same, and thus a light output deviation between each pixel PXL and the pixel PXL adjacent thereto may be reduced. Accordingly, the light emitting device may have a uniform light output distribution over the entire area.

FIG. 10 is a schematic plan view illustrating a display device according to an embodiment and schematically illustrating an example of a display device using the light emitting element shown in FIGS. 1A and 1B as a light emitting source.

In FIG. 10, for convenience, a structure of the display device is briefly shown based on a display area DA where an image is displayed. However, according to an embodiment, at least one driving circuit part (for example, a scan driver, a data driver, and the like) and/or signal lines, which are not shown, may be further disposed in the display device.

Referring to FIGS. 1A, 1B, and 10, the display device according to an embodiment may include the substrate SUB, pixels PXL provided on the substrate SUB, a driver for driving the pixels PXL, and a line part (not shown) connecting the pixels PXL and the driver.

The display device may be classified into a passive matrix type display device and an active matrix type display device according to a method of driving the light emitting element LD. For example, in case that the display device is implemented as an active matrix type, each of the pixels PXL may include a driving transistor that controls a current amount supplied to the light emitting element LD, a switching transistor that transmits a data signal to the driving transistor, and the like within the spirit and the scope of the disclosure.

The substrate SUB may include a transparent insulating material and may transmit light. The substrate SUB may be a rigid substrate or a flexible substrate.

For example, the rigid substrate may be one of a glass substrate, a quartz substrate, a glass ceramic substrate, and a crystalline glass substrate.

The flexible substrate may be one of a film substrate and a plastic substrate including a polymer organic material. For example, the flexible substrate may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

The material applied to the substrate SUB may have resistance (or heat resistance) to a high processing temperature during a manufacturing process of the display device.

The substrate SUB may include a display area DA including at least one pixel area in which each pixel PXL is disposed, and a non-display area NDA disposed around the display area DA. According to an embodiment, the display area DA may be disposed in a central area of the display device, and the non-display area NDA may be disposed in an edge area of the display device to surround or be adjacent to the display area DA. However, positions of the display area DA and the non-display area NDA are not limited thereto, and according to an embodiment, the positions of the display area DA and the non-display area NDA may be changed.

The display area DA may be an area in which the pixels PXL displaying an image are provided. The non-display area NDA may be an area in which the driver for driving the pixels PXL and a portion of the line part connecting the pixels PXL and the driver are provided.

The display area DA may have various shapes. For example, the display area DA may be provided in various shapes, such as a polygon of a closed shape including a side formed of a straight line, a circle, an ellipse, and the like including a side of a curve, a semicircle, a semi-ellipse, and the like including a side formed of a straight line and a curve.

The non-display area NDA may be provided at at least one side or a side of the display area DA. In an embodiment, the non-display area NDA may surround or may be adjacent to the display area DA.

Each of the pixels PXL may be provided in the display area DA on the substrate SUB. In an embodiment, the pixels PXL may be arranged (or disposed) in the display area DA in a stripe or PENTILE™ array structure, but the disclosure is not limited thereto.

Each of the pixels PXL may include at least one light emitting element LD driven by corresponding scan signal and data signal. The light emitting element LD may have a size as small as a micro scale or a nano scale and may be spaced apart with adjacent light emitting elements by a distance, but the disclosure is not limited thereto. The light emitting element LD may form a light source of each pixel PXL.

Each of the pixels PXL may be driven by a signal (for example, a scan signal and a data signal) and/or power (for example, first driving power and second driving power). However, a type of the light emitting element LD that may be used as the light source of each pixel PXL is not limited thereto.

In an embodiment, the color, type, number, and/or the like of the pixels PXL are/is not particularly limited, and for example, the color of light emitted from each pixel PXL may be variously changed.

The driver may provide a signal and power to each pixel PXL through the line part to control driving of the pixel PXL. In FIG. 10, the line part is omitted for convenience of description.

The driver may include a scan driver that provides a scan signal to the pixels PXL through a scan line, an emission driver that provides an emission control signal to the pixels PXL through an emission control line, a data driver that provides a data signal to the pixels PXL through a data line, and a timing controller. The timing controller may control the scan driver, the emission driver, and the data driver.

The above-described display device may include stretching parts to implement a stretchable display device. Hereinafter, the stretching parts are described with reference to FIGS. 11A and 11B.

Figure 11A:
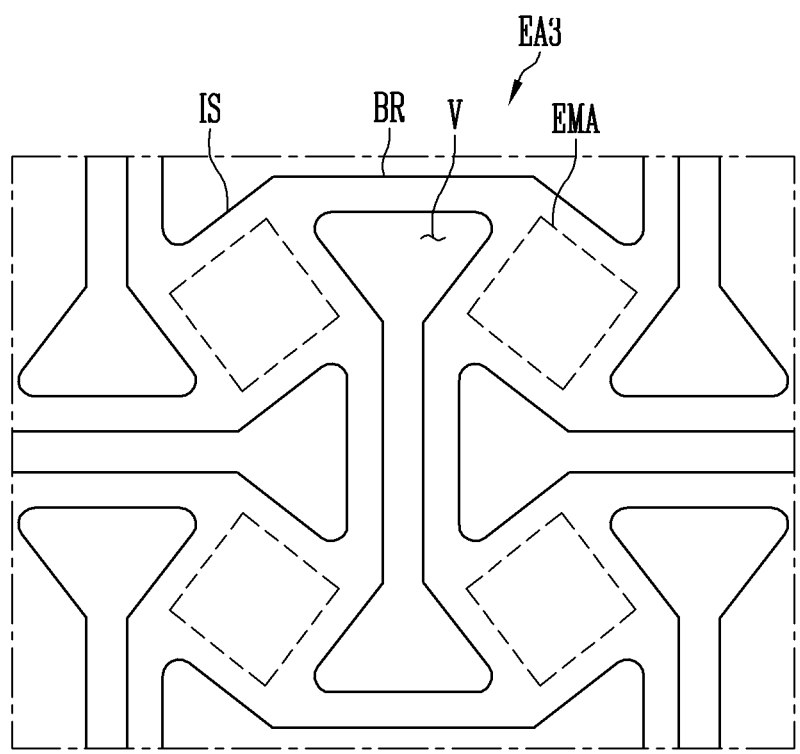
FIGS. 11A and 11B are enlarged schematic plan views of a portion EA3 of FIG. 10.
Figure 11B:
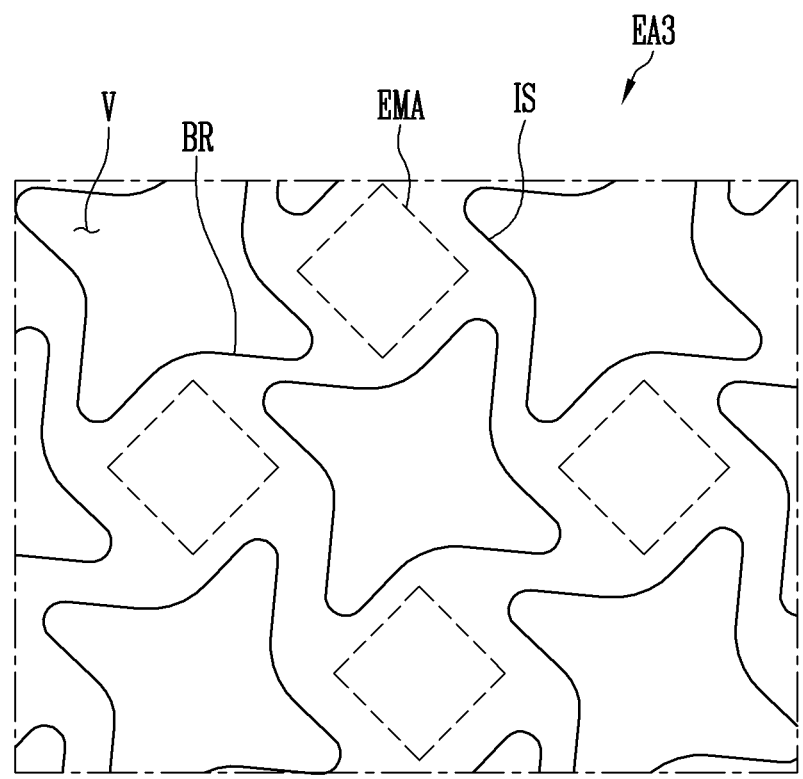

FIGS. 11A and 11B are enlarged schematic plan views of a portion EA3 of FIG. 10.

Referring to FIGS. 1A, 1B, 10, 11A, and 11B, the display device may include the substrate SUB provided with the pixels PXL.

In an embodiment, the substrate SUB may include islands IS of an island shape, and bridges BR for connecting islands IS neighboring in the first and second directions DR1 and DR2. The substrate SUB may include a cutout V formed by removing one area or an area of the substrate SUB. In an embodiment, the islands IS, the bridges BR, and the cutout V may form stretching parts STU of the display device. Each stretching part STU may correspond to a basic stretching part of a stretchable display device.

Each island IS may be a substrate SUB of an island shape, and may be spaced apart from an island IS adjacent (or neighboring) in the first direction DR1 with the cutout V interposed therebetween. Each island IS may be spaced apart from an island IS adjacent (or neighboring) in the second direction DR2 with the cutout V interposed therebetween. At least one pixel PXL including an emission area EMA from which red, blue, green, and/or white light is emitted may be positioned (or provided) on each island IS.

The bridge BR may be provided between the two islands IS spaced apart in the first direction DR1 and between the two islands IS spaced apart in the second direction DR2, respectively. The bridge BR may be one area or an area of the substrate SUB connecting two islands IS adjacent to each other. Lines for transferring power and/or a signal to the pixel PXL provided in each island IS may be provided on the bridge BR. Because of the lines provided on the bridge BR, the pixels PXL positioned on each island IS may be driven while receiving the power and/or the signal.

A shape and an area (or a size) of the cutout V may change for stretch of the display device. The cutout V may be positioned between two islands IS adjacent to each other in the first and second directions DR1 and DR2, between one island IS and the bridge BR, and between two bridges BR adjacent to each other in the first and second directions DR1 and DR2. The cutout V may be formed to pass through the substrate SUB. The cutout V may provide a separation area between the islands IS, reduce a weight of the substrate SUB, and improve flexibility of the substrate SUB. By changing the shape of the cutout V in case that bending, rolling, stretching, or the like of the substrate SUB occurs, stress generation during deformation of the substrate SUB may be effectively reduced, thereby preventing abnormal deformation of the substrate SUB and improving durability.

The cutout V may be formed by removing one area or an area of the substrate SUB in a method of etching or the like, but the disclosure is not limited thereto. According to an embodiment, the substrate SUB may be formed to include the cutout V in case that the substrate SUB is manufactured. As an embodiment, the cutout V may be formed by patterning the substrate SUB after forming the islands IS and the bridges BR. A method of forming the cutout V in the substrate SUB is not limited to the above-described embodiment, and the cutout V may be formed through various methods.

The display device may be stretched while the shape and the area (or the size) of the cutout V included in the substrate SUB is changed. In case that viewed in a plan view, the display device may be stretched in various directions, for example, the first direction DR1, the second direction DR2, an oblique direction of each of the first and second directions DR1 and DR2, a direction (for example, a left direction) opposite to the first direction DR1, a direction (for example, an upward direction) opposite to the second direction DR2, and the like within the spirit and the scope of the disclosure. In case that the display device is stretched, the shape and/or the area (or the size) of each island IS may hardly change, and only a position thereof may change. Therefore, in case that the display device is stretched, the pixels PXL positioned on each of the islands IS may be maintained without damage. However, in case that the display device is stretched, a shape and/or an area (or a size) of the bridges BR connecting the two adjacent islands IS may be deformed.

In FIGS. 11A and 11B, each island IS is similar to a quadrangle shape, but the disclosure is not limited thereto, and the shape of the island IS may be variously modified. The shape of each bridge BR connecting the two adjacent islands IS is not limited to that shown in FIGS. 11A and 11B and may be variously modified.

Figure 12A:
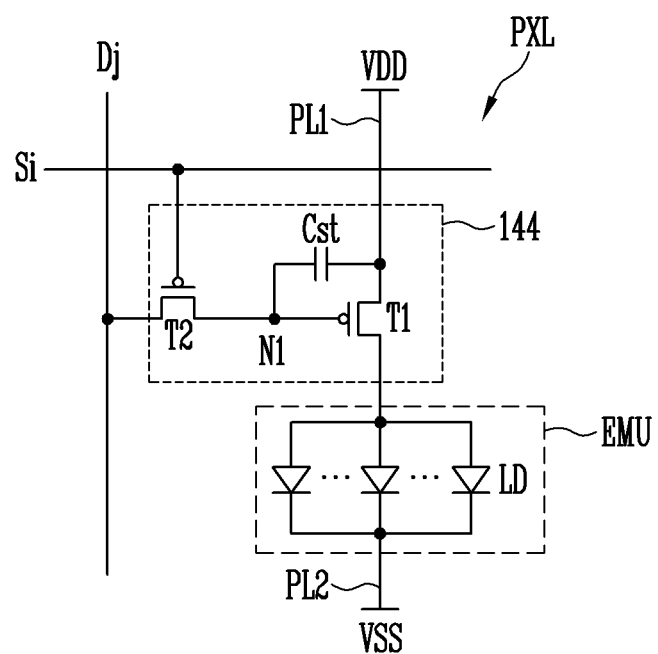
FIGS. 12A and 12B are schematic circuit diagrams illustrating an electrical connection relationship between components included in one pixel shown in FIG. 10 according to an embodiment.
Figure 12B:
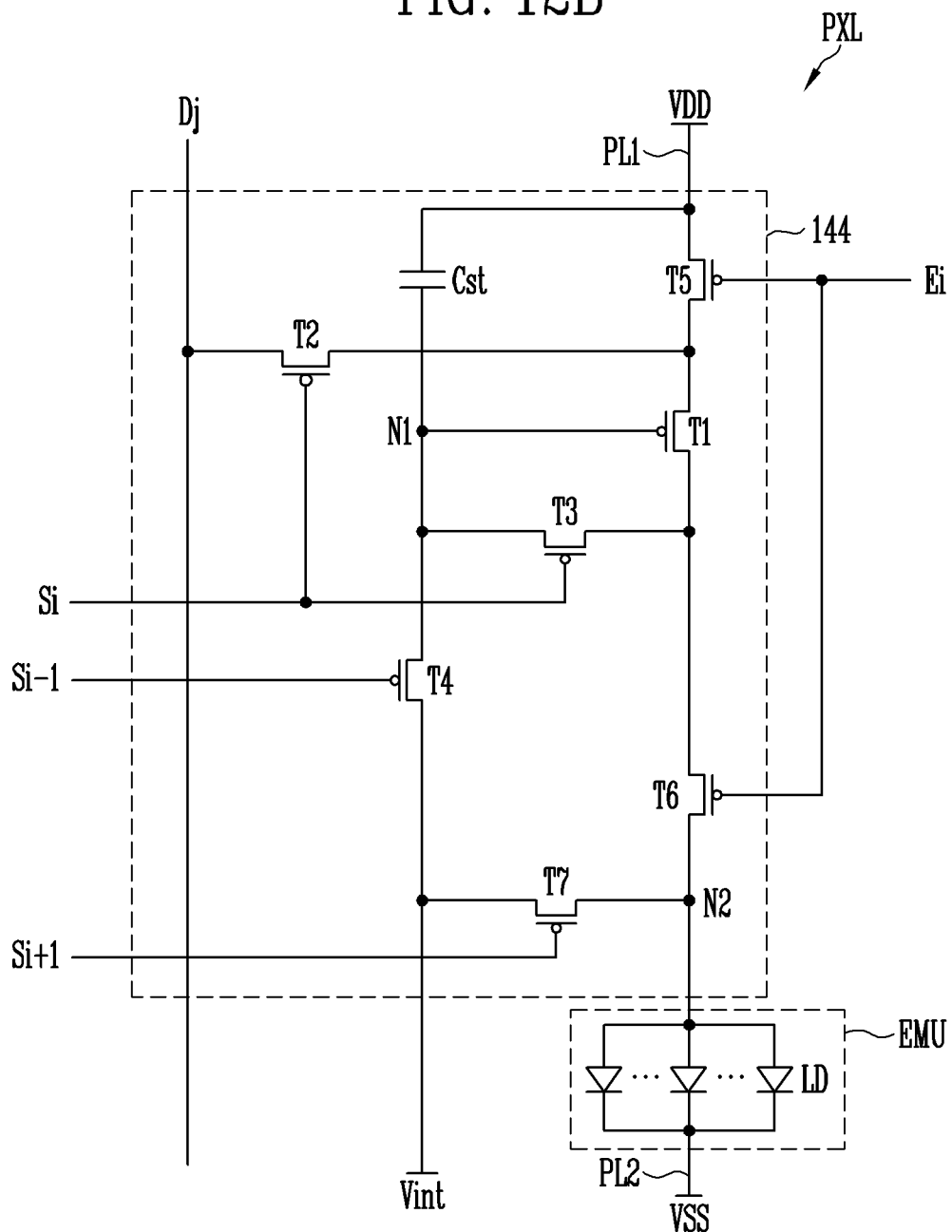

FIGS. 12A and 12B are schematic circuit diagrams illustrating an electrical connection relationship between components included in one pixel shown in FIG. 10 according to an embodiment.

For example, FIGS. 12A and 12B show the electrical connection relationship between the components included in the pixel PXL that may be applied to the active type display device, according to different embodiments. However, types of the components included in the pixel PXL to which an embodiment may be applied are not limited thereto.

In FIGS. 12A and 12B, not only the components included in each of the pixels shown in FIG. 10 but also an area where the components are provided are referred to as the pixel PXL. According to an embodiment, each pixel PXL shown in FIGS. 12A and 12B may be any one of the pixels PXL included in the display device of FIG. 10, and the pixels PXL may have substantially the same or similar structure.

Referring to FIGS. 1A, 1B, 10, 12A, and 12B, one pixel PXL (hereinafter referred to as a 'pixel') may include an emission unit EMU that emits light. The pixel PXL may selectively further include a pixel circuit 144 for driving the emission unit EMU and improving light output efficiency of light emitted from the emission unit EMU.

According to an embodiment, the emission unit EMU may include light emitting elements LD disposed between the first power line PL1 to which the first driving power VDD is applied and the second power line PL2 to which the second driving power VSS is applied. The one end (for example, the second semiconductor layer 13) of the both ends of each of the light emitting elements LD may be connected to the first driving power VDD through the first layer FL, and the other end (for example, the first semiconductor layer 11) of the both ends of each of the light emitting elements LD may be connected to the second driving power VSS through the second layer SL.

The first driving power VDD and the second driving power VSS may have different potentials. For example, the first driving power VDD may be set as high potential power, and the second driving power VSS may be set as low potential power. At this time, a potential difference between the first driving power VDD and the second driving power VSS may be set as a threshold voltage or more of the light emitting elements LD during an emission period of the pixel PXL.

As described above, the respective the light emitting elements LD disposed between the first power line PL1 and the second power line PL2 to which signals (or voltages) of different potentials are respectively supplied may form respective effective light sources. Such effective light sources may be gathered to form the emission unit EMU of the pixel PXL.

The light emitting elements LD of the emission unit EMU may emit light with a luminance corresponding to a driving current supplied through the corresponding pixel circuit 144. For example, the pixel circuit 144 may supply a driving current corresponding to a grayscale value of corresponding frame data to the emission unit EMU during each frame period. The driving current supplied to the emission unit EMU may be divided and flow to the light emitting elements LD. Therefore, each of the light emitting elements LD may emit light with a luminance corresponding to the current flowing through the light emitting element LD, and thus the emission unit EMU may emit light of the luminance corresponding to the driving current.

The pixel circuit 144 may be connected to a scan line Si and a data line Dj of a corresponding pixel PXL. For example, in case that the pixel PXL is disposed in an i-th (i is a natural number) row and a j-th (j is a natural number) column of the display area DA, the pixel circuit 144 of the pixel PXL may be connected to the i-th scan line Si and the j-th data line Dj of the display area DA. According to an embodiment, the pixel circuit 144 may include first and second transistors T1 and T2 and a storage capacitor Cst as shown in FIG. 12A. However, a structure of the pixel circuit 144 is not limited to the embodiment shown in FIG. 12A.

Referring to FIG. 12A, the pixel circuit 144 may include the first and second transistors T1 and T2 and the storage capacitor Cst.

A first terminal of the second transistor T2 (switching transistor) may be connected to the data line Dj, and a second terminal may be connected to a first node N1. Here, the first terminal and the second terminal of the second transistor T2 may be different terminals, and for example, in case that the first terminal is a source electrode, the second terminal may be a drain electrode. A gate electrode of the second transistor T2 may be connected to the scan line Si.

The second transistor T2 may be turned on in case that a scan signal of a voltage (for example, a low voltage) at which the second transistor T2 may be turned on from the scan line Si is supplied, to electrically connect the data line Dj and the first node N1 to each other. At this time, a data signal of a corresponding frame is supplied to the data line Dj, and thus the data signal is transferred to the first node N1. The data signal transferred to the first node N1 is charged in the storage capacitor Cst.

A first terminal of the first transistor T1 (driving transistor) may be connected to the first driving power VDD, and a second terminal thereof may be electrically connected to the first electrode of each of the light emitting elements LD. A gate electrode of the first transistor T1 may be connected to the first node N1. The first transistor T1 controls an amount of the driving current supplied to the light emitting elements LD in response to a voltage of the first node N1.

One electrode of the storage capacitor Cst may be connected to the first driving power VDD, and another electrode thereof may be connected to the first node N1. The storage capacitor Cst charges a voltage corresponding to the data signal supplied to the first node N1 and maintains the charged voltage until the data signal of a next frame is supplied.

FIG. 12A shows the pixel circuit 144 including the second transistor T2 for transferring the data signal into the pixel PXL, the storage capacitor Cst for storing the data signal, and the first transistor T1 for supplying the driving current corresponding to the data signal to the light emitting elements LD.

However, the disclosure is not limited thereto, and the structure of the pixel circuit 144 may be variously modified and implemented. For example, the pixel circuit 144 may further include other circuit elements such as at least one transistor element such as a transistor element for compensating for a threshold voltage of the first transistor T1, a transistor element for initializing the first node N1, and/or a transistor element for controlling a light emission time of the light emitting element LD, or a boosting capacitor for boosting the voltage of the first node N1.

In FIG. 12A, the transistors included in the pixel circuit 144, for example, the first and second transistors T1 and T2 are P-type transistors, but the disclosure is not limited thereto. For example, at least one of the first and second transistors T1 and T2 included in the pixel circuit 144 may be changed to an N-type transistor.

As shown in FIG. 12B, the pixel circuit 144 may be connected to the scan line Si and the data line Dj of the pixel PXL. For example, in case that the pixel PXL is disposed in an i-th row and a j-th column of the display area DA, the pixel circuit 144 of the corresponding pixel PXL may be connected to the i-th scan line Si and the j-th data line Dj of the display area DA.

According to an embodiment, the pixel circuit 144 may be further connected to at least another scan line. For example, the pixel PXL disposed in the i-th row of the display area DA may be further connected to an (i−1)-th scan line Si-1 and/or an (i+1)-th scan line Si+1. According to an embodiment, the pixel circuit 144 may be further connected to third power in addition to the first driving power VDD and the second driving power VSS. For example, the pixel circuit 144 may also be connected to initialization power Vint.

The pixel circuit 144 may include first to seventh transistors T1 to T7 and a storage capacitor Cst.

One electrode, for example, a source electrode of the first transistor T1 (driving transistor) may be connected to the first driving power VDD via the fifth transistor T5, and another electrode thereof, for example, a drain electrode may be connected to one side end or a side end of the light emitting elements LD via the sixth transistor T6. A gate electrode of the first transistor T1 may be connected to a first node N1. The first transistor T1 controls the driving current flowing between the first driving power VDD and the second driving power VSS via the light emitting elements LD in response to a voltage of the first node N1.

The second transistor T2 (switching transistor) may be connected between the j-th data line Dj connected to the pixel PXL and the source electrode of the first transistor T1. A gate electrode of the second transistor T2 may be connected to the i-th scan line Si connected to the pixel PXL. The second transistor T2 may be turned on in case that a scan signal of a gate-on voltage (for example, a low voltage) is supplied from the i-th scan line Si, to electrically connect the j-th data line Dj to the source electrode of the first transistor T1. Therefore, in case that the second transistor T2 is turned on, the data signal supplied from the j-th data line Dj is transferred to the first transistor T1.

The third transistor T3 may be connected between the drain electrode of the first transistor T1 and the first node N1. A gate electrode of the third transistor T3 may be connected to the i-th scan line Si. The third transistor T3 may be turned on in case that the scan signal of the gate-on voltage is supplied from the i-th scan line Si, to electrically connect the drain electrode of the first transistor T1 and the first node N1 to each other.

The fourth transistor T4 may be connected between the first node N1 and an initialization power line to which the initialization power Vint is applied. A gate electrode of the fourth transistor T4 may be connected to a previous scan line, for example, the (i−1)-th scan line Si-1. The fourth transistor T4 may be turned on in case that the scan signal of the gate-on voltage is supplied to the (i−1)-th scan line Si-1, to transmit a voltage of the initialization power Vint to the first node N1. Here, the initialization power Vint may have a voltage equal to or less than the lowest voltage of the data signal.

The fifth transistor T5 may be connected between the first driving power VDD and the first transistor T1. A gate electrode of the fifth transistor T5 may be connected to a corresponding emission control line, for example, an i-th emission control line Ei. The fifth transistor T5 may be turned off in case that an emission control signal of a gate-off voltage is supplied to the i-th emission control line Ei, and may be turned on in other cases.

The sixth transistor T6 may be connected between the first transistor T1 and the one end or an end of the light emitting elements LD which connects to a second node N2. A gate electrode of the sixth transistor T6 may be connected to the i-th emission control line Ei. The sixth transistor T6 may be turned off in case that the emission control signal of the gate-off voltage is supplied to the i-th emission control line Ei, and may be turned on in other cases.

The seventh transistor T7 may be connected between the one end or an end of the light emitting elements LD and the initialization power line to which the initialization power Vint is applied. A gate electrode of the seventh transistor T7 may be connected to any one of next scan lines, for example, the (i+1)-th scan line Si+1. The seventh transistor T7 may be turned on in case that the scan signal of the gate-on voltage is supplied to the (i+1)-th scan line Si+1, to supply the voltage of the initialization power Vint to the one end or an end of the light emitting elements LD.

The storage capacitor Cst may be connected between the first driving power VDD and the first node N1. The storage capacitor Cst may store a data signal supplied to the first node N1 and a voltage corresponding to the threshold voltage of the first transistor T1 during each frame period. At least FIG. 12B includes a second node N2 disposed between the sixth transistor T6 and the seventh transistor T7.

A structure of the pixel PXL applicable to the disclosure is not limited to the embodiments shown in FIGS. 12A and 12B, and the corresponding pixel PXL may have various structures.

Figure 13:
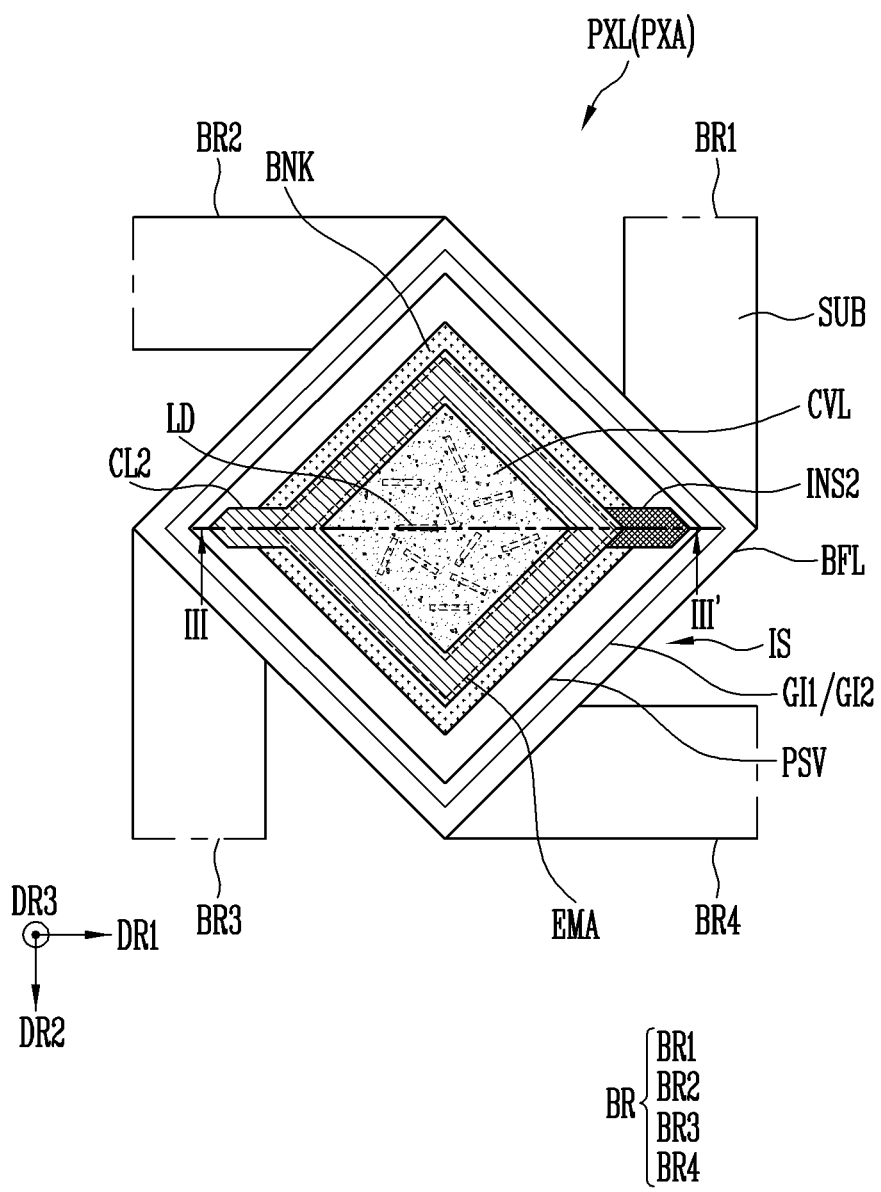
FIG. 13 is a schematic plan view schematically illustrating one pixel among pixels shown in FIG. 10.
Figure 14:
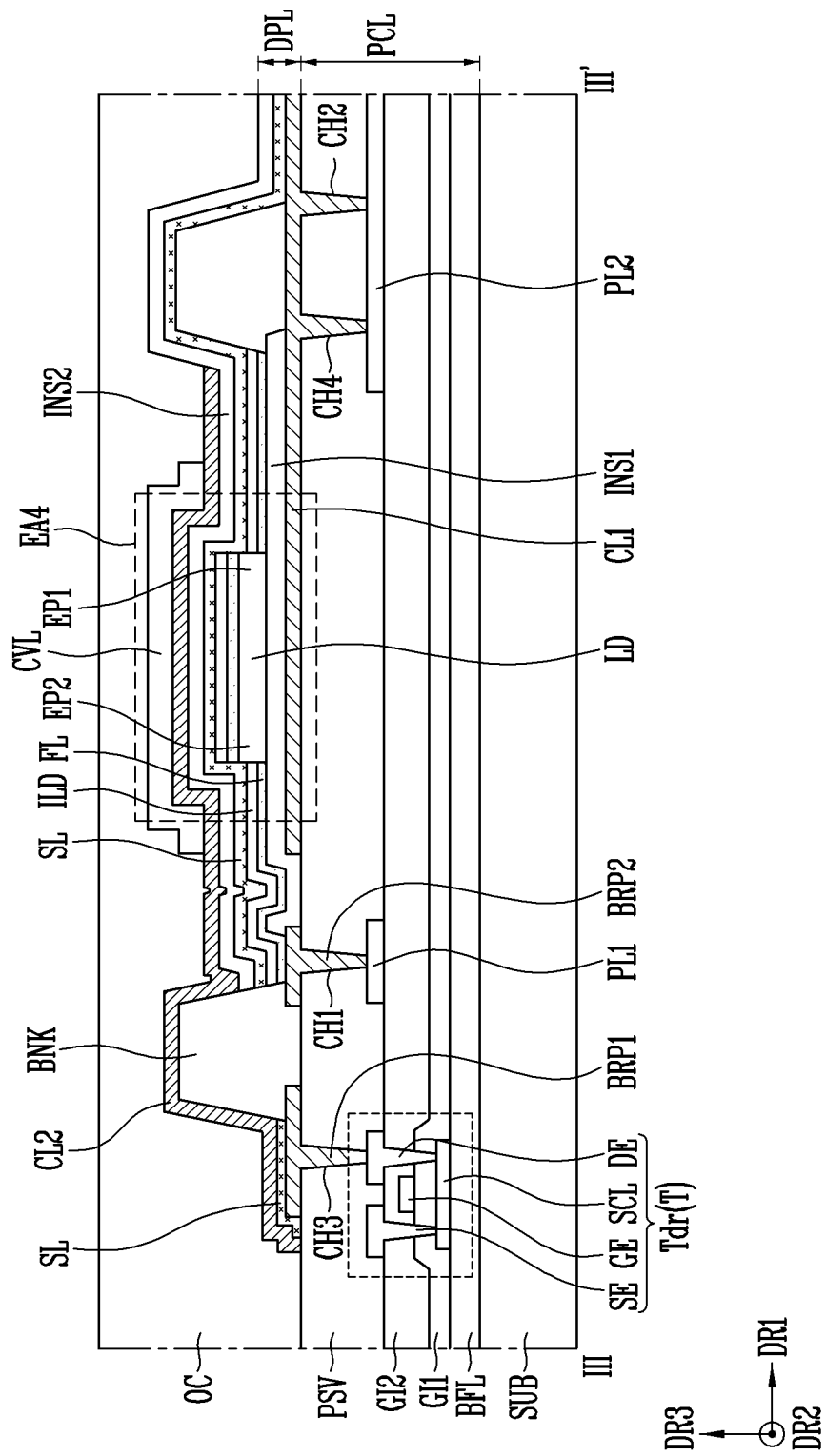
FIG. 14 is a schematic cross-sectional view taken along line III~III' of FIG. 13.
Figure 15:
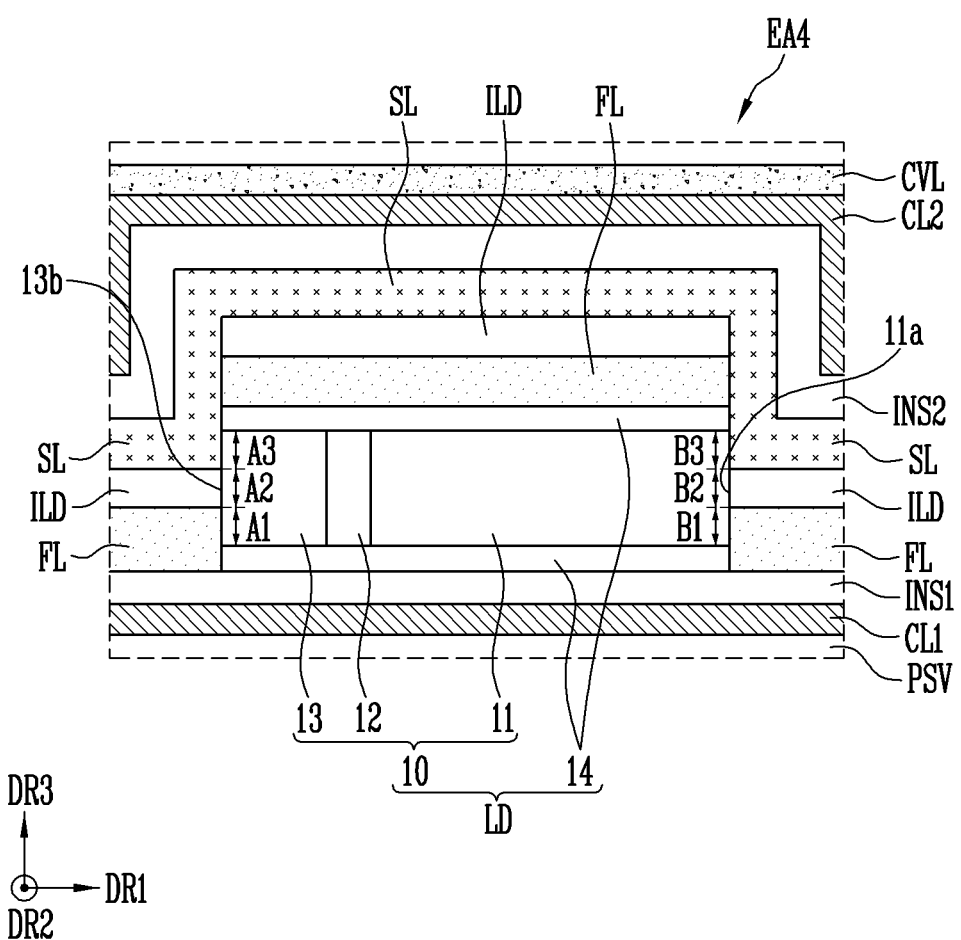
FIG. 15 is an enlarged schematic plan view of a portion EA4 of FIG. 14.
Figure 16:
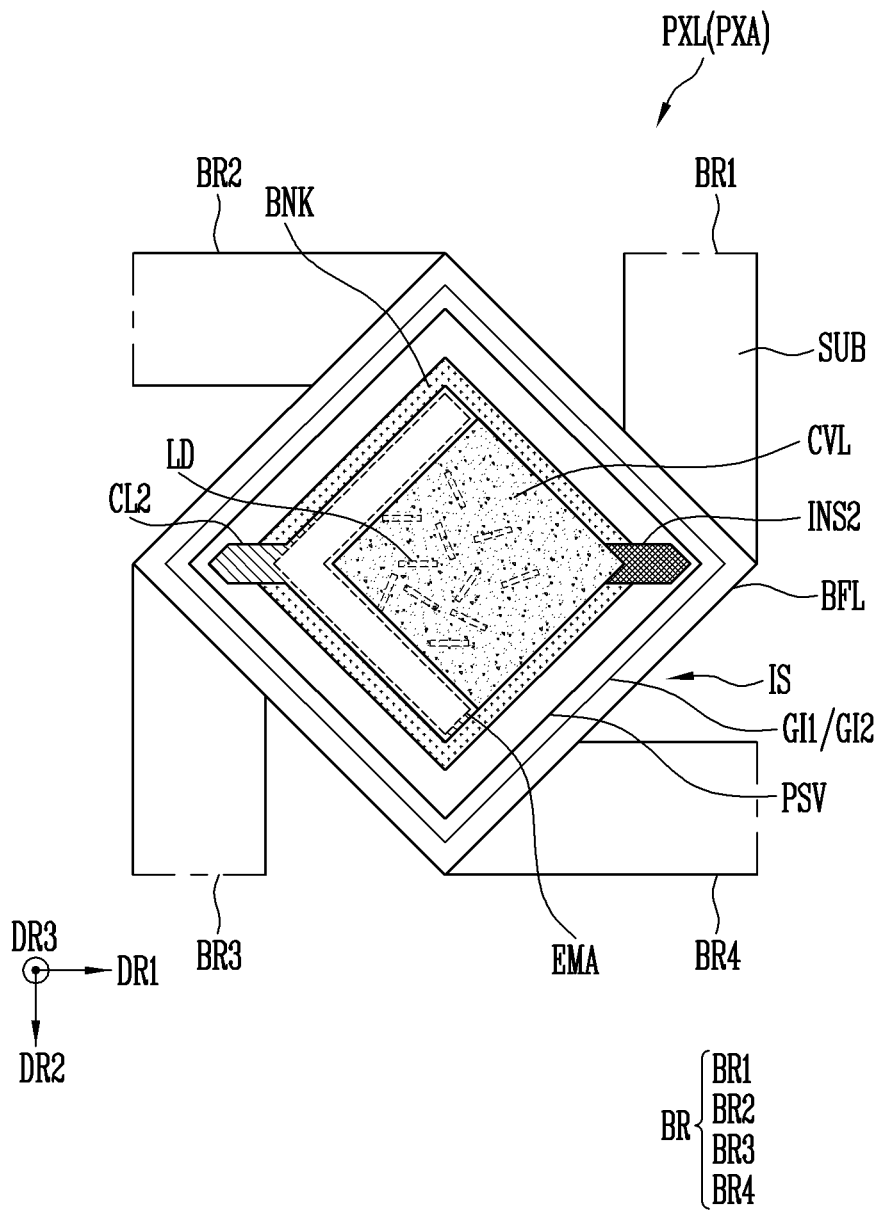
FIG. 16 is a schematic plan view implementing a cover layer shown in FIG. 13 according to an embodiment.
Figure 17A:
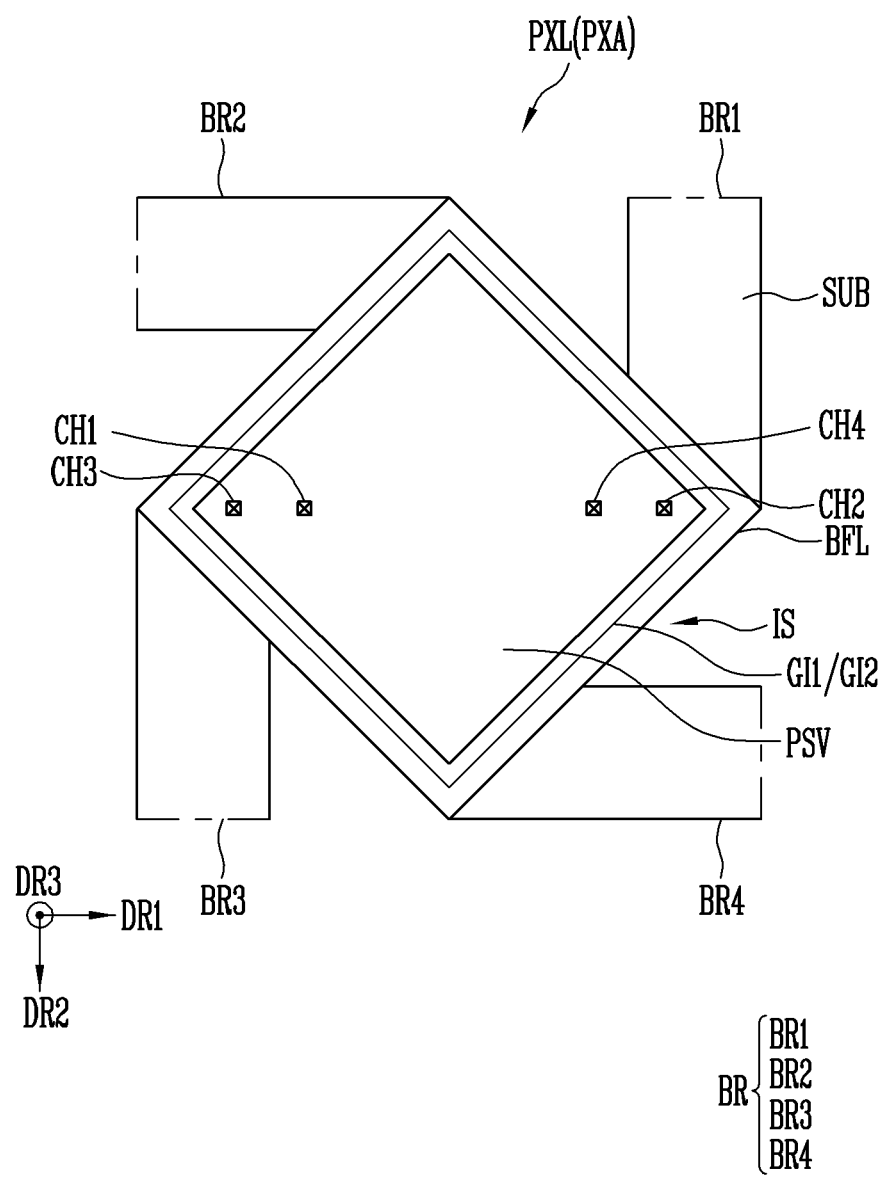
FIGS. 17A to 17K are schematic plan views sequentially illustrating a method of manufacturing one pixel shown in FIG. 13.
Figure 17B:
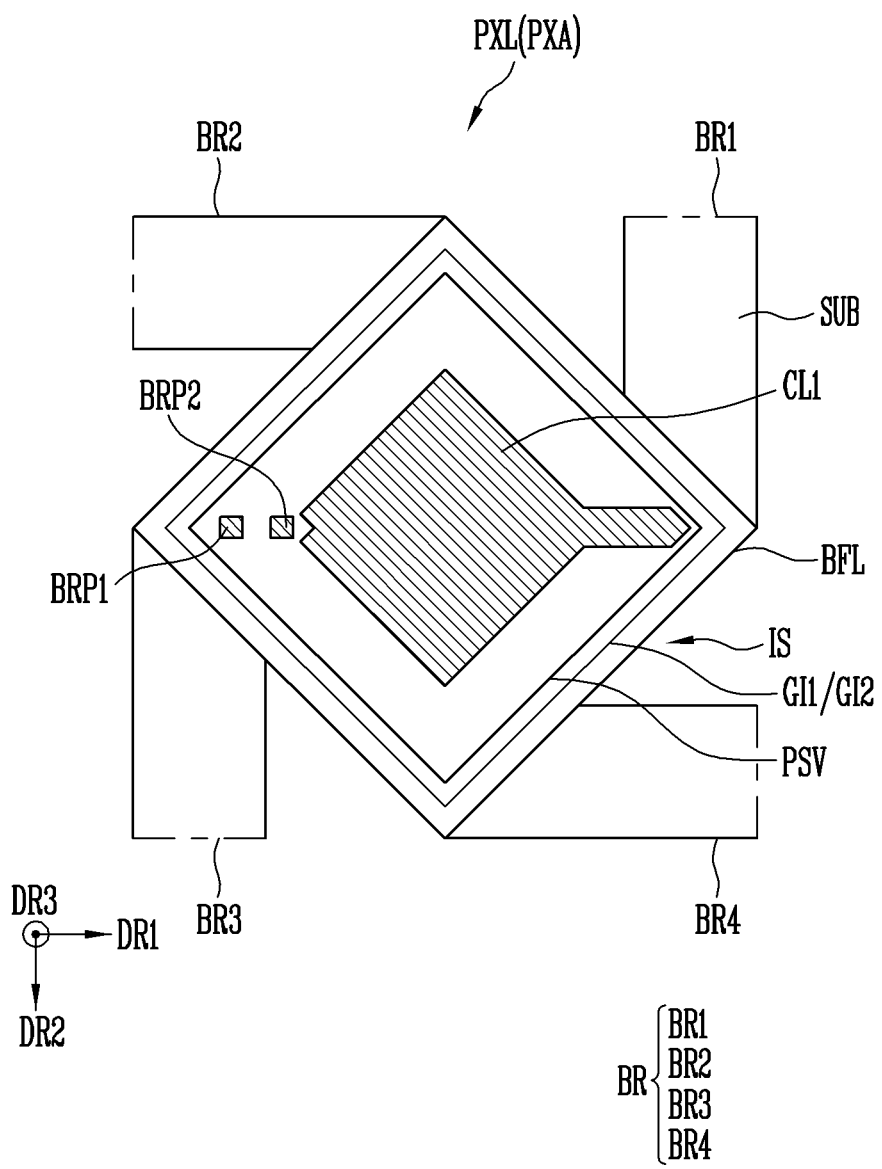
Figure 17C:
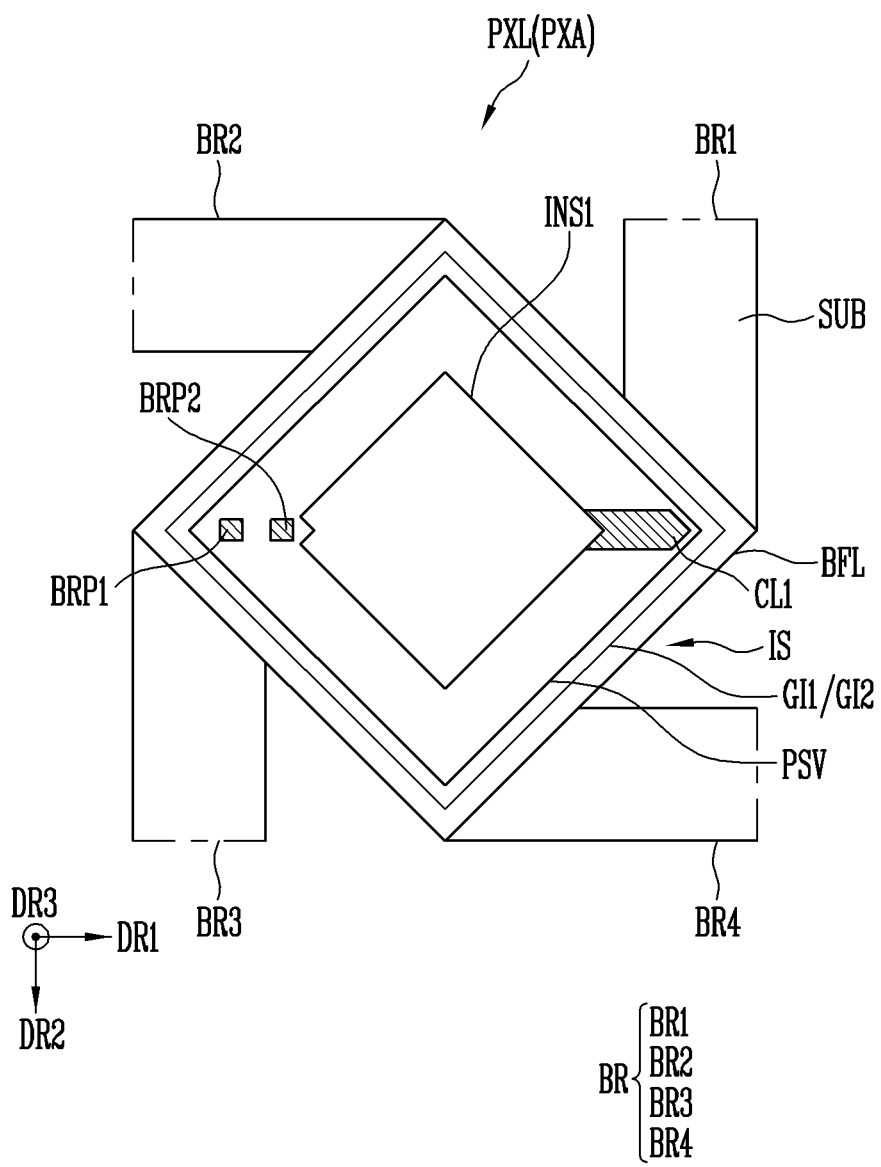
Figure 17D:
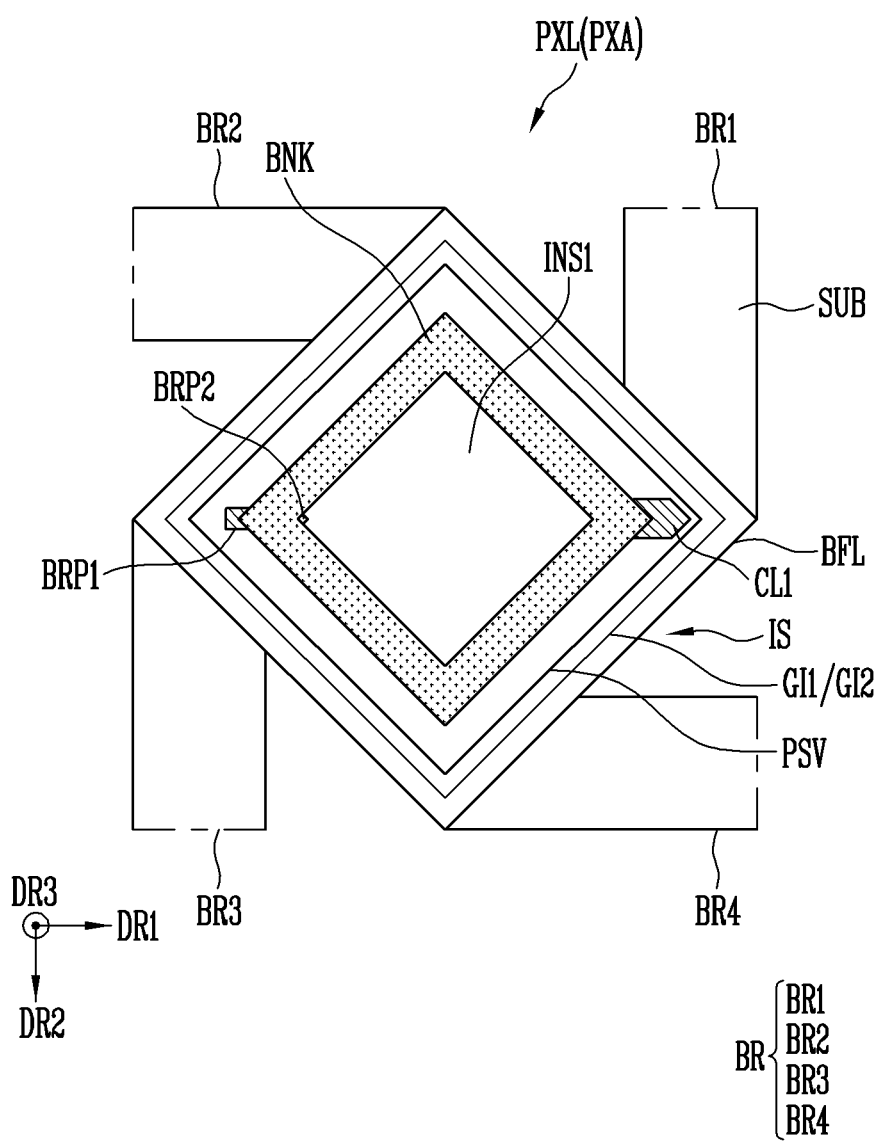
Figure 17E:
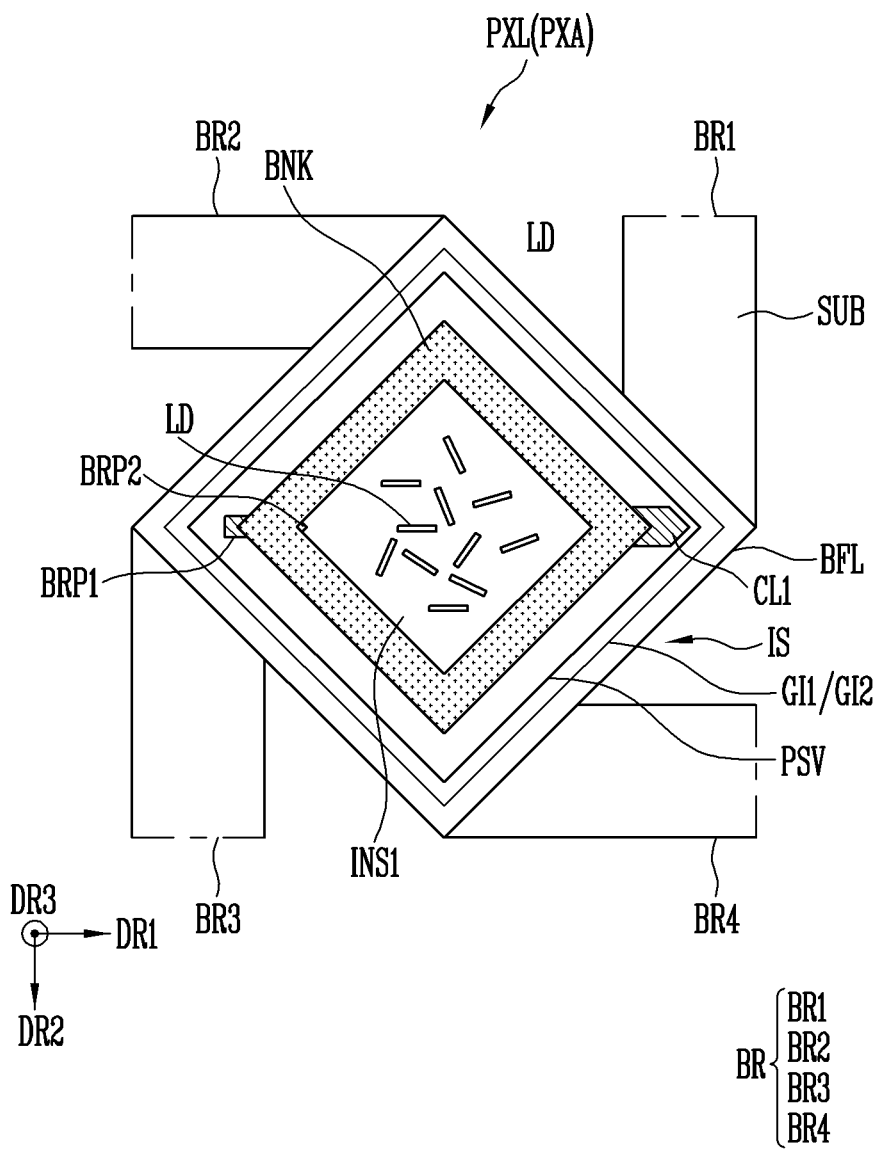
Figure 17F:
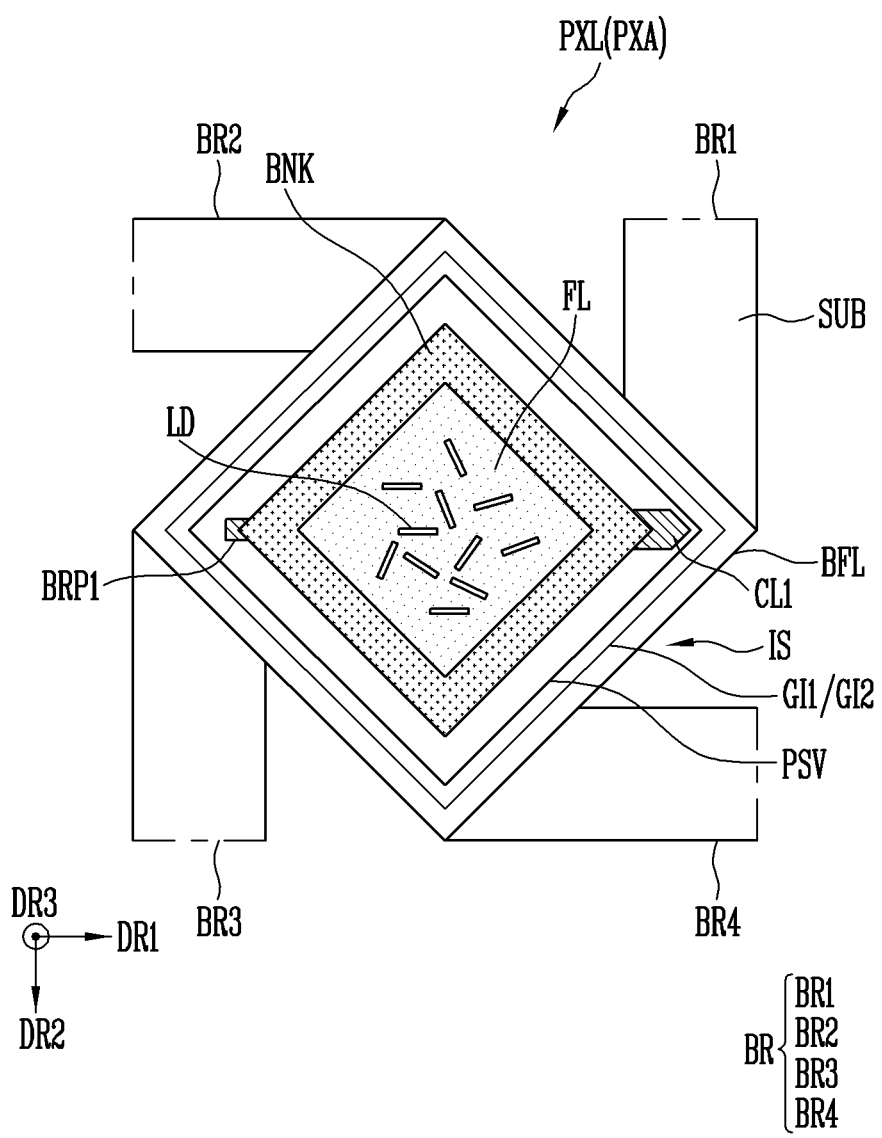
Figure 17G:
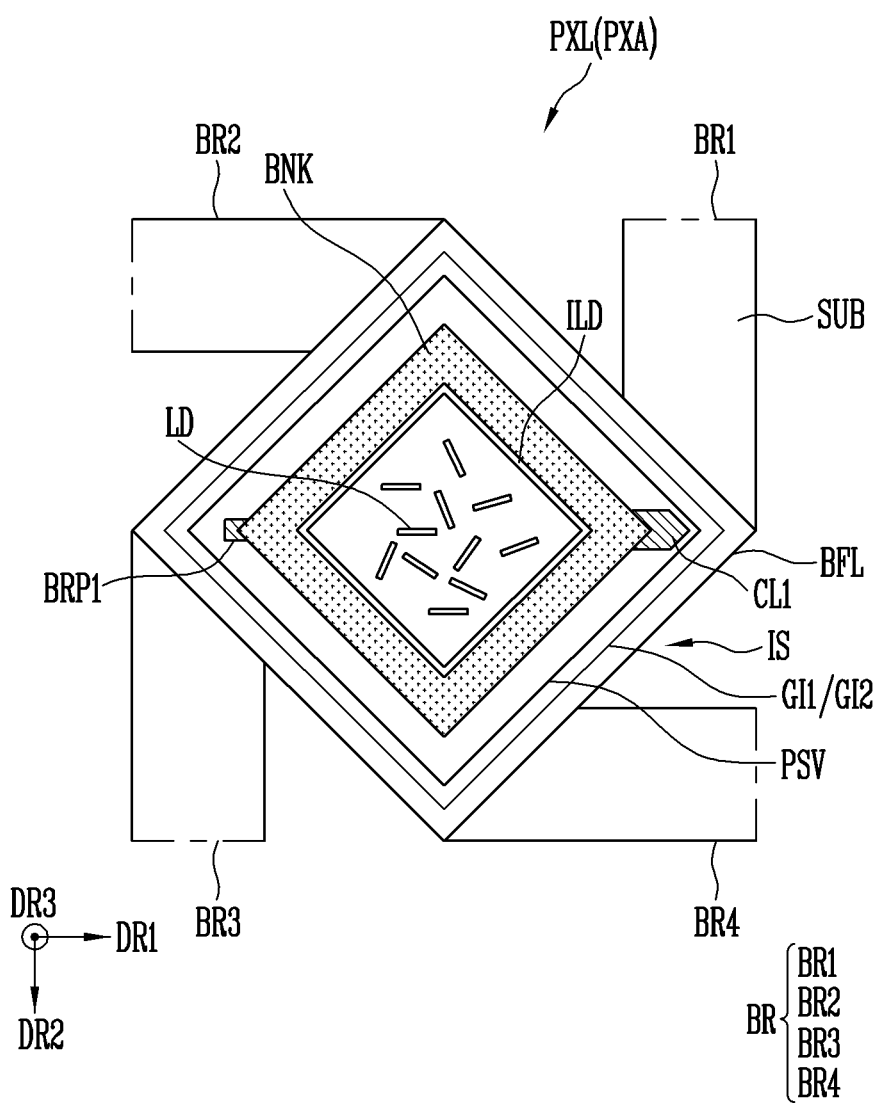
Figure 17H:
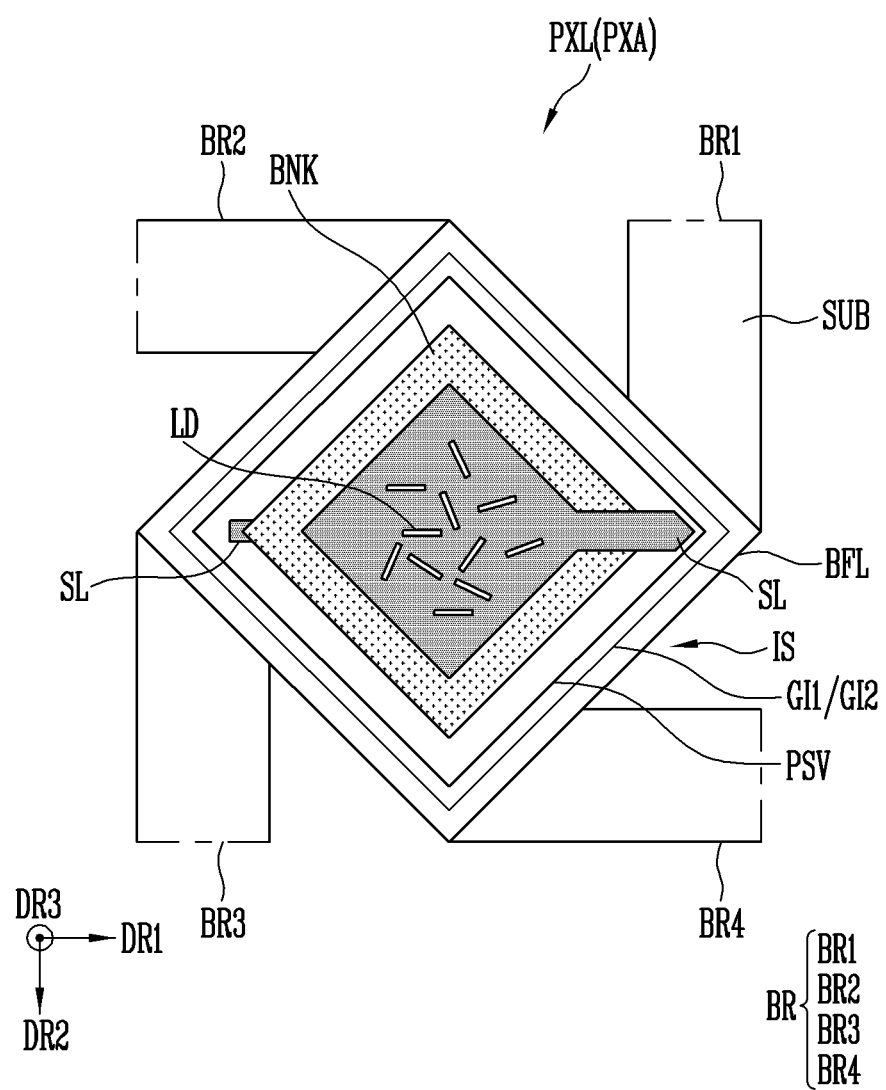
Figure 17I:
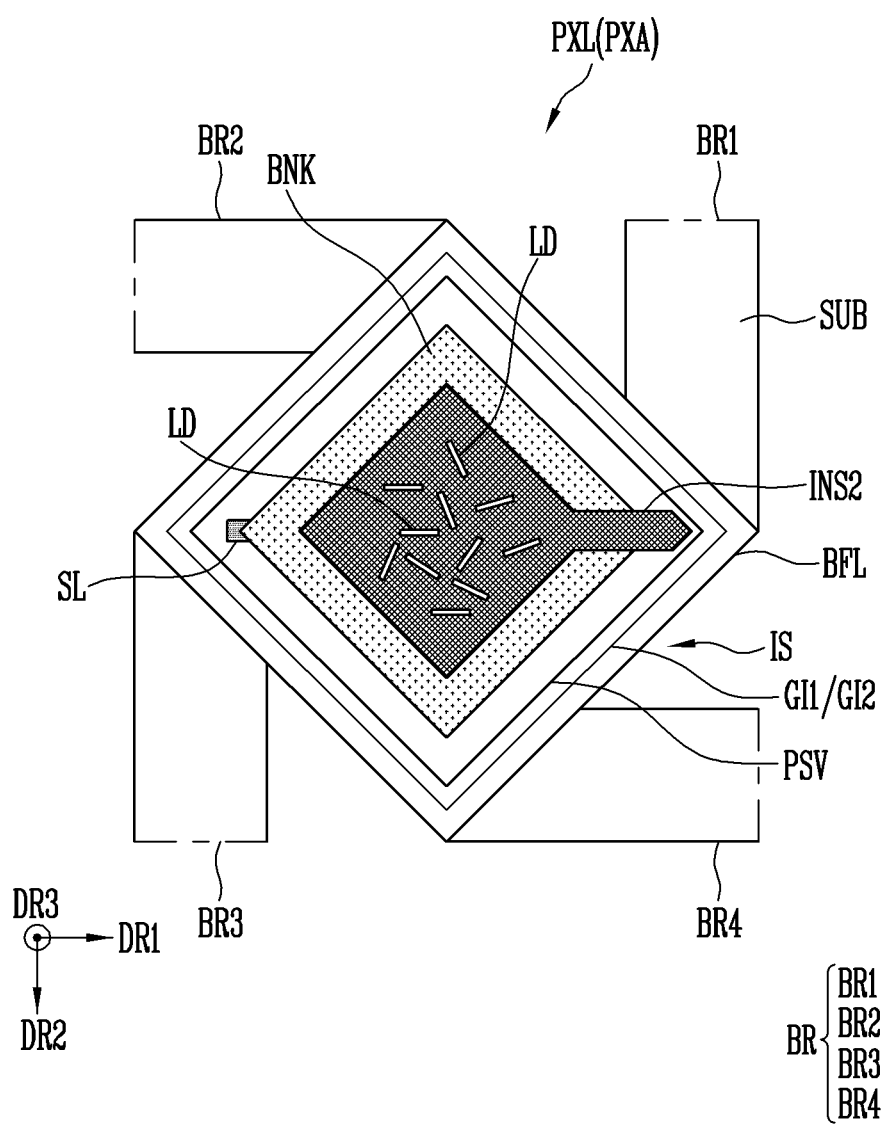
Figure 17J:
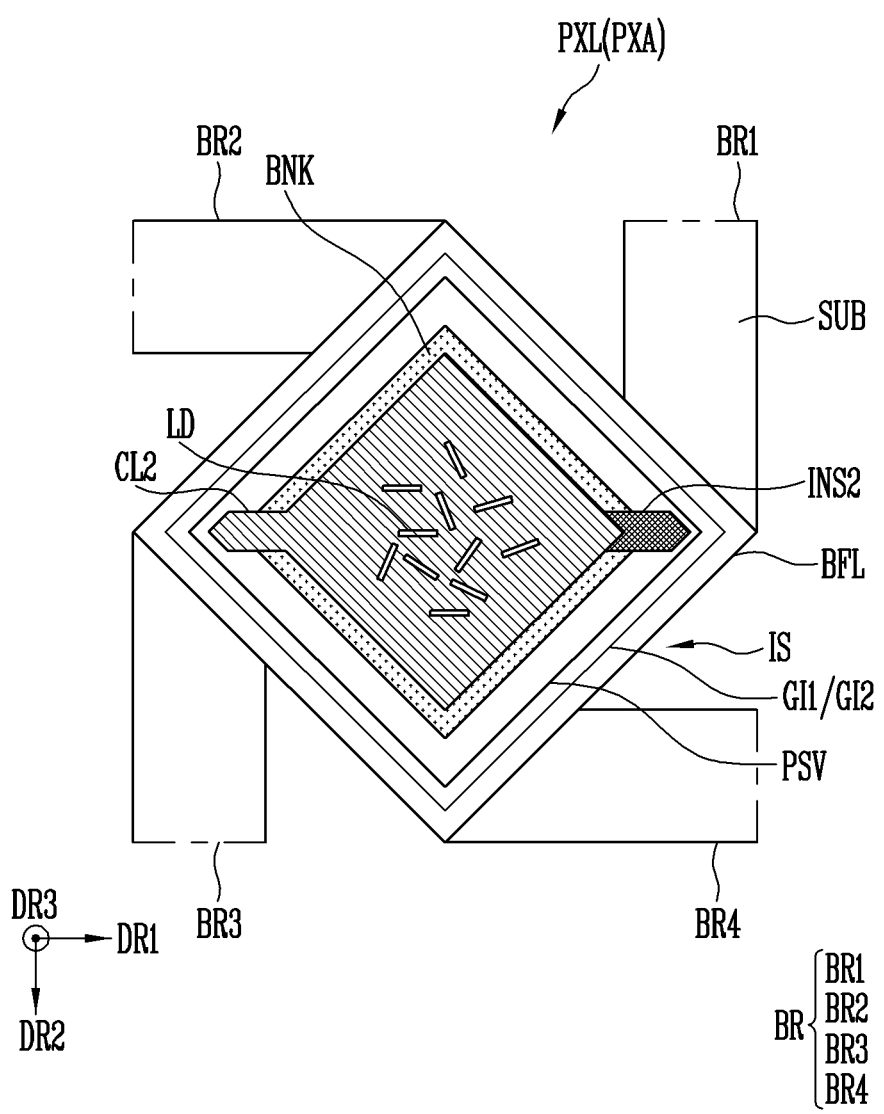
Figure 17K:
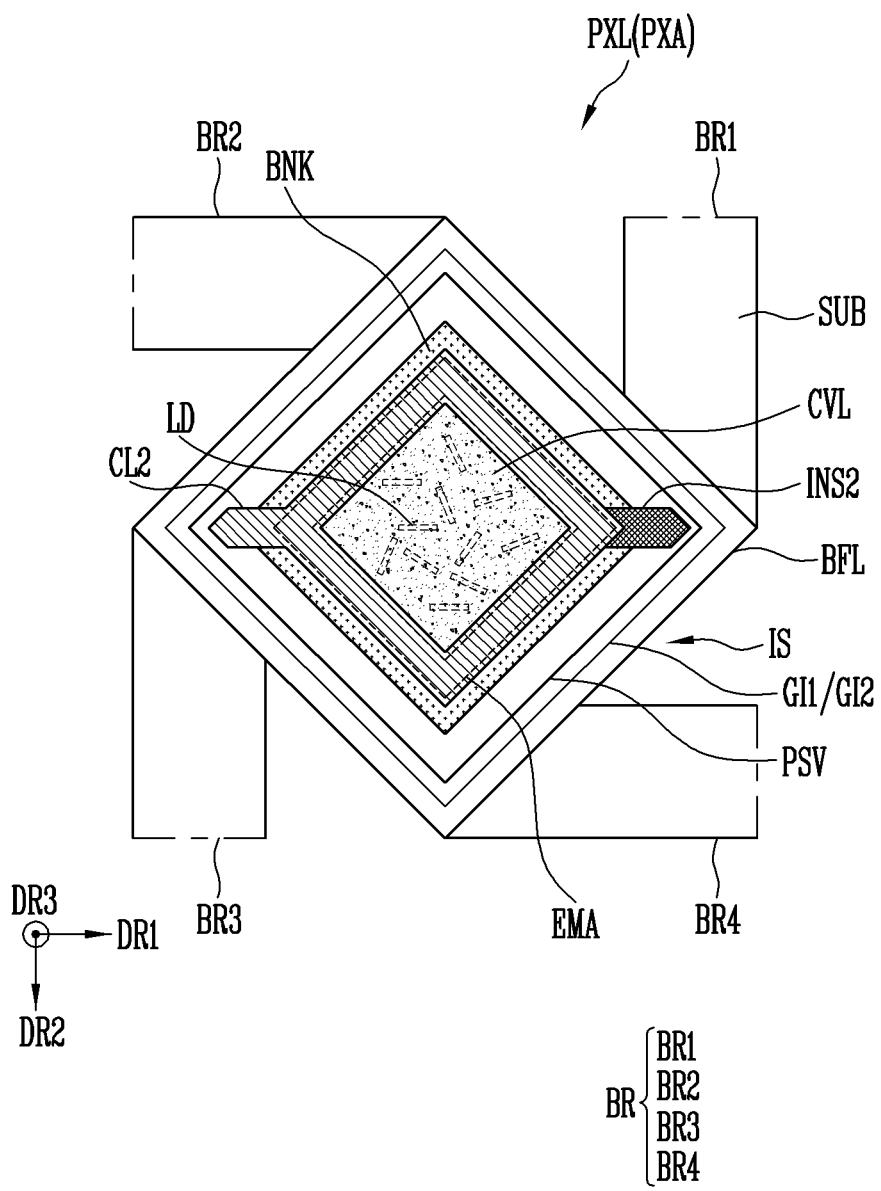
Figure 18A:
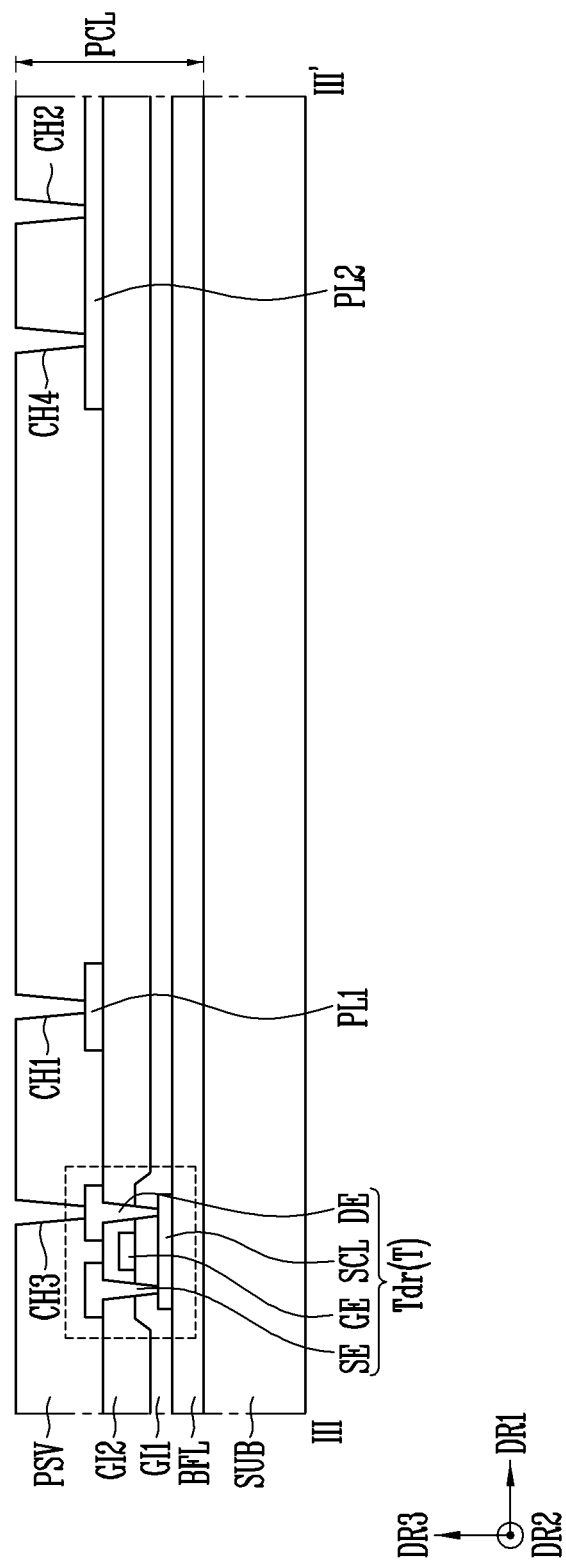
FIGS. 18A to 18K are schematic cross-sectional views sequentially illustrating a method of manufacturing one pixel shown in FIG. 14.
Figure 18B:
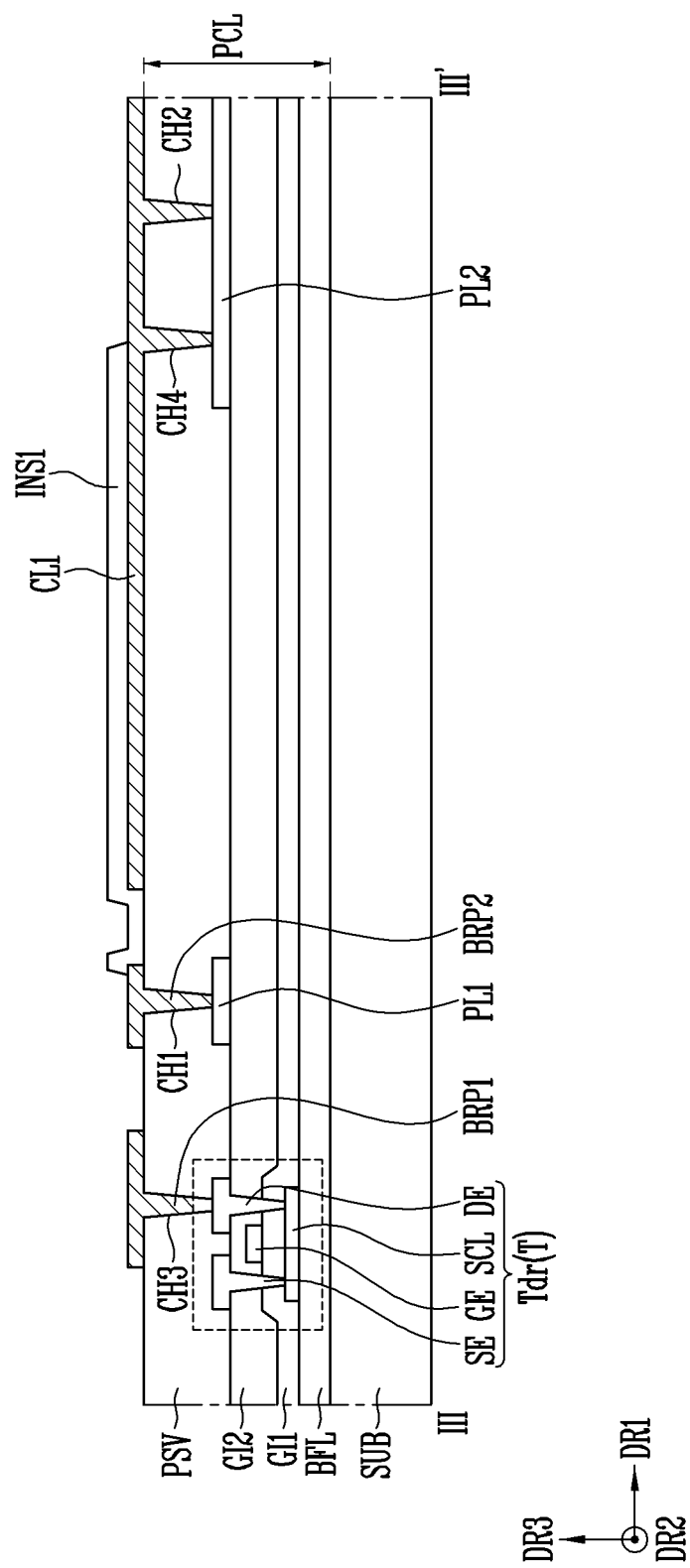
Figure 18C:
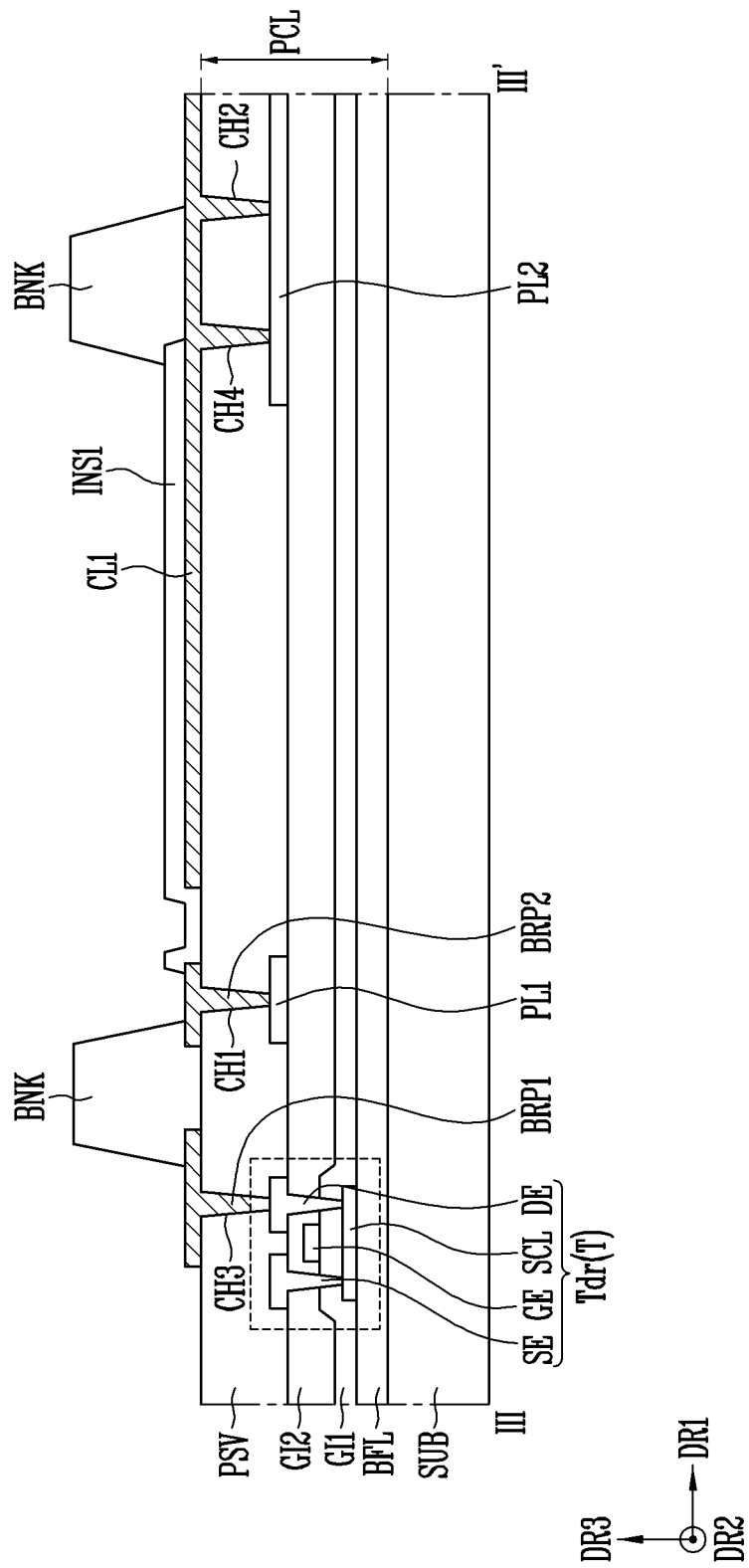
Figure 18D:
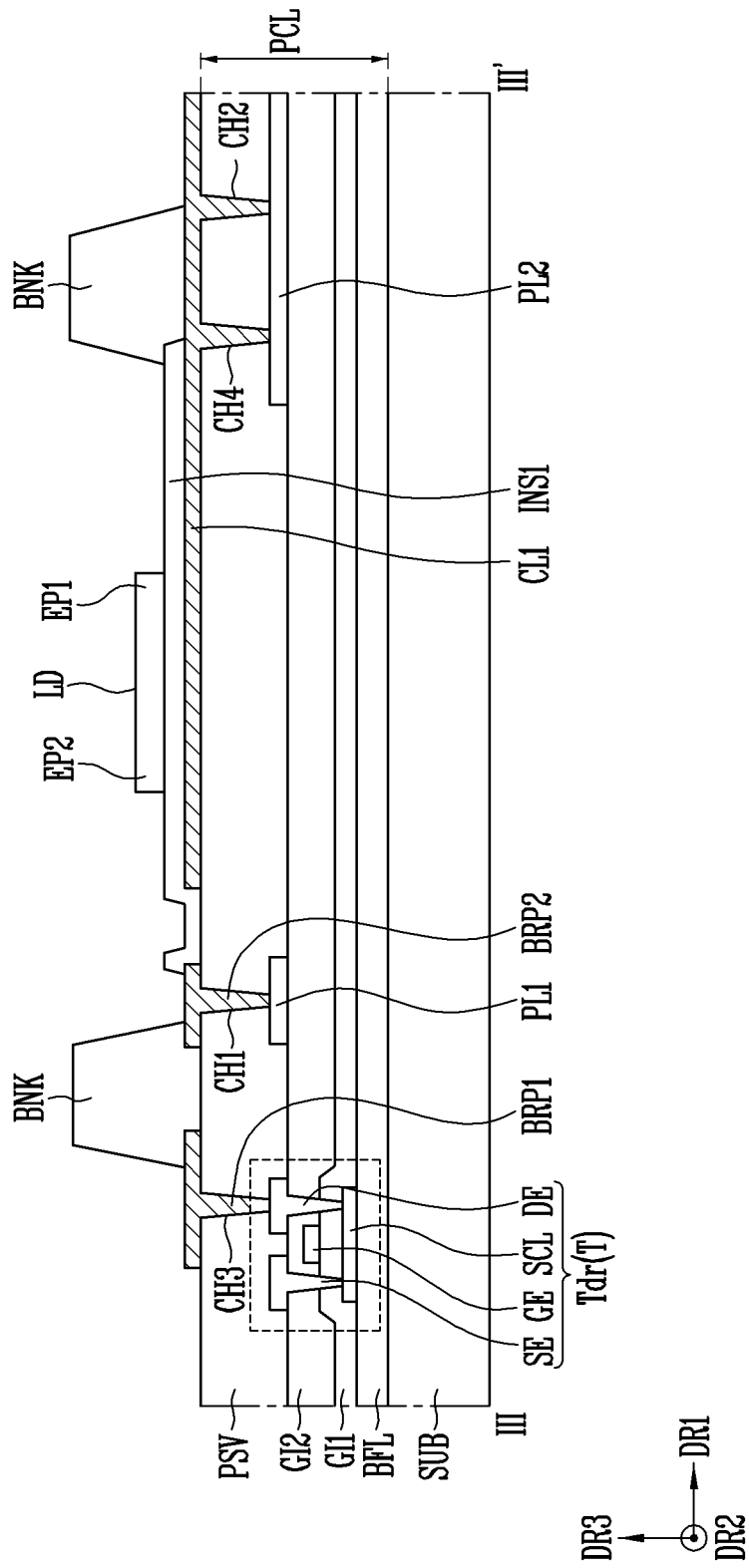
Figure 18E:
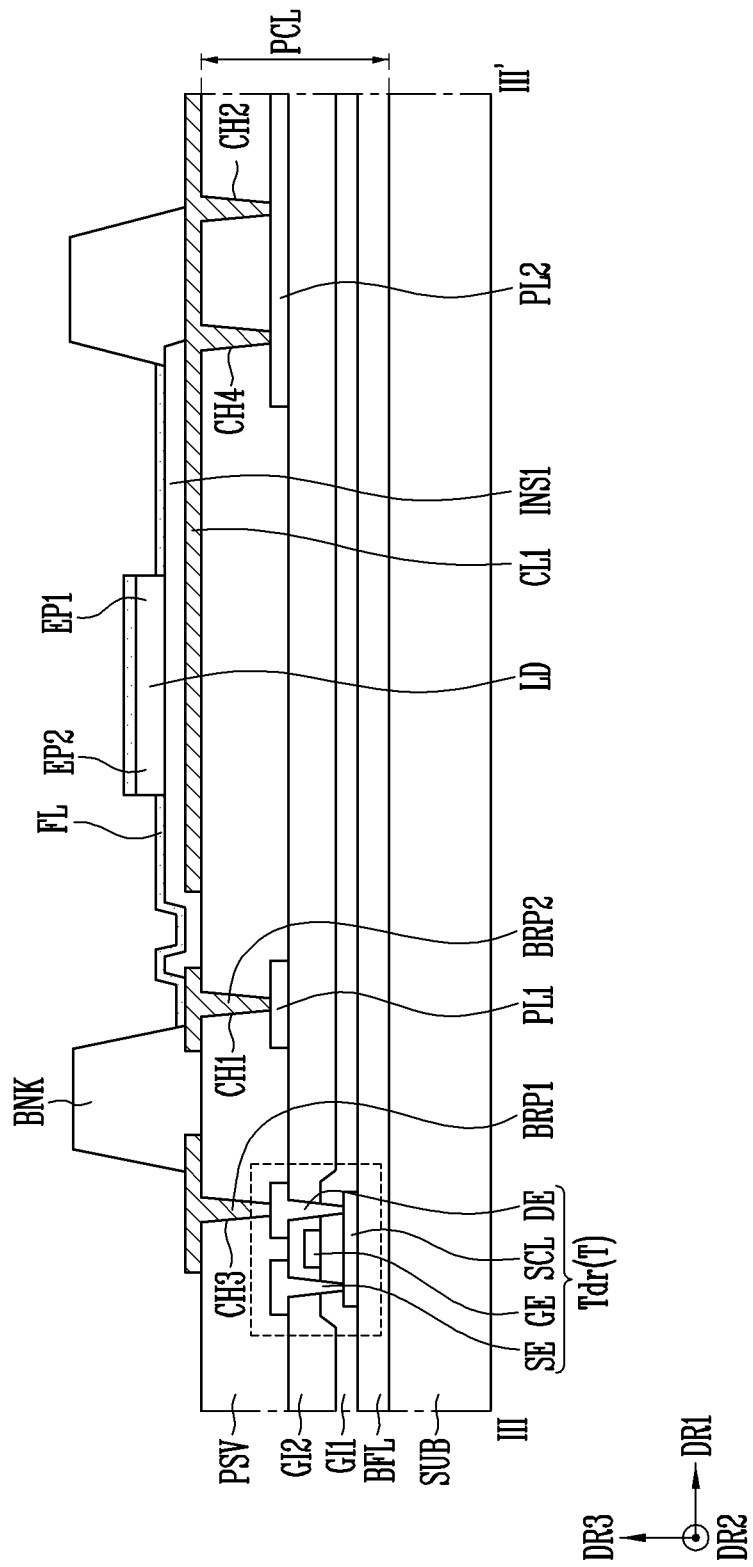
Figure 18F:
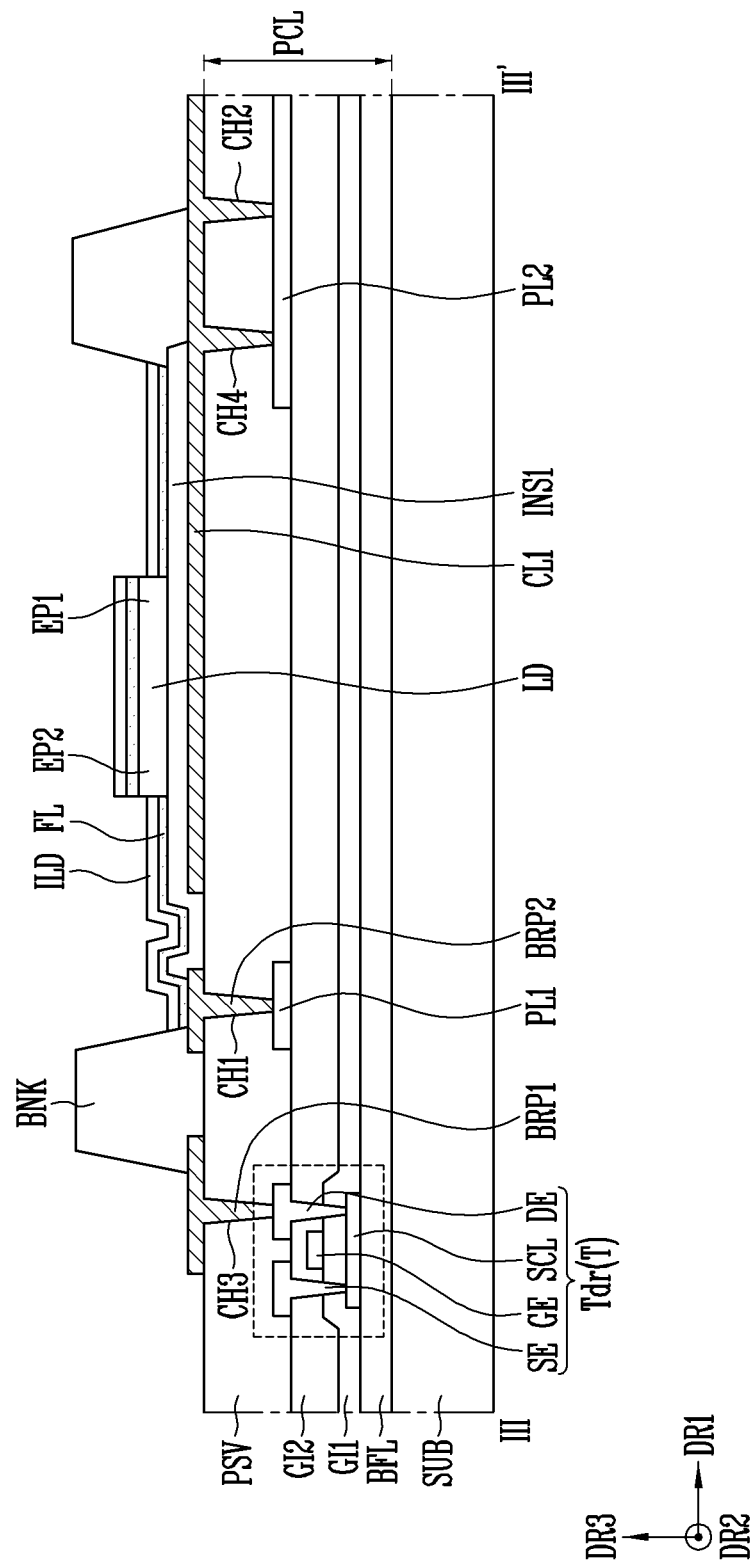
Figure 18G:
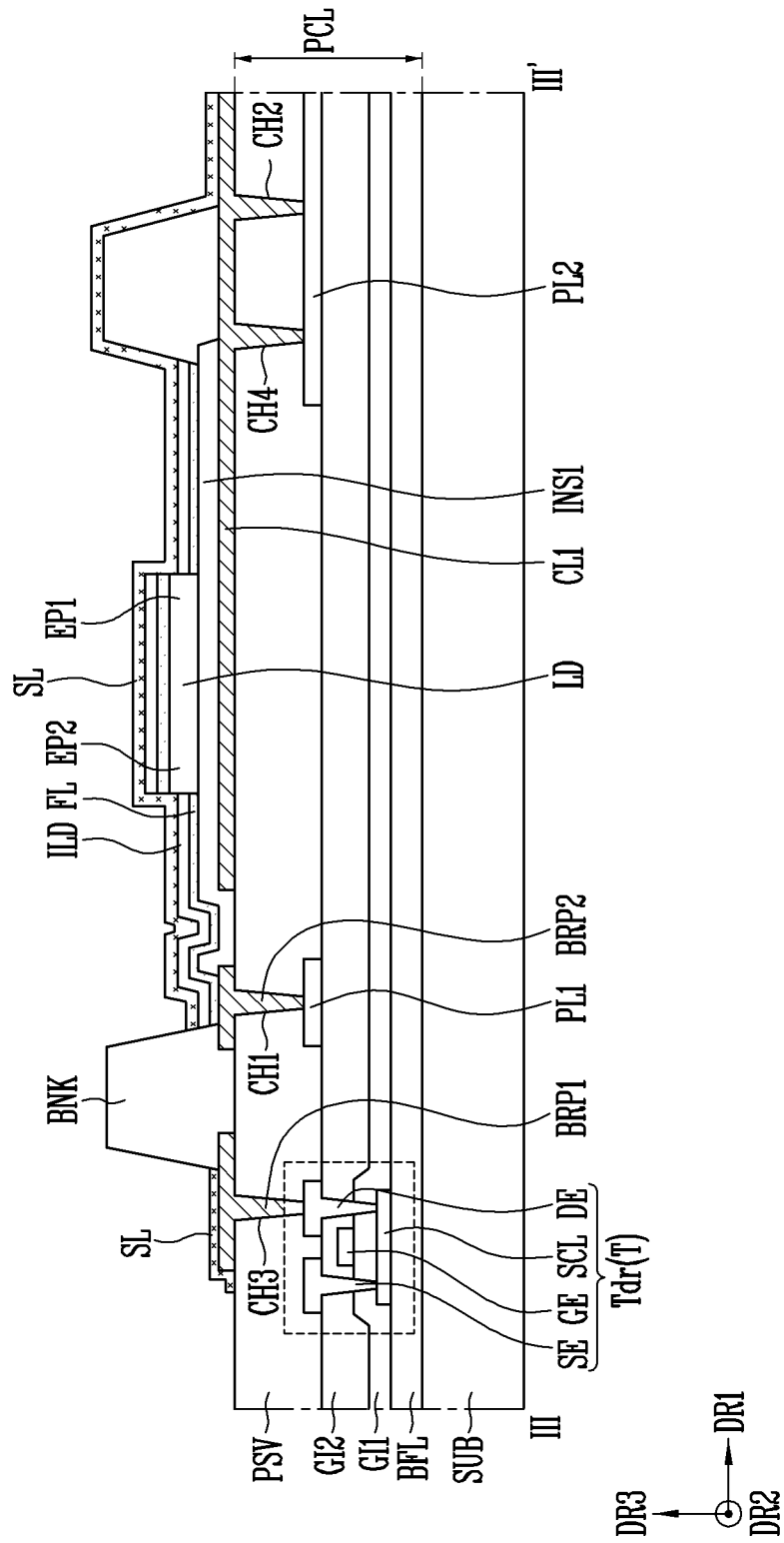
Figure 18H:
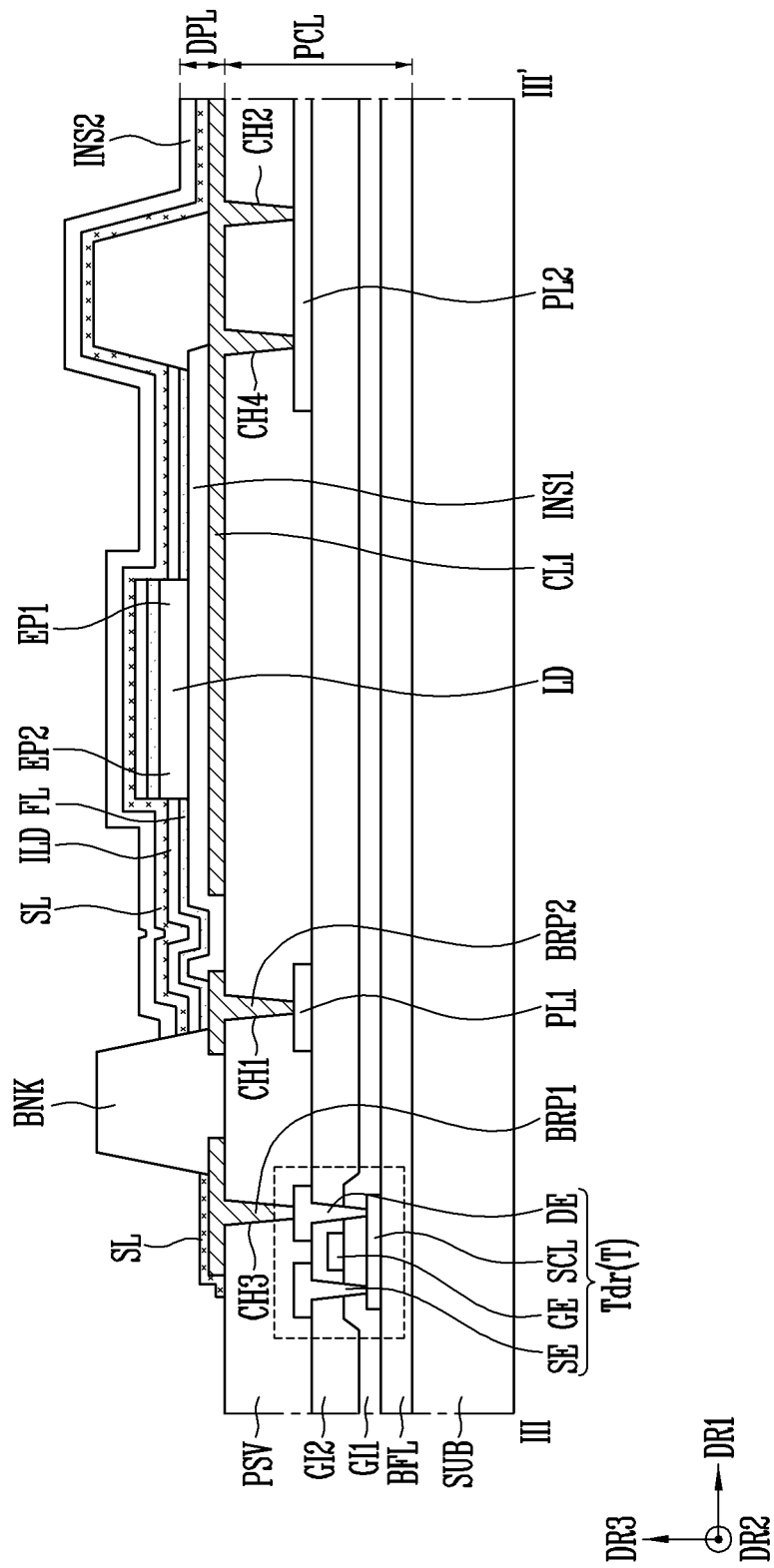
Figure 18I:
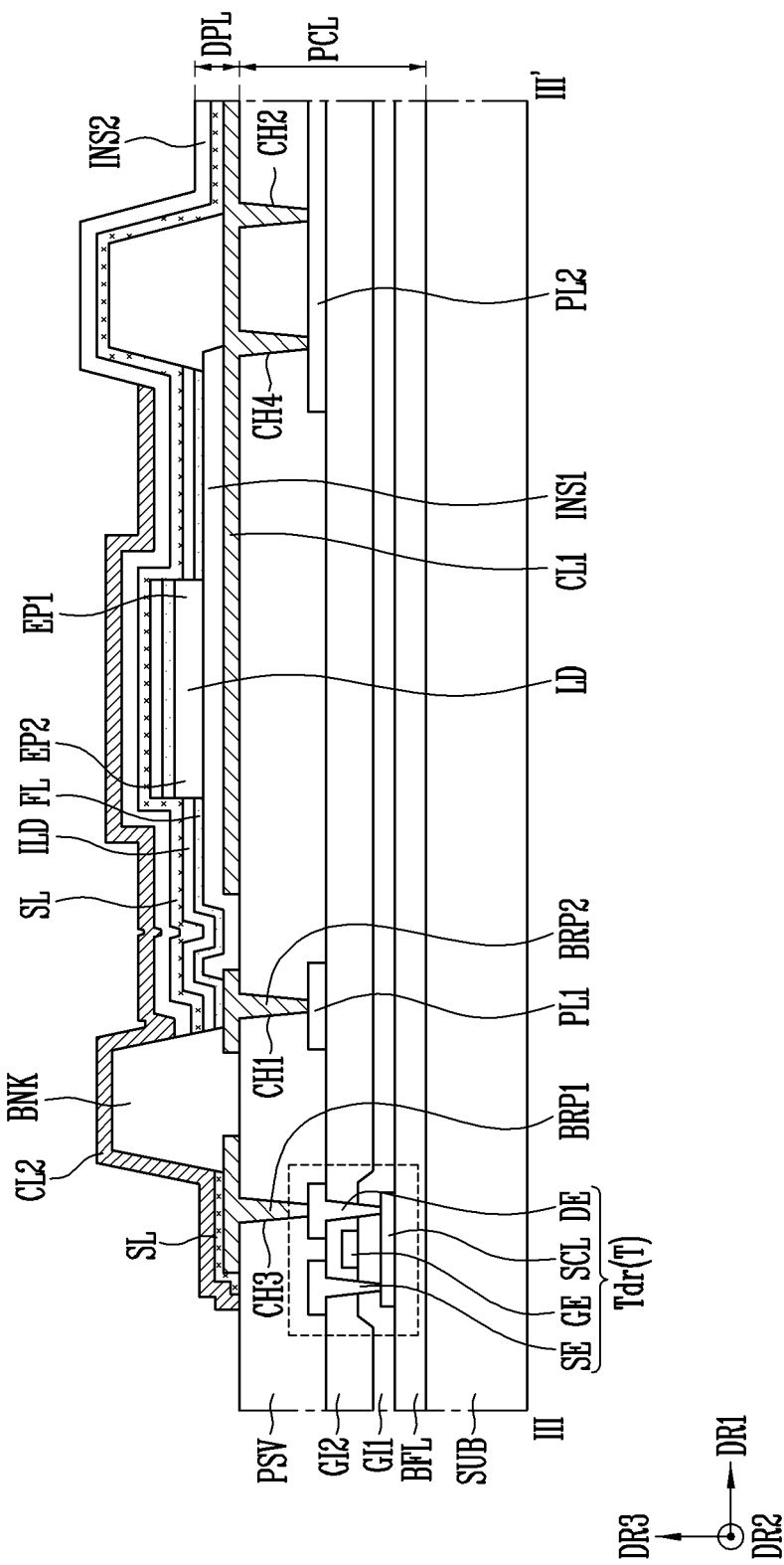
Figure 18J:
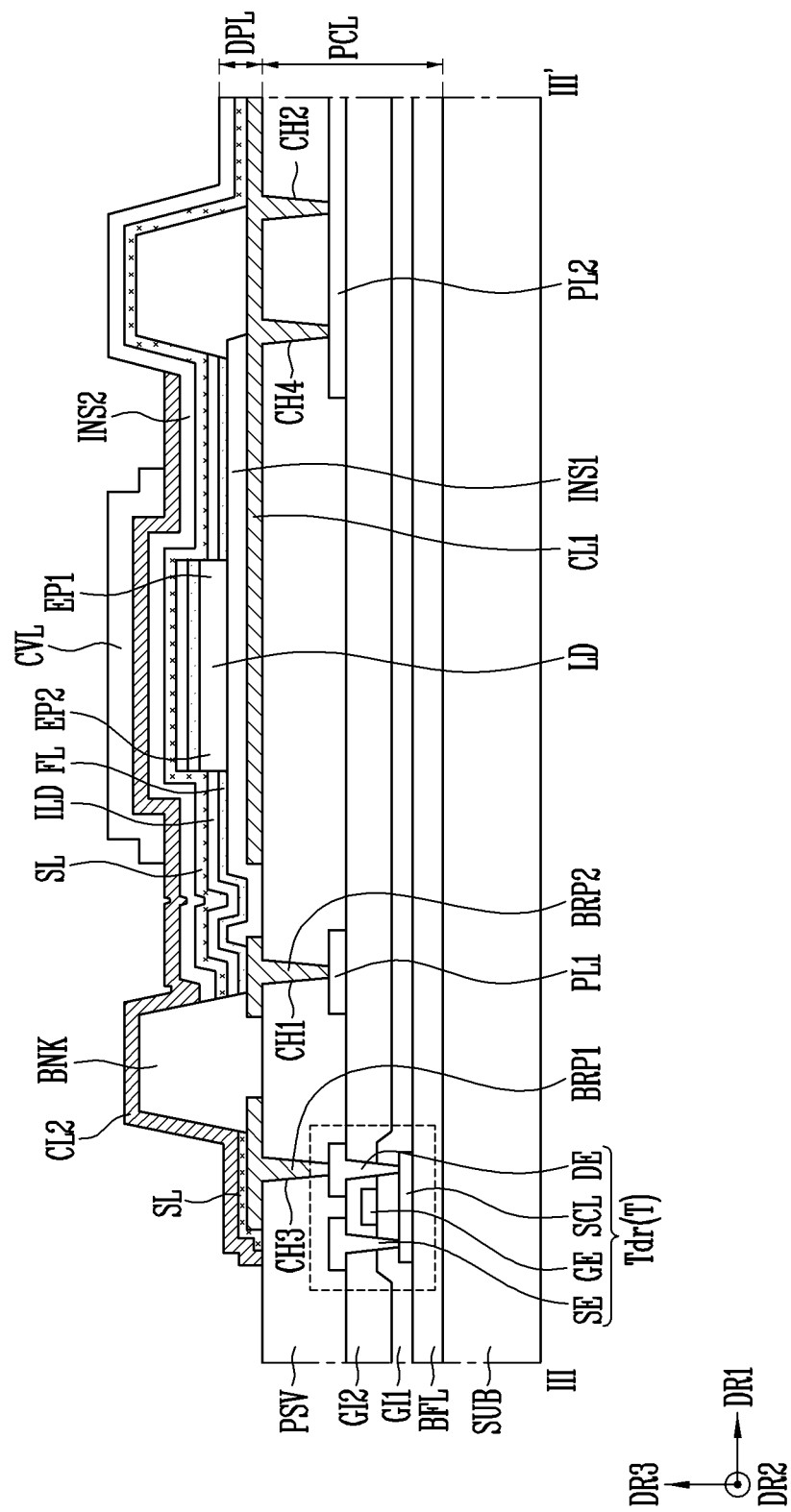
Figure 18K:
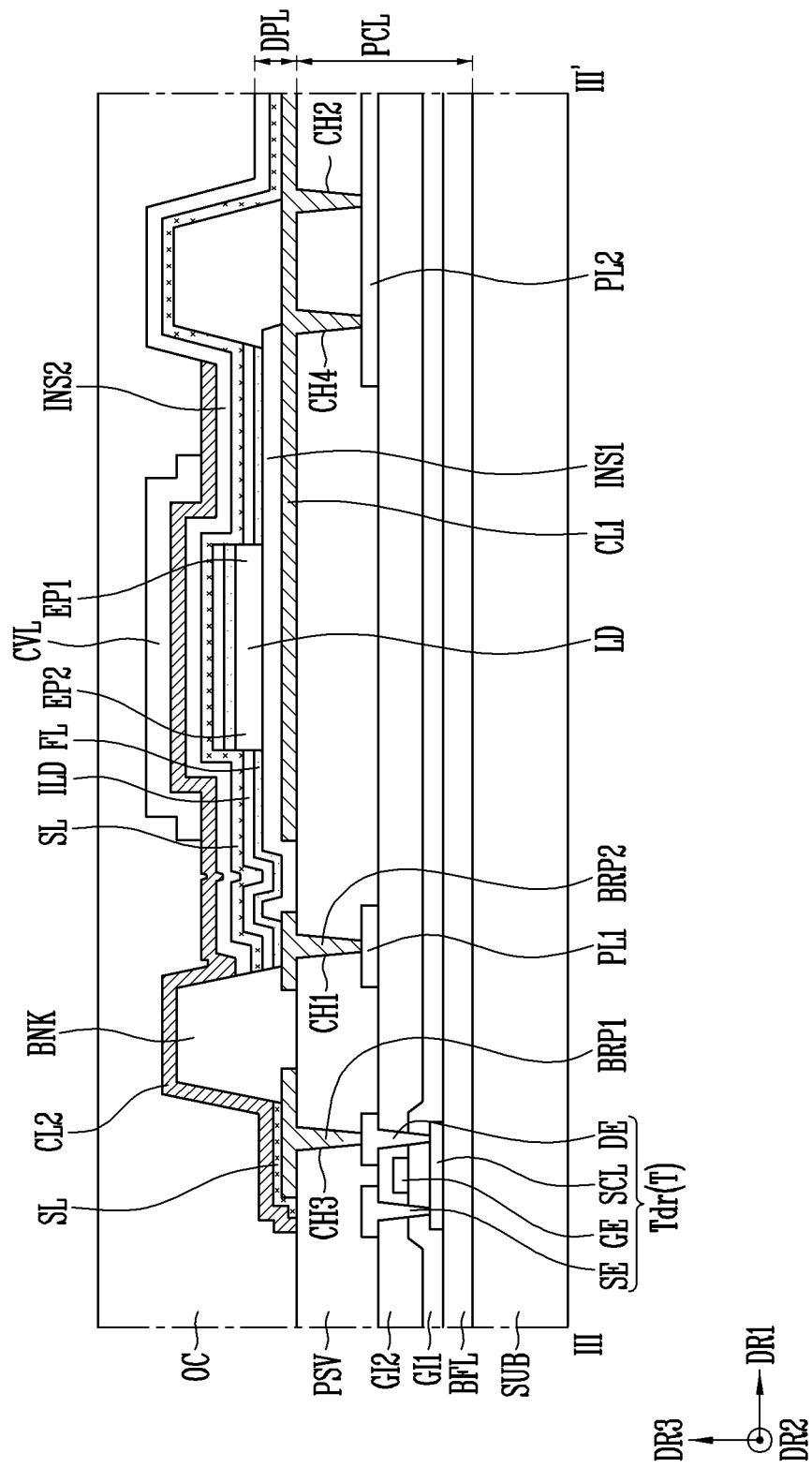

FIG. 13 is a schematic plan view schematically illustrating one pixel among the pixels shown in FIG. 10, FIG. 14 is a schematic cross-sectional view taken along line III~III' of FIG. 13, FIG. 15 is an enlarged schematic plan view of a portion EA4 of FIG. 14, and FIG. 16 is a schematic plan view implementing the cover layer shown in FIG. 13 according to an embodiment.

FIGS. 13 to 16 simplify and show a structure of the one pixel PXL, such as showing each electrode as a single electrode layer and each insulating layer as a single insulating layer, but the disclosure is not limited thereto.

In an embodiment of the disclosure, the term "formed and/or disposed on the same layer" may mean formed in the same process, and the term "formed and/or disposed on different layers" may mean formed in different processes.

In an embodiment, the term "connection" between two configurations may mean that both of an electrical connection and a physical connection are used inclusively.

Referring to FIGS. 1A, 1B, 10, and 13 to 16, the display device according to an embodiment may include the substrate SUB, the line part, and the pixels PXL.

In an embodiment, the substrate SUB may be a stretchable substrate formed of a material having flexibility to be bent or folded, and may have a single layer structure or a multilayer structure. For example, the substrate SUB may include a polymer material such as silicon elastomer or polyurethane, but the disclosure is not limited thereto.

The substrate SUB may include the display area DA including at least one pixel area PXA in which the pixel PXL is disposed, and the non-display area NDA disposed around the display area DA.

Each pixel PXL may include the island IS including at least one light emitting element LD and at least one bridge BR connected to the island IS. The bridge BR may include first to fourth bridges BR1 to BR4 respectively connected to four sides of the island IS of the corresponding pixel PXL. However, the number of bridges BR is not limited thereto. In an embodiment, the island IS may include the pixel area PXA in which the pixel PXL is provided.

The first and third bridges BR1 and BR3 may be areas of the substrate SUB extending in the second direction DR2 or 'vertical direction', and may connect two pixels PXL adjacent (or neighboring) in the second direction DR2 in case that viewed in a plan view. The second and fourth bridges BR2 and BR4 may be areas of the substrate SUB extending in the first direction DR1 or 'horizontal direction', and may connect two pixels PXL adjacent (or neighboring) in the first direction DR1 in case that viewed in a plan view.

The pixel area PXA in which each pixel PXL is disposed (or prepared) may include the emission area EMA in which light is emitted and a peripheral area surrounding a periphery of the emission area EMA. In an embodiment of the disclosure, the peripheral area may include a non-emission area in which light is not emitted.

The line part may include signal lines that transfer a signal (or a voltage) to each pixel PXL. The signal lines may include, for example, the scan line Si transferring the scan signal to each pixel PXL, the data line Dj transferring the data signal to each pixel PXL, the first power line PL1 transferring the first driving power VDD to each pixel PXL, the second power line PL2 transferring the second driving power VSS to each pixel PXL, and the like within the spirit and the scope of the disclosure. However, the disclosure is not limited thereto, and according to an embodiment, the line part may further include signal lines transferring other signals in addition to the above-described signal lines.

The substrate SUB, the pixel circuit part PCL, and the display element part DPL may be provided and/or formed in the pixel area PXA of each pixel PXL.

For convenience, the pixel circuit part PCL is described first, and the display element part DPL is described.

The pixel circuit part PCL may include a buffer layer BFL, the pixel circuit 144, and a protective layer PSV.

The buffer layer BFL may prevent an impurity from diffusing into a transistor included in the pixel circuit (refer to '144' of FIGS. 12A and 12B). The buffer layer BFL may be the same configuration as the barrier layer BRL described with reference to FIG. 4.

The pixel circuit 144 may include at least one transistor and the storage capacitor Cst. Here, the transistor may include a driving transistor Tdr controlling a driving current of each of the light emitting elements LD and a switching transistor (not shown) connected to the driving transistor Tdr. The above-described switching transistor may have the same configuration as the second transistor T2 described with reference to FIGS. 12A and 12B. However, a configuration included in the pixel circuit 144 is not limited to the above-described embodiment, and the pixel circuit 144 may include circuit elements that perform another function in addition to the driving transistor Tdr and the switching transistor. In the following embodiment, in case that one of the driving transistor Tdr and the switching transistor is arbitrarily referred to or the driving transistor Tdr and the switching transistor are collectively referred to, the one of the driving transistor Tdr and the switching transistor or the driving transistor Tdr and the switching transistor are referred to as the transistor T or transistors T.

Each of the transistors T may include a transistor semiconductor pattern SCL, a gate electrode GE, a first terminal SE, and a second terminal DE. The first terminal SE may be any one of a source electrode and a drain electrode, and the second terminal DE may be the other electrode. For example, in case that the first terminal SE is a source electrode, the second terminal DE may be a drain electrode.

The transistor semiconductor pattern SCL may be provided and/or formed on the buffer layer BFL. The transistor semiconductor pattern SCL may include a first contact area contacting the first terminal SE and a second contact area contacting the second terminal DE. An area between the first contact area and the second contact area may be a channel area. The transistor semiconductor pattern SCL may be a semiconductor pattern formed of polysilicon, amorphous silicon, oxide semiconductor, or the like within the spirit and the scope of the disclosure. The channel area is a semiconductor pattern that is not doped with an impurity, and may be an intrinsic semiconductor. The first contact area and the second contact area may be semiconductor patterns doped with an impurity.

The gate electrode GE may be provided and/or formed on the transistor semiconductor pattern SCL with a first gate insulating layer GI1 interposed therebetween.

The first gate insulating layer GI1 may be an inorganic insulating layer including an inorganic material. For example, the first gate insulating layer GI1 may include at least one of silicon nitride ($SiN_x$), silicon oxide ($SiO_x$), silicon oxynitride (SiON), and a metal oxide such as aluminum oxide ($AlO_x$). However, the material of the first gate insulating layer GI1 is not limited to the above-described embodiments. According to an embodiment, the first gate insulating layer GI1 may be formed of an organic insulating layer including an organic material. The first gate insulating layer GI1 may be provided as a single layer, but may be also provided as a multilayer of at least a double layer.

The respective first terminal SE and second terminal DE may be in contact with the first contact area and the second contact area of the transistor semiconductor pattern SCL through a contact hole sequentially passing through the first gate insulating layer GI1 and a second gate insulating layer GI2.

The second gate insulating layer GI2 may be an inorganic insulating layer including an inorganic material. For example, the second gate insulating layer GI2 may include at least one of silicon nitride ($SiN_x$), silicon oxide ($SiO_x$), silicon oxynitride (SiON), and a metal oxide such as aluminum oxide ($AlO_x$). The second gate insulating layer GI2 may include a same material or a similar material as the first gate insulating layer GI1. The second gate insulating layer GI2 may be provided as a single layer, but may be also provided as a multilayer of at least a double layer.

In the above-described embodiment, the first and second terminals SE and DE of each of the transistors T are described as separate electrodes electrically connected to the transistor semiconductor pattern SCL, but the disclosure is not limited thereto. According to an embodiment, the first terminal SE of each of the transistors T may be one of the first and second contact areas adjacent to the channel area of the corresponding transistor semiconductor pattern SCL, and the second terminal DE of each of the transistors T may be the other of the first and second contact areas adjacent to the channel area of the corresponding transistor semiconductor pattern SCL. The second terminal DE of each of the transistors T may be electrically connected to the light emitting elements LD of the corresponding pixel PXL through a separate connection means such as a bridge electrode or a contact electrode.

In an embodiment, the transistors T included in the pixel circuit 144 may be LTPS thin film transistors, but the disclosure is not limited thereto, and may be an oxide semiconductor thin film transistor according to an embodiment. A case where the transistors T are thin film transistors having a top gate structure is described as an example, but the disclosure is not limited thereto. According to an embodiment, the transistors T may be thin film transistors having a bottom gate structure.

The first power line PL1 and the second power line PL2 may be provided and/or formed on the second gate insulating layer GI2.

The first power line PL1 and the second power line PL2 may be spaced apart from each other by a distance on the second gate insulating layer GI2 and may be electrically separated from each other. The first driving power VDD may be applied to the first power line PL1, and the second driving power VSS may be applied to the second power line PL2.

The protective layer PSV may be provided and/or formed on the first and second power lines PL1 and PL2 and the transistors T.

The protective layer PSV may be disposed on the second gate insulating layer GI2. The protective layer PSV may be provided in a form including an organic insulating layer, an inorganic insulating layer, or the organic insulating layer disposed on the inorganic insulating layer. Here, the inorganic insulating layer may include at least one of silicon oxide ($SiO_x$), silicon nitride ($SiN_x$), silicon oxynitride (SiON), and a metal oxide such as aluminum oxide ($AlO_x$). The organic insulating layer may include an organic insulating material that transmits light. The organic insulating layer may include at least one of an acrylic resin (polyacrylates resin), an epoxy resin, a phenolic resin, a polyamide resin, a polyimides resin, an unsaturated polyesters resin, a poly-phenylene ethers resin, a poly-phenylene sulfides resin, and a benzocyclobutene resin. In an embodiment, the protective layer PSV may be formed of the organic insulating layer.

The protective layer PSV may include first to fourth contact holes CH1 to CH4. The first contact hole CH1 may expose a portion of the first power line PL1, the second contact hole CH2 may expose a portion of the second power line PL2, the third contact hole CH3 may expose a portion of the driving transistor Tdr, for example, a portion of the second terminal DE, and the fourth contact hole CH4 may expose another portion of the second power line PL2.

The display element part DPL of each of the pixels PXL is described.

The display element part DPL may include first and second bridge patterns BRP1 and BRP2, a bank pattern BNK, the light emitting elements LD, the first and second layers FL and SL, the interlayer insulating layer ILD, the first and second conductive lines CL1 and CL2, the first and second insulating layers INS1 and INS2, and the cover layer CVL, which are disposed on the pixel circuit part PCL.

The first bridge pattern BRP1 and the second bridge pattern BRP2 may be provided in the pixel area PXA of each pixel PXL to be spaced apart from each other. In an embodiment, the first and second bridge patterns BRP1 and BRP2 may be provided and/or formed on the protective layer PSV.

The first bridge pattern BRP1 may be connected to the second terminal DE of the driving transistor Tdr through a third contact hole CH3 passing through the protective layer PSV. The second bridge pattern BRP2 may be connected to the first power line PL1 through the first contact hole CH1 passing through the protective layer PSV. Accordingly, the first driving power VDD applied to the first power line PL1 may be transferred to the second bridge pattern BRP2, and a signal (or voltage) applied to the driving transistor Tdr may be transferred to the first bridge pattern BRP1.

The first conductive line CL1 may be provided and/or formed on a same layer as the first and second bridge patterns BRP1 and BRP2. For example, the first conductive line CL1 may be disposed on the protective layer PSV to be spaced apart from the first and second bridge patterns BRP1 and BRP2.

The first and second bridge patterns BRP1 and BRP2 and the first conductive line CL1 may include a same material or a similar material. The first and second bridge patterns BRP1 and BRP2 and the first conductive line CL1 may include metal or metal oxide, and for example, may use chromium (Cr), titanium (Ti), aluminum (Al), gold (Au), nickel (Ni), an oxide or an alloy thereof, ITO and the like alone or in combination, but the disclosure is not limited thereto. In an embodiment, the first and second bridge patterns BRP1 and BRP2 and the first conductive line CL1 may include indium tin oxide (ITO).

The first conductive line CL1 may be connected to the second power line PL2 through second and fourth contact holes CH2 and CH4 passing through the protective layer PSV. Accordingly, the second driving power VSS applied to the second power line PL2 may be transferred to the first conductive line CL1.

The first insulating layer INS1 may be provided and/or formed on the first conductive line CL1. In an embodiment, the first insulating layer INS1 corresponds to the same configuration as the first insulating layer INS1 described with reference to FIG. 4, and thus a description thereof is omitted.

The first insulating layer INS1 may cover or overlap a portion of the first conductive line CL1, for example, a portion of the first connective line CL1 except for a portion that is in contact with the second and fourth contact holes CH2 and CH4 of the protective layer PSV.

The bank pattern BNK may be provided and/or formed in the peripheral area of the pixel area PXA of each pixel PXL. The bank pattern BNK may surround at least one side or a side of the peripheral area included in the pixel area PXA of each of the pixels PXL. The bank pattern BNK may be a structure defining (or partitioning) the emission area EMA of each pixel PXL and each of the pixels PXL adjacent thereto, and may be, for example, a pixel defining layer. The bank pattern BNK may include at least one light blocking material and/or reflective material to prevent a light leakage defect in which light (or rays) is leaked between each pixel PXL and the pixels PXL adjacent thereto. According to an embodiment, a reflective material layer may be formed on the bank pattern BNK to further improve efficiency of light emitted from each pixel PXL.

The light emitting elements LD may be provided and/or formed on the first insulating layer INS1 positioned in one area or an area (for example, a center area of the pixel area PXA in a plan view) of the pixel area PXA surrounded by the bank pattern BNK. Each of the light emitting elements LD may be the light emitting element including the emission stack pattern 10 in which the first semiconductor layer 11, the active layer 12, and the second semiconductor layer 13 may be sequentially stacked each other along the length L direction, and the insulating film 14 surrounding the outer circumferential surface (or surface) of the emission stack pattern 10, and manufactured by an etching method.

Each of the light emitting elements LD may be disposed on the first insulating layer INS1 so that the length L direction is parallel to the first direction DR1.

The light emitting elements LD may be input to the pixel area PXA through an inkjet printing method, a slit coating method, or other various methods. Each of the light emitting elements LD may have the first end EP1 and the second end EP2 in the length L direction. The first end EP1 of each of the light emitting elements LD may be the first semiconductor layer 11, and the second end EP2 of each of the light emitting elements LD may be the second semiconductor layer 13.

The first layer FL may be provided and/or formed on the light emitting elements LD. In an embodiment, the first layer FL may include a p-type hydrogenated amorphous silicon (a-Si:H) semiconductor material doped with a p-type dopant such as Mg.

The first layer FL may be in contact with the both ends EP1 and EP2 of each of the light emitting elements LD. For example, the first layer FL may be in direct contact with the first area B1 of the first semiconductor layer 11 of each light emitting element LD, and may be in direct contact with the first area A1 of the second semiconductor layer 13. The first layer FL may be in contact with the second bridge pattern BRP2 to be connected to the second bridge pattern BRP2. Accordingly, the first driving power VDD applied to the second bridge pattern BRP2 may be transferred to the first layer FL.

Because of the material properties of each of the first semiconductor layer 11 and the second semiconductor layer 13 which are in direct contact with the first layer FL including the p-type hydrogenated amorphous silicon (a-Si:H) semiconductor material, the hole may be selectively injected into one of the first and second semiconductor layers 11 and 13. In an embodiment, the first semiconductor layer 11 may be made of n-type GaN, and the second semiconductor layer 13 may be made of p-type GaN. Accordingly, the material properties (for example, Fermi levels) of the first semiconductor layer 11 and the second semiconductor layer 13 may be different. Because of the difference between Fermi levels of the first and second semiconductor layers 11 and 13, even though each of the first semiconductor layer 11 and the second semiconductor layer 13 is in contact with the first layer FL, the hole may be selectively injected into only one area or an area of the second semiconductor layer 13. For example, in case that a signal, for example, the first driving power VDD is applied to the first layer FL, the hole may be injected into the first area A1 of the second semiconductor layer 13 which is in contact with the first layer FL, and the hole may not be injected into the first area B1 of the first semiconductor layer 11.

The above-described first layer FL may function as a hole injection layer for selectively injecting the hole into the second semiconductor layer 13 of each of the light emitting elements LD.

The interlayer insulating layer ILD may be provided and/or formed on the first layer FL. The interlayer insulating layer ILD may have the same configuration as the interlayer insulating layer ILD described with reference to FIG. 4. The interlayer insulating layer ILD may be disposed on the first layer FL and may be in contact with the both ends EP1 and EP2 of each of the light emitting elements LD. For example, the interlayer insulating layer ILD may be in direct contact with the second area B2 of the first semiconductor layer 11 of each light emitting element LD, and may be in direct contact with the second area A2 of the second semiconductor layer 13 of each light emitting element LD.

The second layer SL may be provided and/or formed on the interlayer insulating layer ILD. In an embodiment, the second layer SL may be formed of a transparent oxide semiconductor material such as a-IGZO.

The second layer SL may be provided and/or formed on the interlayer insulating layer ILD and the light emitting elements LD. The second layer SL may be provided and/or formed on one area or an area of the bank pattern BNK and the first bridge pattern BRP1. However, the disclosure is not limited thereto, and according to an embodiment, the second layer SL may not be provided and/or formed on the first bridge pattern BRP1.

In an embodiment, the second layer SL may be in contact with the both ends EP1 and EP2 of each of the light emitting elements LD. For example, the second layer SL may be in direct contact with the third area B3 of the first semiconductor layer 11 of each light emitting element LD, and may be in direct contact with the third area A3 of the second semiconductor layer 13. The second layer SL may be disposed on the first conductive line CL1 to be connected to the first conductive line CL1. Accordingly, the second driving power VSS applied to the first conductive line CL1 may be transferred to the second layer SL.

Because of the material properties of each of the first semiconductor layer 11 and the second semiconductor layer 13 which are in direct contact with the second layer SL formed of a transparent oxide semiconductor material such as a-IGZO, the electron may be selectively injected into one of the first and second semiconductor layers 11 and 13. As described above, because of the difference between the Fermi levels of the first and second semiconductor layers 11 and 13 which are in contact with the second layer SL, even though each of the first semiconductor layer 11 and the second semiconductor layer 13 is in contact with the second layer SL, the electron may be selectively injected into only one area or an area of the first semiconductor layer 11. For example, in case that a signal (or voltage), for example, the second driving power VSS is applied to the second layer SL, the electron may be injected into only the third area B3 of the first semiconductor layer 11 that is in contact with the second layer SL, and the electron may not be injected into the third area A3 of the second semiconductor layer 13.

The above-described second layer SL may function as an electron injection layer that selectively injects the electron into the first semiconductor layer 11 of each of the light emitting elements LD.

The first layer FL and the second layer SL may be electrically and/or physically separated by the interlayer insulating layer ILD disposed therebetween.

In an embodiment, the first area A1 of the second semiconductor layer 13 that is in contact with the first layer FL, the second area A2 of the second semiconductor layer 13 that in contact with the interlayer insulating layer ILD, and the third area A3 of the second semiconductor layer 13 that is in contact with the second layer SL may be the upper surface 13b of the second semiconductor layer 13. A value obtained by summing a thickness of the first area A1 of the second semiconductor layer 13, a thickness of the second area A2 of the second semiconductor layer 13, and a thickness of the third area A3 of the second semiconductor layer 13 may be the same as the diameter D of each light emitting element LD.

The first area B1 of the first semiconductor layer 11 that is in contact with the first layer FL, the second area B2 of the first semiconductor layer 11 that is in contact with the interlayer insulating layer ILD, and the third area B3 of the first semiconductor layer 11 that is in contact with the second layer SL may be the lower surface 11a of the first semiconductor layer 11. A value obtained by summing a thickness of the first area B1 of the first semiconductor layer 11, a thickness of the second area B2 of the first semiconductor layer 11, and a thickness of the third area B3 of the first semiconductor layer 11 may be the same as the diameter D of each light emitting element LD.

The second insulating layer INS2 may be provided and/or formed on the second layer SL. The second insulating layer INS2 may include a same material or a similar material as the first insulating layer INS1. For example, the second insulating layer INS2 may be formed of an inorganic insulating layer such as silicon oxide ($SiO_x$). However, the disclosure is not limited thereto. The second insulating layer INS2 may cover or overlap the second layer SL so that the second layer SL is not exposed to the outside.

The second conductive line CL2 may be provided and/or formed on the second insulating layer INS2. In an embodiment, the second conductive line CL2 may include a same material or a similar material as the first conductive line CL1. For example, the second conductive line CL2 may include indium tin oxide (ITO).

In an embodiment, the second conductive line CL2 may be provided and/or formed on another area of the bank pattern BNK on which the second layer SL is not provided, and although not illustrated, the second conductive line CL2 may be connected to the first bridge pattern BRP1. As the second conductive line CL2 is connected to the first bridge pattern BRP1, the second conductive line CL2 may be electrically connected to a partial configuration of the pixel circuit part PCL, for example, the driving transistor Tdr, through the first bridge pattern BRP1. Accordingly, a signal (or voltage) applied to the driving transistor Tdr may be transferred to the second conductive line CL2.

In an embodiment, the second conductive line CL2 may be positioned on each light emitting element LD, and the first conductive line CL1 may be positioned under or below each light emitting element LD. For example, the first conductive line CL1 and the second conductive line CL2 may be respectively positioned on and under or below each light emitting element LD interposed therebetween.

As described above, the second driving power VSS may be applied to the first conductive line CL1 through the second power line PL2, and the signal (or voltage) applied to the driving transistor Tdr may be applied to the second conductive line CL2 through the first bridge pattern BRP1. Here, the signal (or voltage) applied to the driving transistor Tdr may be potential power higher than that of the second driving power VSS. As the signal (or voltage) corresponding to each of the first and second conductive lines CL1 and CL2 is applied, an electric field may be formed between the first conductive line CL1 and the second conductive line CL2. For example, the electric field may be formed in a direction from the first conductive line CL1 to the second conductive line CL2. The HE11 mode of the light emitted from the active layer 12 of each light emitting element LD may be strengthened. Accordingly, the amount (or intensity) of the light proceeding from the active layer 12 of each light emitting element LD to each of the first semiconductor layer 11 and the second semiconductor layer 13 may increase, and thus the light output efficiency of each light emitting element LD may be further improved.

The cover layer CVL may be provided and/or formed on the second conductive line CL2. The cover layer CVL may be disposed on the uppermost layer among configurations provided in each pixel area PXA, and may cover or overlap the light emitting elements LD in case that viewed in a plan view.

In an embodiment, the cover layer CVL may function as a light guide member for guiding the light emitted from each of the light emitting elements LD to be concentrated in a specific direction of the pixel area PXA. The cover layer CVL may be formed of a conductive material (or substance) having a constant reflectance. The conductive material (or substance) may include an opaque metal advantageous for guiding the light emitted from the light emitting elements LD in a specific direction (for example, a desired direction) by reflecting or scattering the light.

In case that viewed in a plan view, the cover layer CVL may not overlap the bank pattern BNK in the pixel area PXA, and may overlap an inner area surrounded by the bank pattern BNK, for example, an area where the light emitting elements LD are disposed. The light emitted from each of the light emitting elements LD positioned under or below the cover layer CVL may be reflected or scattered by the cover layer CVL and may proceed in the specific direction. Accordingly, light may be intensively emitted only from a specific area of the pixel area PXA. For example, as shown in FIG. 13, an area between the bank pattern BNK and the cover layer CVL in the pixel area PXA may become the emission area EMA from which the light is emitted.

As a result, a position of the emission area EMA from which the light is emitted in the pixel area PXA may be finally determined by the cover layer CVL.

As described above, in case that the cover layer CVL is disposed in the pixel area PXA in which each pixel PXL is provided, the light emitted from the light emitting elements LD may be intensively guided in the specific direction (for example, a desired direction). In case that the position of the cover layer CVL provided in the pixel area PXA of each pixel PXL is the same as the position of the cover layer CVL provided to the pixels PXL adjacent to each pixel PXL, positions of the emission areas EMA from which the light is emitted in each of the pixels PXL may be substantially the same. Accordingly, a light output deviation between each pixel PXL and the pixel PXL adjacent thereto may be reduced, and the display device according to an embodiment may have a uniform light output distribution over the entire area.

In the above-described embodiment, the cover layer CVL does not overlap the bank pattern BNK in the pixel area PXA, but the disclosure is not limited thereto. According to an embodiment, as shown in FIG. 16, the cover layer CVL may overlap one area or an area of the bank pattern BNK. The light emitted from each of the light emitting elements LD may proceed to a specific area of the pixel area PXA, for example, another area of the bank pattern BNK spaced apart from the cover layer CVL by a distance without overlapping the cover layer CVL. Accordingly, a separation space between the other area of the bank pattern BNK (for example, the area spaced apart from the cover layer CVL without overlapping the cover layer CVL) and the cover layer CVL may be determined as the emission area EMA from which the light is emitted.

An overcoat layer OC may be provided and/or formed on the cover layer CVL. The overcoat layer OC may be a planarization layer that relieves a step difference generated by configurations disposed thereunder, the light emitting elements LD, the bank pattern BNK, the first and second layers FL and SL, and the first and second conductive lines CL1 and CL2, the first and second insulating layers INS1 and INS2, and the like within the spirit and the scope of the disclosure. According to an embodiment, the overcoat layer OC may be an encapsulation layer that prevents oxygen and moisture from penetrating into the light emitting elements LD.

FIGS. 17A to 17K are schematic plan views sequentially illustrating a method of manufacturing one pixel shown in FIG. 13, and FIGS. 18A to 18K are cross-sectional views sequentially illustrating a method of manufacturing one pixel shown in FIG. 14.

Hereinafter, the pixel according to an embodiment shown in FIGS. 13 and 14 is sequentially described according to a manufacturing method in conjunction with FIGS. 17A to 17K and 18A to 18K.

Referring to FIGS. 1A, 1B, 10, 13 to 15, 17A, and 18A, a partial configuration of the pixel circuit part PCL is formed on a substrate SUB.

The partial configuration of the pixel circuit part PCL may include the driving transistor Tdr, the first and second power lines PL1 and PL2, and at least one insulating layer. Here, the at least one insulating layer may include the buffer layer BFL and the first and second gate insulating layers GI1 and GI2 sequentially formed on the substrate SUB.

Successively, a first insulating material layer (not shown) is applied on the driving transistor Tdr and the first and second power lines PL1 and PL2, and a photo process, a curing process, and a descum process (a process of removing a remainder (or a residue) generated in case that a process is progressed) are sequentially performed, to form the protective layer PSV. In an embodiment, the protective layer PSV may include the third contact hole CH3 exposing a portion of the driving transistor Tdr, the first contact hole CH1 exposing a portion of the first power line PL1, the second contact hole CH2 exposing a portion of the second power line PL2, and the fourth contact hole CH4 exposing another portion of the second power line PL2.

Referring to FIGS. 1A, 1B, 10, 13 to 15, 17B, 17C, 18A, and 18B, a transparent metal oxide such as indium tin oxide (ITO) may be deposited on the protective layer PSV, and a photo process, an etching process, and a strip process are sequentially performed, to form the first bridge pattern BRP1, the second bridge pattern BRP2, and the first conductive line CL1 spaced apart from each other on the protective layer PSV. Here, the etching process may be a wet etching process, but the disclosure is not limited thereto.

In an embodiment, the first bridge pattern BRP1 may be electrically and/or physically connected to the driving transistor Tdr through the third contact hole CH3 passing through the protective layer PSV. The second bridge pattern BRP2 may be electrically and/or physically connected to the first power line PL1 through the first contact hole CH1 passing through the protective layer PSV. The first conductive line CL1 may be electrically and/or physically connected to the second power line PL2 through the second and fourth contact holes CH2 and CH4 passing through the protective layer PSV.

Successively, a second insulating material layer (not shown) formed of silicon oxide ($SiO_x$) is applied on the first bridge pattern BRP1, the second bridge pattern BRP2, and the first conductive line CL1, and a photo process, an etching process, and a strip process are sequentially performed, to form the first insulating layer INS1. Here, the etching process may be a dry etching process, but the disclosure is not limited thereto.

In an embodiment, the first insulating layer INS1 may be formed on a portion of the first conductive line CL1.

Referring to FIGS. 1A, 1B, 10, 13 to 15, 17D, and 18A to 18C, a third insulating material layer (not shown) is applied on the protective layer PSV on which the first insulating layer INS1 is formed, and a photo process, a curing process, and a descum process are sequentially performed, to form the bank pattern BNK.

Referring to FIGS. 1A, 1B, 10, 13 to 15, 17E, and 18A to 18D, a mixed solution including the light emitting elements LD is input to the pixel area PXA of each of the pixels PXL using an inkjet printing method or the like within the spirit and the scope of the disclosure. For example, an inkjet nozzle may be disposed on the first insulating layer INS1, and a solvent mixed with the light emitting elements LD may be input into the pixel area PXA of each of the pixels PXL through the inkjet nozzle. Here, the solvent may be any one or more of acetone, water, alcohol, and toluene, but the disclosure is not limited thereto. For example, the solvent may be in a form of an ink or paste. A method of inputting the light emitting elements LD into the pixel area PXA of each of the pixels PXL is not limited to the above-described embodiment, and the method of inputting the light emitting elements LD may be variously changed.

After the light emitting elements LD are input into the pixel area PXA of each of the pixels PXL, the solvent may be removed. The light emitting elements LD may be positioned on one area or an area of the pixel area PXA of each of the pixels PXL, for example, on the first insulating layer INS1 of an inner area surrounded by the bank pattern BNK without overlapping the bank pattern BNK.

Referring to FIGS. 1A, 1B, 10, 13 to 15, 17F, and 18A to 18E, an hydrogenated amorphous silicon (a-Si:H) semiconductor material is applied on the light emitting elements LD and the first insulating layer INS1, and a photo process, an etching process, a strip process, and a process of injecting a p-type dopant are sequentially performed, to form the first layer FL. Here, the etching process may be a dry etching process, but the disclosure is not limited thereto.

The first layer FL may be formed of a p-type hydrogenated amorphous silicon semiconductor material and may be formed on the first insulating layer INS1. The first layer FL may be disposed on each light emitting element LD.

In an embodiment, the first layer FL may contact one area or an area of the both ends EP1 and EP2 of each light emitting element LD. For example, the first layer FL may be in contact with the first area B1 of the lower surface 11a of the first semiconductor layer 11 of each light emitting element LD and the first area A1 of the upper surface 13b of the second semiconductor layer 13.

Referring to FIGS. 1A, 1B, 10, 13 to 15, 17G, and 18A to 18F, a fourth insulating material layer (not shown) formed of silicon oxide (SiO$_x$) is applied on the first layer FL, and a photo process, an etching process, and a strip process are sequentially performed, to form the interlayer insulating layer ILD. Here, the etching process may be a dry etching process, but the disclosure is not limited thereto.

The interlayer insulating layer ILD may be formed on the first layer FL and may be in contact with another area of the both ends EP1 and EP2 of each light emitting element LD. For example, the interlayer insulating layer ILD may be in contact with the second area B2 of the lower surface 11a of the first semiconductor layer 11 of each light emitting element LD and the second area A2 of the upper surface 13b of the second semiconductor layer 13.

Referring to FIGS. 1A, 1B, 10, 13 to 15, 17H, and 18A to 18G, a transparent metal oxide formed of a-IGZO is applied on the interlayer insulating layer ILD, and a photo process, an etching process, and a strip process are sequentially performed, to form the second layer SL. Here, the etching process may be a wet etching process, but the disclosure is not limited thereto.

The second layer SL may be formed on the interlayer insulating layer ILD. The second layer SL may be formed on the first conductive line CL1 exposed to the outside without being covered or overlapped by the first insulating layer INS1 in which the bank pattern BNK is formed on one area or an area. Accordingly, the second layer SL may be electrically and/or physically connected to the second power line PL2 through the first conductive line CL1. The second layer SL may be formed on the first bridge pattern BRP1.

In an embodiment, the second layer SL may be in contact with still another area of the both ends EP1 and EP2 of each light emitting element LD. For example, the second layer SL may be in contact with each of the third area B3 of the lower surface 11a of the first semiconductor layer 11 of each light emitting element LD and the third area A3 of the upper surface 13b of the second semiconductor layer 13.

Referring to FIGS. 1A, 1B, 10, 13 to 15, 17I, and 18A to 18H, a fifth insulating material layer (not shown) formed of silicon oxide (SiO$_x$) is applied on the second layer SL, and a photo process, an etching process, and a strip process are sequentially performed, to form the second insulating layer INS2. Here, the etching process may be a dry etching process, but the disclosure is not limited thereto.

The second insulating layer INS2 may be formed on the second layer SL to protect the second layer SL.

Referring to FIGS. 1A, 1B, 10, 13 to 15, 17J, and 18A to 18I, a transparent metal oxide such as indium tin oxide (ITO) is deposited on the second insulating layer INS2, and a photo process, an etching process, and a strip process are sequentially performed, to form the second conductive line CL2. Here, the etching process may be a wet etching process, but the disclosure is not limited thereto.

The second conductive line CL2 may be formed on the second insulating layer INS2 and may be formed on the first bridge pattern BRP1. Accordingly, the second conductive line CL2 may be electrically and/or physically connected to the driving transistor Tdr through the first bridge pattern BRP1.

Referring to FIGS. 1A, 1B, 10, 13 to 15, 17K, and 18A to 18J, the cover layer CVL is formed on the second conductive line CL2. The cover layer CVL may be formed in an area of the pixel area PXA surrounded by the bank pattern BNK without overlapping the bank pattern BNK, for example, in the center (or middle) of the pixel area PXA. For example, the cover layer CVL may be formed on the second conductive line CL2 to correspond to an area in which the light emitting elements LD are positioned. However, the disclosure is not limited thereto, and according to an embodiment, the position of the cover layer CVL may be variously changed.

Referring to FIGS. 1A, 1B, 10, 13 to 15, and 18A to 18K, the overcoat layer OC is formed on the cover layer CVL.

Although the above has been described with reference to the embodiment, those skilled in the art or those having ordinary knowledge of the corresponding technical field will understand that the disclosure may be variously changed and modified without departing from the technical scope of the disclosure and as described in the claims.

Therefore, the technical scope of the disclosure should not be limited to the contents described in the detailed description of the specification, but should be also defined by the claims.

The invention claimed is:

1. A display device comprising:
    a display area and a non-display area adjacent to at least a side of the display are the display area including pixel areas, each of the pixel areas having an emission area and;
    a pixel disposed in each of the pixel areas and including a display element part, wherein the display element part comprises:
- a first insulating layer disposed on a substrate;
- at least one light emitting element disposed on the first insulating layer and each having a first end and a second end in a longitudinal direction;
- a first layer disposed on the first insulating layer and the at least one light emitting element and a first area of each of the first end and the second end of the at least one light emitting element;
- a second layer disposed on the at least one light emitting element and contacting a second area of each of the first end and the second end of the at least one light emitting element; and
- an interlayer insulating layer disposed between the first layer and the second layer, and
- the first layer and the second layer include a semiconductor material.

2. The display device according to claim 1, wherein the at least one light emitting element comprises:
- a first semiconductor layer of a first conductive dopant;
- a second semiconductor layer of a second conductive dopant; and
- an active layer disposed between the first semiconductor layer and the second semiconductor layer, and
- the first semiconductor layer and the second semiconductor layer each include a gallium nitride (GaN) semiconductor material.

3. The display device according to claim 2, wherein
the first conductive dopant includes an n-type dopant, and the second conductive dopant includes a p-type dopant.

4. The display device according to claim 3, wherein
the first end of the at least one light emitting element includes the first semiconductor layer, and
the second end of the at least one light emitting element includes the second semiconductor layer.

5. The display device according to claim 4, wherein
the first layer of the display element part includes a p-type hydrogenated amorphous silicon (a-Si:H) semiconductor material, and
the second layer of the display element part includes a transparent oxide semiconductor material.

6. The display device according to claim 5, further comprising:
- a first power line disposed between the substrate and the first insulating layer and electrically connected to the first layer of the display element part; and
- a second power line disposed between the substrate and the first insulating layer, spaced apart from the first power line, and electrically connected to the second layer of the display element part.

7. The display device according to claim 6, wherein
the first layer of the display element part is a hole injection layer receiving a first power from the first power line and injecting a hole into the first area of the second end of the at least one light emitting element, and
the second layer is an electron injection layer receiving a second power from the second power line and injecting an electron into the second area of the first end of the at least one light emitting element.

8. The display device according to claim 7, wherein the interlayer insulating layer is disposed between the first area and the second area of each of the first end and the second end of the at least one light emitting element.

9. The display device according to claim 8, wherein the first area of the first end of the at least one light emitting element contacting the first layer and the second area of the first end of the at least one light emitting element contacting the second layer have the same width.

10. The display device according to claim 8, wherein the second area of the first end of the at least one light emitting element contacting the second layer and the second area of the second end of the at least one light emitting element contacting the second layer have a same width.

11. The display device according to claim 7, wherein the display element part further comprises:
- a first conductive line disposed between the substrate and the first insulating layer;
- a second insulating layer disposed on the second layer; and
- a second conductive line disposed on the second insulating layer.

12. The display device according to claim 11, wherein different voltages are applied to the first conductive line and the second conductive line, respectively, and an electric field is formed in a direction intersecting the longitudinal direction of the at least one light emitting element.

13. The display device according to claim 12, wherein the second conductive line includes a transparent conductive material.

14. The display device according to claim 11, wherein the display element part further comprises a cover layer disposed on the second conductive line corresponding to the at least one light emitting element.

15. The display device according to claim 14, wherein the cover layer includes an opaque conductive material.

16. The display device according to claim 14, wherein the cover layer guides light emitted from the at least one light emitting element in a direction to determine a position of the emission area of each of the pixel areas.

17. The display device according to claim 1, wherein the pixel further comprises a pixel circuit part disposed between the substrate and the display element part.

18. A display device comprising:
- a stretchable substrate including islands and bridges connecting the islands; and
- pixels disposed in each of the islands and each including a display element part, wherein
the display element part comprises:
- a first insulating layer disposed in each of the islands;
- light emitting elements disposed on the first insulating layer and each having a first end and a second end in a longitudinal direction;
- a first layer disposed on the first insulating layer and the light emitting elements and a first area of each of the first end and the second end of each of the light emitting elements;
- a second layer disposed on the light emitting elements and contacting a second area of each of the first end and the second end of each of the light emitting elements; and
- an interlayer insulating layer disposed between the first layer and the second layer,
the first layer and the second layer include a semiconductor material.

19. The display device according to claim 18, wherein
the first layer includes a p-type hydrogenated amorphous silicon (a-Si:H) semiconductor material, and
the second layer includes a transparent oxide semiconductor material.

20. The display device according to claim 19, wherein
the first end of each of the light emitting elements includes a first semiconductor layer of an n-type dopant, and the second end of each of the light emitting elements includes a second semiconductor layer of a p-type dopant.

21. The display device according to claim 18, wherein the stretchable substrate further includes a cutout disposed between the islands and the bridges.

22. A method of manufacturing a display device, the method comprising:
   providing a pixel in a pixel area of device, wherein the providing of the pixel comprises:
   forming a pixel circuit part on a substrate; and
   forming a display element part on the pixel circuit part, and
   the forming of the display element part comprises:
      forming a first insulating layer on the pixel circuit part;
      supplying light emitting elements each having a first end and a second end in a longitudinal direction on the first insulating layer;
      forming a first layer including a p-type hydrogenated amorphous silicon (a-Si:H) semiconductor material on the light emitting elements;
      forming an interlayer insulating layer on the first layer;
      forming a second layer including a transparent oxide semiconductor material on the interlayer insulating layer; and
      forming a second insulating layer on the second layer.

23. The method according to claim 22, wherein
   the first layer contacts each of a first area of the first end and a second area of the second end of the light emitting elements,
   the second layer contacts each of a second area of the first end and a second area of the second end of the light emitting elements, and
   the interlayer insulating layer contacts and is disposed between the first area and the second area of each of the first end and the second end of the light emitting elements.

24. The method according to claim 23, wherein the forming of the display element part comprises:
   forming a first conductive line between the pixel circuit part and the first insulating layer;
   forming a second conductive line on the second insulating layer; and
   forming a cover layer on the second conductive line.

\* \* \* \* \*

UNITED STATES PATENT AND TRADEMARK OFFICE
CERTIFICATE OF CORRECTION

PATENT NO. : 12,356,782 B2  
APPLICATION NO. : 17/794723  
DATED : July 8, 2025  
INVENTOR(S) : Jae Min Shin et al.

Page 1 of 1

It is certified that error appears in the above-identified patent and that said Letters Patent is hereby corrected as shown below:

In the Claims

In Column 38, Line 63, in Claim 1, delete "are" and insert -- area, --.

In Column 38, Lines 64-65, in Claim 1, delete "area and;" and insert -- area; and --.

In Column 39, Line 7, in Claim 1, after "and" insert -- contacting --.

In Column 40, Line 2, in Claim 9, delete "the" and insert -- a --.

In Column 40, Line 49, in Claim 18, after "and" insert -- contacting --.

In Column 41, Line 9, in Claim 22, after "area of" insert -- the display --.

Signed and Sealed this  
Thirteenth Day of January, 2026

John A. Squires  
*Director of the United States Patent and Trademark Office*